United States Patent
Yamada et al.

(10) Patent No.: US 9,065,069 B2
(45) Date of Patent: Jun. 23, 2015

(54) METHOD FOR PRODUCING ORGANIC LIGHT-EMITTING ELEMENT

(75) Inventors: Ryuuta Yamada, Kyoto (JP); Satoru Ohuchi, Osaka (JP); Takahiro Komatsu, Osaka (JP); Shinya Fujimura, Osaka (JP); Hirofumi Fujita, Ehime (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/128,867

(22) PCT Filed: Jul. 15, 2011

(86) PCT No.: PCT/JP2011/004059
§ 371 (c)(1),
(2), (4) Date: Dec. 23, 2013

(87) PCT Pub. No.: WO2013/011539
PCT Pub. Date: Jan. 24, 2013

(65) Prior Publication Data
US 2014/0147952 A1   May 29, 2014

(51) Int. Cl.
*H01L 51/40* (2006.01)
*H01L 51/52* (2006.01)
(Continued)

(52) U.S. Cl.
CPC ........ *H01L 51/5234* (2013.01); *H01L 51/5088* (2013.01); *H05B 33/02* (2013.01);
(Continued)

(58) Field of Classification Search
CPC ............ H01L 51/5088; H01L 51/5012; H01L 27/3283; H01L 27/3244; H01L 51/0545; H01L 51/0036; H01L 51/0541; H01L 51/56; H05B 33/10; B82Y 10/00; B82Y 30/00

USPC ........................................................... 438/99
See application file for complete search history.

(56) References Cited

U.S. PATENT DOCUMENTS

| 5,294,869 A | 3/1994 | Tang et al. |
| 5,443,922 A | 8/1995 | Nishizaki et al. |

(Continued)

FOREIGN PATENT DOCUMENTS

| JP | 05-163488 | 6/1993 |
| JP | 3369615 | 10/1993 |

(Continued)

OTHER PUBLICATIONS

U.S. Appl. No. 14/128,727 to Ryuuta Yamada et al., filed Dec. 23, 2013.

(Continued)

*Primary Examiner* — Michelle Mandala
(74) *Attorney, Agent, or Firm* — Greenblum & Bernstein, P.L.C.

(57) ABSTRACT

Method for manufacturing organic EL element including anode, hole injection layer, buffer layer, light-emitting layer, and cathode, layered on substrate in the stated order, and banks defining a light-emission region, and having excellent light-emission characteristics, due to the hole injection layer having excellent hole injection efficiency, being a tungsten oxide layer including an oxygen vacancy structure, formed under predetermined conditions to have an occupied energy level within a binding energy range from 1.8 eV to 3.6 eV lower than a lowest binding energy of a valence band, and after formation, subjected to atmospheric firing at a temperature within 200° C.-230° C. inclusive for a processing time of 15-45 minutes inclusive to have increased film density and improved dissolution resistance against an etching solution, a cleaning liquid, etc., used in a bank forming process.

8 Claims, 44 Drawing Sheets

(51) Int. Cl.
- *H01L 51/50* (2006.01)
- *H05B 33/02* (2006.01)
- *H05B 33/10* (2006.01)
- *H01L 51/56* (2006.01)
- *H01L 27/32* (2006.01)

(52) U.S. Cl.
CPC ........... *H05B 33/10* (2013.01); *H01L 51/5012* (2013.01); *H01L 51/56* (2013.01); *H01L 27/3244* (2013.01); *H01L 27/3283* (2013.01)

(56) References Cited

U.S. PATENT DOCUMENTS

| | | | |
|---|---|---|---|
| 5,688,551 | A | 11/1997 | Littman et al. |
| 8,664,669 | B2 | 3/2014 | Ohuchi et al. |
| 2005/0170208 | A1 | 8/2005 | Yatsunami et al. |
| 2008/0119352 | A1* | 5/2008 | Kitaguchi ................... 502/74 |
| 2009/0160325 | A1 | 6/2009 | Yatsunami et al. |
| 2011/0156079 | A1 | 6/2011 | Nakatani et al. |
| 2012/0061656 | A1 | 3/2012 | Ohuchi et al. |
| 2013/0056719 | A1 | 3/2013 | Komatsu et al. |
| 2013/0119366 | A1 | 5/2013 | Nishiyama et al. |
| 2013/0126840 | A1 | 5/2013 | Fujimura et al. |
| 2013/0126841 | A1 | 5/2013 | Nishiyama et al. |
| 2013/0126843 | A1 | 5/2013 | Nishiyama et al. |
| 2013/0126846 | A1 | 5/2013 | Harada et al. |
| 2013/0126847 | A1 | 5/2013 | Harada et al. |
| 2013/0126848 | A1 | 5/2013 | Harada et al. |
| 2013/0134403 | A1 | 5/2013 | Harada et al. |
| 2013/0140542 | A1 | 6/2013 | Harada et al. |
| 2013/0140543 | A1 | 6/2013 | Harada et al. |
| 2013/0285042 | A1 | 10/2013 | Komatsu et al. |
| 2013/0313543 | A1 | 11/2013 | Ohuchi et al. |
| 2013/0328039 | A1 | 12/2013 | Ohuchi et al. |

FOREIGN PATENT DOCUMENTS

| | | |
|---|---|---|
| JP | 3789991 | 6/1997 |
| JP | 2000-223276 | 8/2000 |
| JP | 2005-203339 | 7/2005 |
| JP | 2006-114928 | 4/2006 |
| JP | 2006-347807 | 12/2006 |
| JP | 1734150 | 12/2006 |
| JP | 4647708 | 3/2011 |
| WO | 2011/021343 | 2/2011 |

OTHER PUBLICATIONS

U.S. Appl. No. 14/128,732 to Ryuuta Yamada et al., filed Dec. 23, 2013.

International Search Report (ISR) in International Patent Application No. PCT/JP2011/004059, dated Oct. 18, 2011.

Jingze Li et al., "Enhanced performance of organic light emitting device by insertion of conducting/insulating WO3 anodic buffer layer", Synthetic Metals 151, pp. 141-146 (2005).

Hiromi Watanabe et al., "Structure and Physical Property Evaluation of MoOX Thin-Film in Reactive Sputtering Method, and MoOX/α-NPD Boundary Analysis", (Nov. 20, 2008). Along with a partial English language translation.

Hyunbok Lee et al., "The origin of the hole injection improvements at indium tin oxide/molybdenum trioxide/N,N'-bis (1-naphthyl)-N,N'-diphenyl-1,1'-biphenyl-4,4'-diamine interface", Applied Physics Letters 93, 043308 (2008).

Yasuo Nakayama et al., "MoO3 on F8BT Boundary Electron Structure: Research through Photoemission Spectrography and Meta-Stable Excited Atom Spectrometry", (Nov. 20, 2008). Along with a partial English language translation.

Kaname Kanai et al., "Electronic structure of anode interface with molybdenum oxide buffer layer", Organic Electronics 11, pp. 188-194 (2010).

I. N. Yakovkin et al., "Driving force for the WO3(001) surface relaxation", Surface Science 601, pp. 1481-1488 (2007).

\* cited by examiner

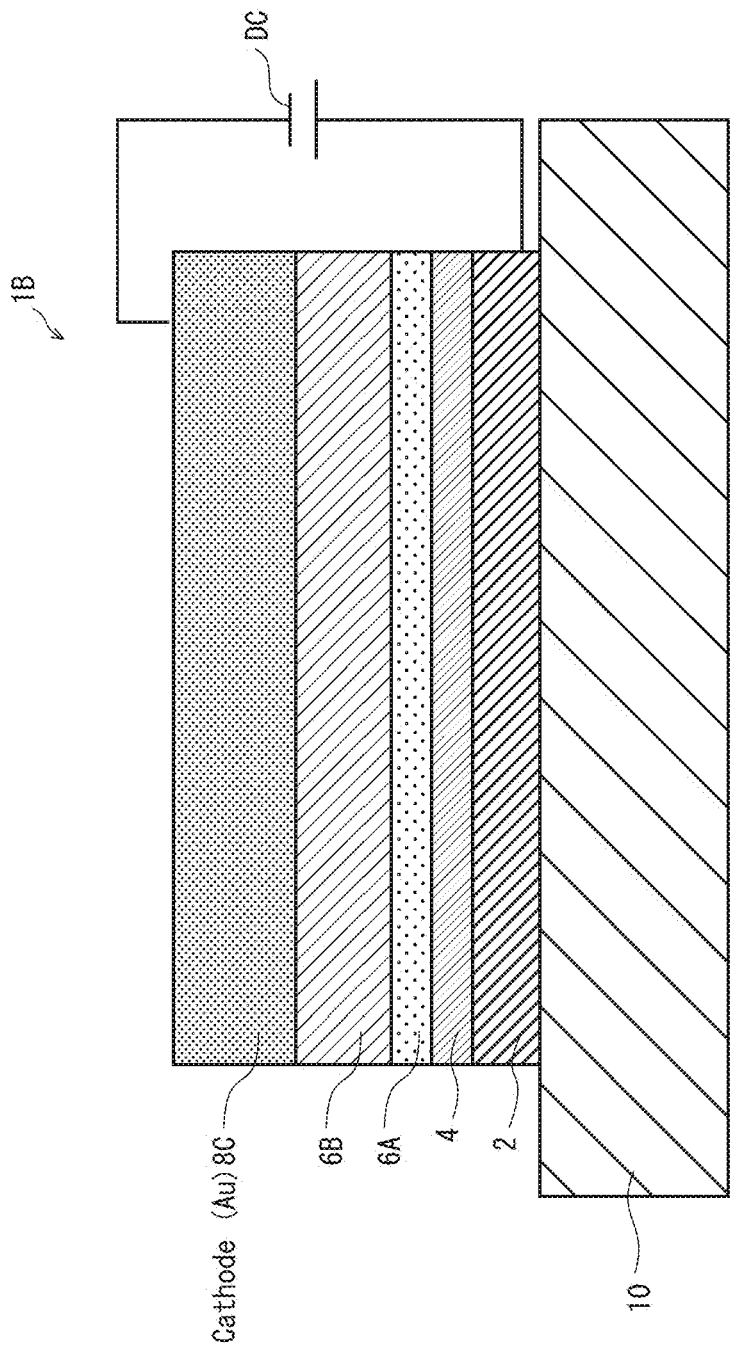

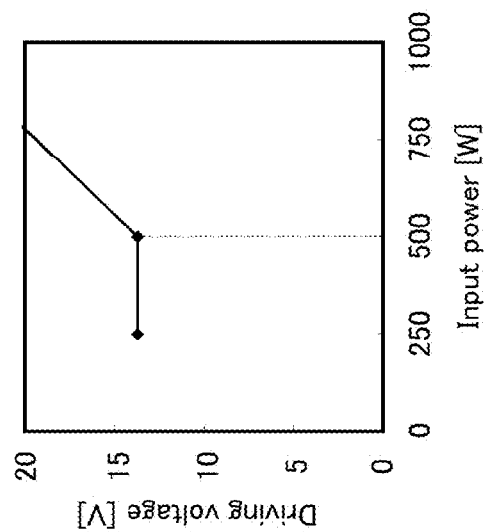
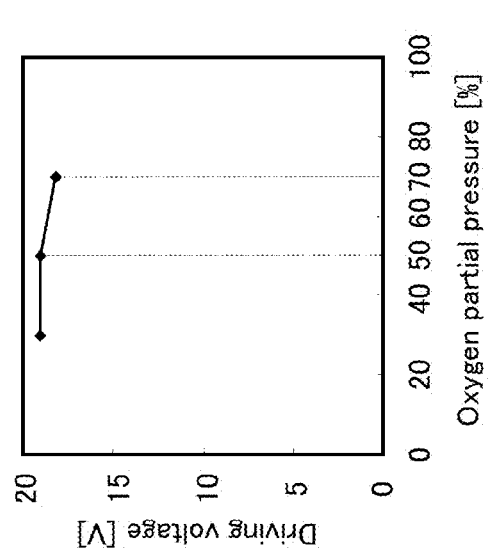
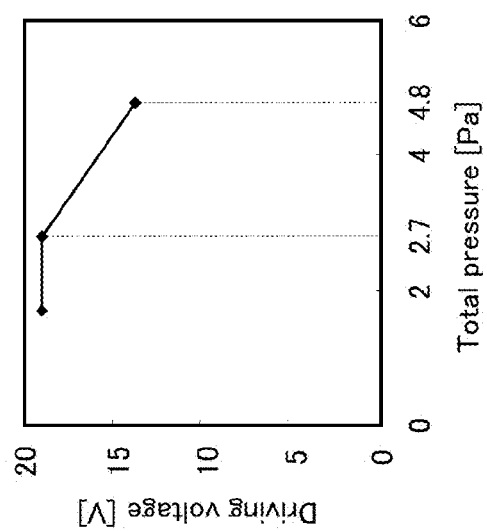

(A: a case where an appropriate number of injection sites exists in the tungsten oxide layer)

(B, C: a case where there are no injection sites in the tungsten oxide layer and a case where there is a shortage of injection sites in the tungsten oxide layer)

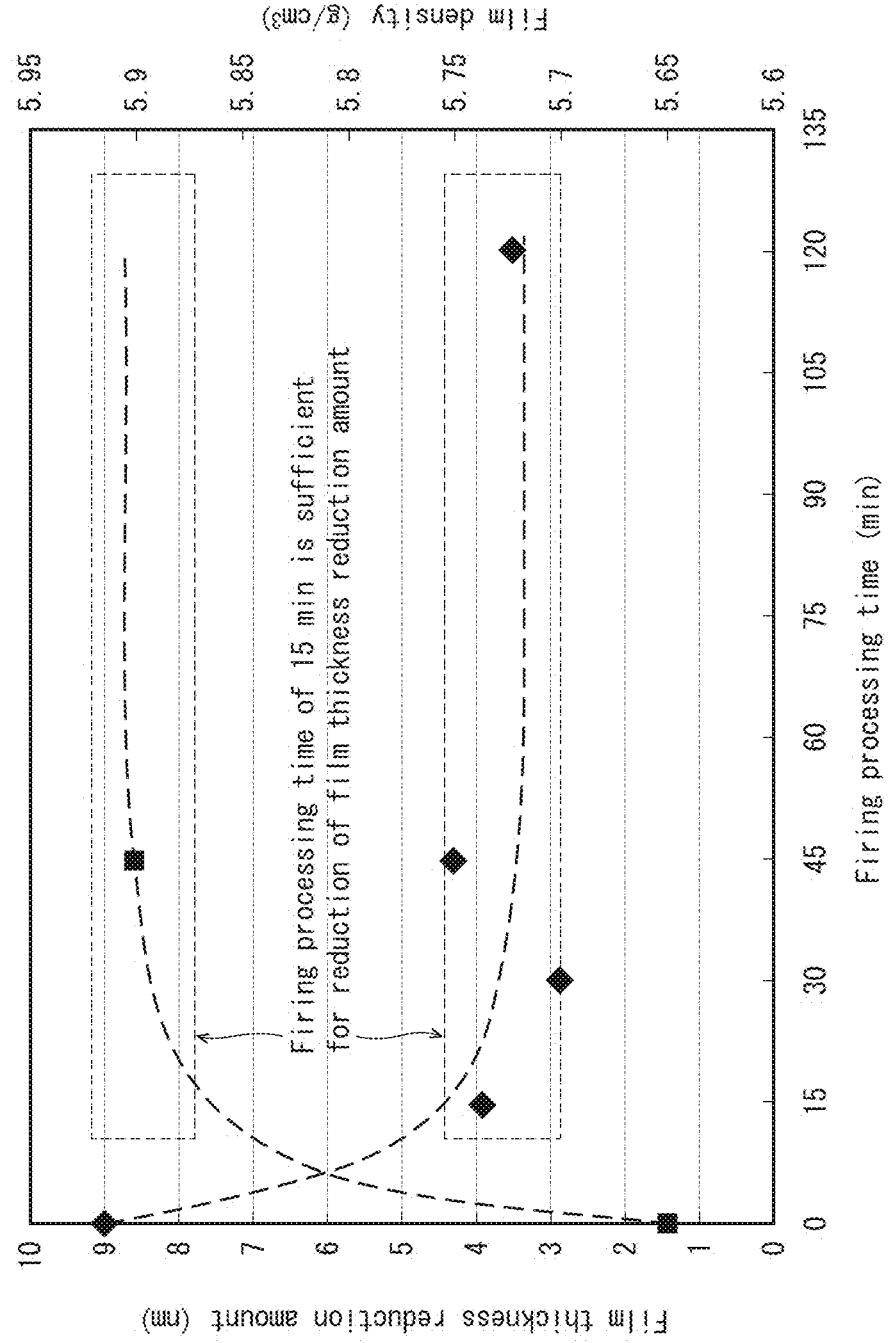
FIG. 23 Relation between film thickness reduction amount and film density for different firing processing times ○ : Tungsten
⦸ : Oxygen

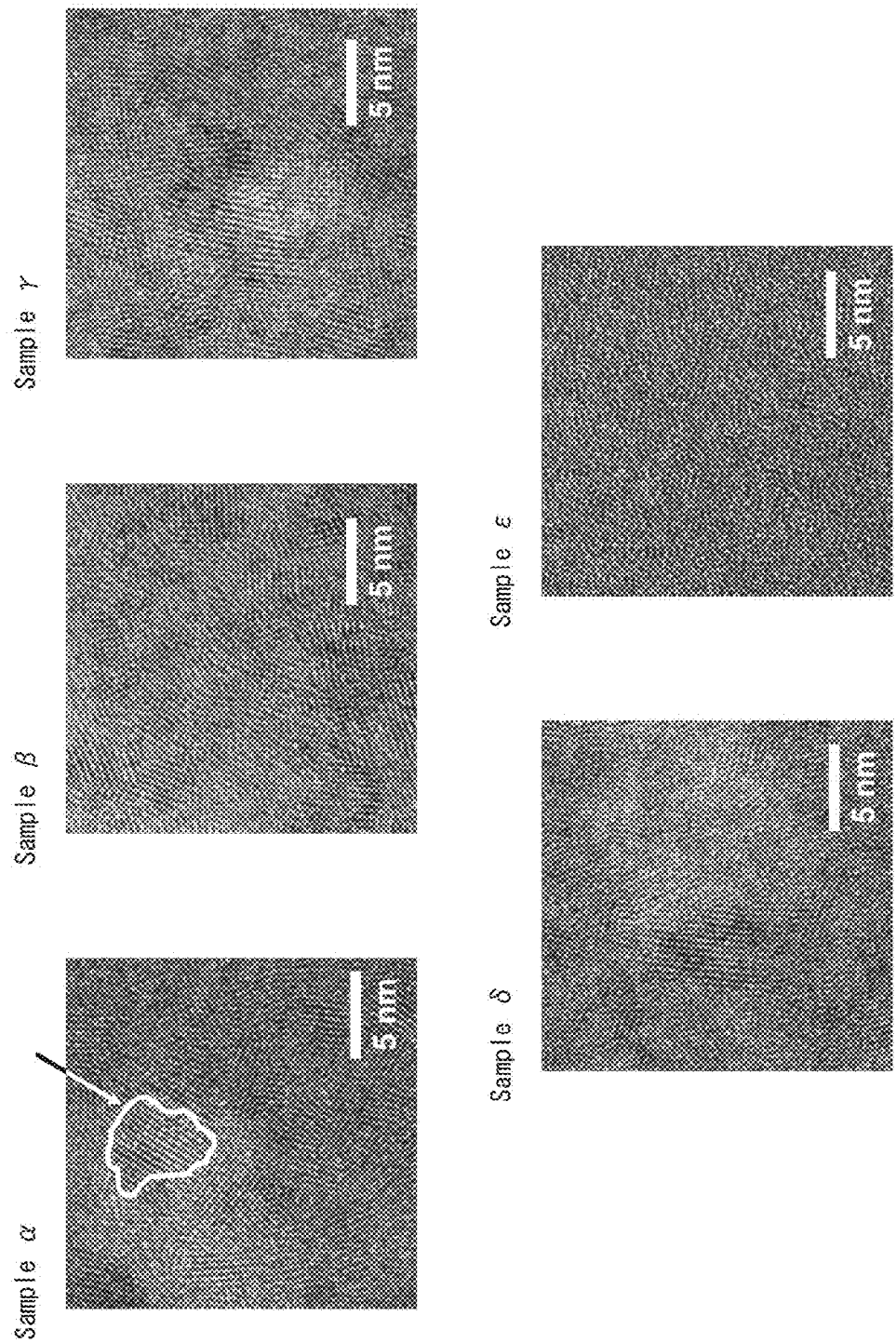

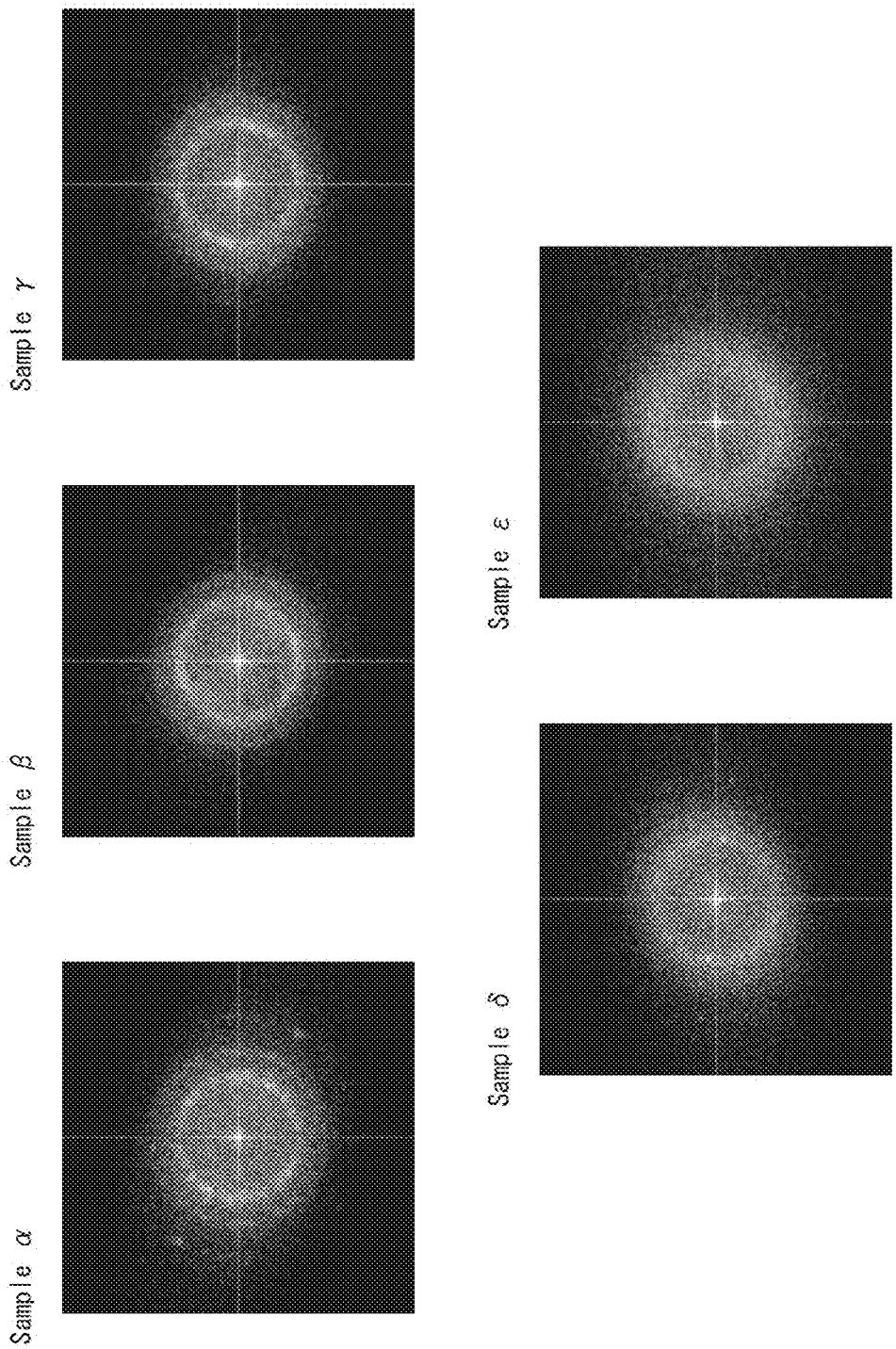

FIG. 40
Sample α
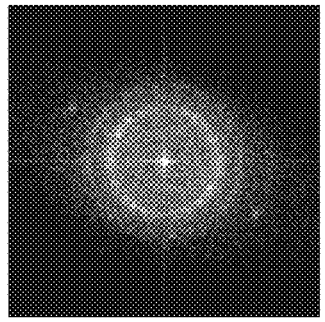 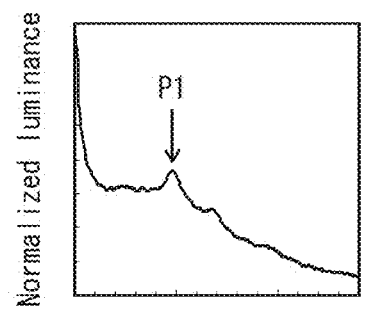
Sample β
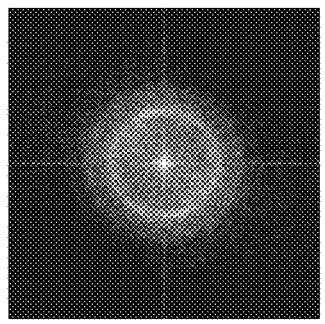 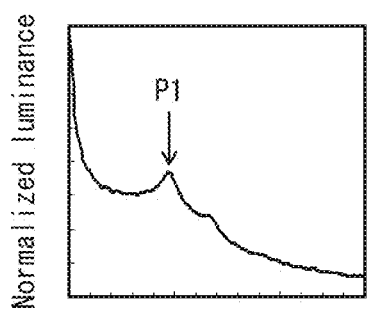
Sample γ
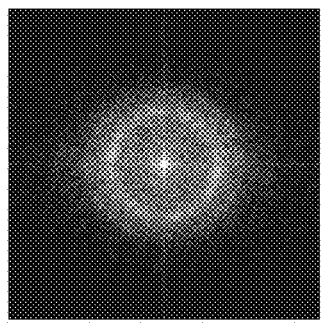 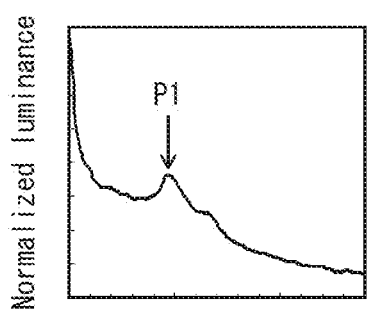

FIG. 41
Sample δ
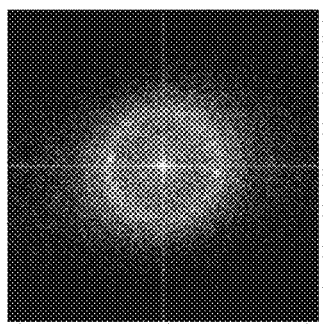
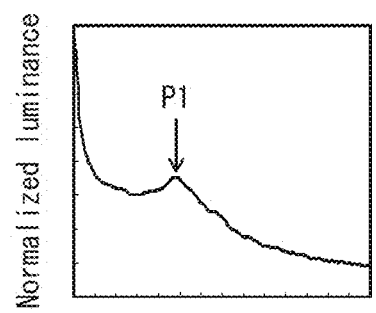
Sample ε
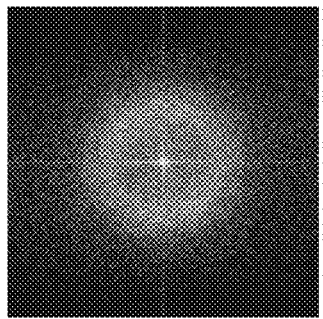
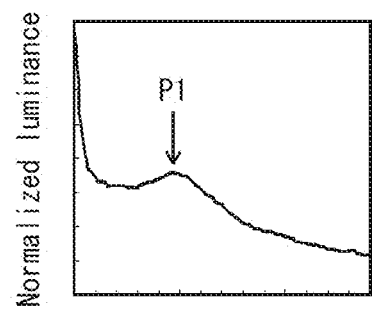

METHOD FOR PRODUCING ORGANIC LIGHT-EMITTING ELEMENT

TECHNICAL FIELD

The present invention relates to a method for manufacturing an organic light-emitting element (referred to hereinafter as an "organic EL element"), which is an electric light-emitting element. Particularly, the present invention relates to a technology for driving such an organic EL element at low electricity while ensuring a wide range of luminous intensity from low luminous intensity to high luminous intensity for the use as a light source or the like.

DESCRIPTION OF THE RELATED ART

In recent years, progress is being made in the research and development of various functional elements that utilize organic semiconductors.

An organic EL element is a typical example of such a functional element. An organic EL element is a current-driven light-emitting element, and typically includes a pair of electrodes, composed of an anode and a cathode, and one or more functional layers each containing organic material disposed between the pair of electrodes. In the present disclosure, the term one or more functional layers refers to layers such as a light-emitting layer and a buffer layer. In addition, a typical organic EL element may further include a hole injection layer disposed between the set of the one or more functional layer and the anode. The hole injection layer has the function of injecting holes. In order to drive the organic EL element, voltage is applied across the pair of electrodes. This leads to holes being injected from the anode to the one or more functional layers and electrons being injected from the cathode to the one or more functional layers. Accordingly, the organic EL element emits light by an electric-field light-emitting phenomenon taking place when the holes and the electrons recombine at the one or more functional layers. An organic EL element exhibits high visibility for being self-luminescent and has high shock resistance for having a fully solid-state structure. Due to such positive characteristics, organic EL elements are attracting much attention as light-emitting elements or as a light source in various display devices.

Organic EL elements can be largely divided into two types, depending upon the material used for forming one or more functional layers therein. The first type of organic EL elements is a vapor deposition type. In a vapor deposition type organic EL element, the one or more functional layers are mainly composed of organic low molecular material, and film forming of the one or more functional layers is performed by applying in-vacuum processing such as vapor deposition. The second type of organic EL elements is an application type. In an application type organic EL element, the one or more functional layers is mainly composed of either organic high molecular material, organic low molecular material having excellent thin-film forming property, etc., and film forming of the one or more functional layers is performed by applying wet processing such as the inkjet method and the gravure printing method.

When comparing the two types of organic EL elements, the development of vapor deposition type organic EL elements has progressed to a further extent compared to the development of application type organic EL elements. Reasons for this include the higher light-emission efficiency of the light-emission material included in vapor deposition type organic EL elements and the longer operating lifetime of vapor deposition type organic EL elements compared to application type organic EL elements (for example, refer to Patent Literatures 1 and 2). In fact, vapor deposition type organic EL elements have already been put into practical use in mobile phone displays and small-sized TVs, for example.

However, although vapor deposition type organic EL elements are desirable for use in small-sized organic EL panels, the application of vapor deposition type organic EL elements to, for example, full-color, large-sized organic EL panels having display sizes of around 100 inches is extremely difficult. This is due to the technology used in manufacturing vapor deposition type organic EL elements. When manufacturing an organic EL panel by using vapor deposition type organic EL elements, the mask vapor deposition method is typically used for separately forming light-emitting layers of different colors (here, the colors of the light-emitting layers are R, G, and B, for example). Here, when the organic EL panel to be manufactured becomes greater in area, it is difficult to precisely adjust the position of the mask used in the mask vapor deposition method due to reasons such as the difference in thermal expansion coefficients between the mask and a glass substrate. Hence, manufacturing of a display that operates properly is difficult. One possible countermeasure for overcoming such a problem is eliminating the necessity of separately forming, through application, the light-emitting layers of different colors as described above by using white-colored light-emitting layers over the entire surface of the panel and additionally providing color filters of the colors R, G, and B. However, when making such a configuration, the amount of light actually output from the panel is a mere third of the amount of light emitted by the light-emitting layers. Thus, in principle, an increased amount of power is consumed by the panel.

In view of such problems of vapor deposition type organic EL elements, attempts are being made to realize the application of application type organic EL elements in manufacturing organic EL panels having large sizes. As already described above, in an application type organic EL element, film forming of the one or more functional layers is performed by wet processing. The application of wet processing reduces the technical barrier in the manufacturing large-sized panels. This is since, when forming the one or more functional layers by performing wet processing, the precision when separately applying the one or more functional layers with respect to predetermined positions is basically not dependent upon substrate size.

In the meantime, much effort is also being made in the research and development of technology for enhancing light-emission efficiency of organic EL elements. In order to cause an organic EL element to emit light with high efficiently and high luminance but with low power consumption, it is important to increase the efficiency with which carriers (holes and electrons) are injected from the electrodes to the one or more functional layers. One typical yet effective measure for achieving the efficient injection of carriers to the one or more functional layers is to provide an injection layer between each of the electrodes and the set of the one or more functional layers. Such injection layers are provided for reducing the energy barrier (injection barrier) in the injection of carriers to the one or more functional layers. A hole injection layer, which is one type of such injection layers, is typically formed by using, for example, a film formed by vapor deposition of organic low molecular material such as copper phthalocyanine (CuPc), a film formed by application of a solution of organic high molecular material such as PEDOT:PSS, or a film formed by vapor deposition, sputtering, etc., of inorganic material such as molybdenum oxide. In particular, a report has been made that an organic EL element including a hole injection layer made of molybdenum oxide has improved hole injection efficiency to the one or more functional layers and has longevity (for example, refer to Patent Literature 3). Further, in a typical organic EL element, the hole injection layer is formed on a surface of an anode. The anode is typically made of a transparent conduction film of ITO, IZO, etc., a metal film of aluminum, etc., or of a combination of such a transparent conduction film and such a metal film layered one on top of the other.

CITATION LIST

Patent Literature

[Patent Literature 1]
Japanese Patent Publication No. 3369615
[Patent Literature 2]
Japanese Patent Publication No. 3789991
[Patent Literature 3]
Japanese Patent Application Publication No. 2005-203339

Non-Patent Literature

[Non-Patent Literature 1]
Jingze Li et al., Synthetic Metals 151, 141 (2005)
[Non-Patent Literature 2]
Hiromi Watanabe et al., Yuki EL Tohronkai Dai 7 Kai Reikai Yokoushuu, 17 (2008)
[Non-Patent Literature 3]
Hyunbok Lee et al., Applied Physics Letters 93, 043308 (2008)
[Non-Patent Literature 4]
Yasuo Nakayama et al., Yuki EL Tohronkai Dai 7 Kai Reikai Yokoushuu, 5 (2008)
[Non-Patent Literature 5]
Kaname Kanai et al., Organic Electronics 11, 188 (2010)
[Non-Patent Literature 6]
I. N. Yakovkin et al., Surface Science 601, 1481 (2007)

SUMMARY

Technical Problem

However, there is a problem to be overcome in the manufacturing of the above-described organic EL elements having the above-described advantages.

Specifically, when using tungsten oxide, which is material having excellent hole injection characteristics, as the material for the hole injection layer in an organic EL element, after a film of tungsten oxide is formed on the substrate in the manufacturing of the organic EL element, the film so formed is exposed to an etching solution, a cleaning liquid, etc., during a bank forming process. When the tungsten oxide film, which is to become the hole injection layer, is exposed to the etching solution, the cleaning liquid, etc., a problematic situation may occur where portions of the tungsten oxide film dissolve to the etching solution, the cleaning liquid, etc., and thus the thickness of the tungsten oxide film is reduced at such portions (hereinafter referred to as "film thickness reduction").

When excessive film thickness reduction occurs, it becomes difficult to provide the hole injection layer with necessary film thickness. Further, the roughness of the film surface of the hole injection layer increases, and the uniformity in film surface state over the entire hole injection layer also decreases. Accordingly, the occurrence of excessive film thickness reduction may affect the hole injection characteristics of the hole injection layer.

In view of such problems, the present invention incorporates, in an organic light-emitting element, a hole injection layer achieving both excellent hole injection characteristics and stability in a process performed during mass production of organic EL panels.

Specifically, the present invention provides an organic light-emitting element having a hole injection layer that has improved resistance against the etching solution, the cleaning liquid, etc., used in the bank forming process (hereinafter referred to as "dissolution resistance") and excellent hole injection efficiency, and thus having excellent light-emission characteristics, and a manufacturing method for such an organic light-emitting element.

Solution to Problem

In view of the above, one aspect of the present invention is a method for manufacturing an organic light-emitting element, the method comprising: forming a tungsten oxide layer containing tungsten oxide on a base layer including an anode, the tungsten oxide layer formed to have an oxygen vacancy structure therein; firing the tungsten oxide layer; forming a film of barrier wall material on the fired tungsten oxide layer; forming barrier walls by patterning the film of barrier wall material in a predetermined pattern by using an etching solution, the barrier walls defining an aperture; forming an organic layer within the aperture, the organic layer containing organic material; and forming a cathode above the organic layer. In the method pertaining to one aspect of the present invention, in the firing of the tungsten oxide layer, the firing is performed to provide the fired tungsten oxide layer with higher dissolution resistance to the etching solution compared to the tungsten oxide layer, while ensuring that the fired tungsten oxide layer has an oxygen vacancy structure therein.

Advantageous Effects of Invention

Through much devotion and consideration, the inventors of the present invention (hereinafter referred to as "present inventors") have found that when formed under predetermined film forming conditions, an oxygen vacancy structure is formed in the tungsten oxide layer, which provides the tungsten oxide layer with an occupied energy level bringing about an improvement in hole injection characteristics. In addition, the present inventors have also found that, by firing the tungsten oxide layer so formed under predetermined, strictly-defined conditions, the dissolution resistance of the tungsten oxide layer with respect to the etching solution, the cleaning liquid, etc., that are used during the bank forming process is improved, while ensuring that the tungsten oxide layer retains the oxygen vacancy structure even after having undergone the firing. Based on such findings, the present inventors have arrived at one aspect of the present invention, which reduces an amount of the film thickness reduction and provides, as the hole injection layer, a tungsten oxide layer having excellent hole injection characteristics. Thus, an organic light-emitting element manufactured according to the method pertaining to one aspect of the present invention drives at low voltage and has excellent light-emission efficiency.

As already described above, the method pertaining to one aspect of the present invention reduces the film thickness reduction amount of the hole injection layer. Accordingly, when manufacturing an organic EL panel in which a plurality of the organic light-emitting elements pertaining to one aspect of the present invention are disposed, the absolute level of unevenness in terms of film thickness between the hole injection layers included in the manufactured organic EL panel is reduced over the entire panel, and thus the ununiformity of light-emission efficiency between the organic light-emitting elements included in the manufactured organic EL panel is reduced.

BRIEF DESCRIPTION OF DRAWINGS

FIG. 2 is a schematic cross-sectional view illustrating the structure of hole-only devices.

FIGS. 3A through 3C are graphs illustrating a dependence of driving voltages of hole-only devices on film forming conditions of a hole injection layer.

FIG. 23 is a graph illustrating the relation between film thickness reduction amounts and film densities, for different processing times of the firing process.

FIG. 37 illustrates cross-sectional TEM photographs of tungsten oxide layers.

FIG. 38 illustrates 2D Fourier transform images for the TEM photographs shown in FIG. 37.

FIG. 40 shows 2D Fourier transform images and luminance variance plots for samples α, β, and γ.

FIG. 41 shows 2D Fourier transform images and luminance variance plots for samples δ and ε.

DETAILED DESCRIPTION

<Aspects of the Invention>

Figure 1:
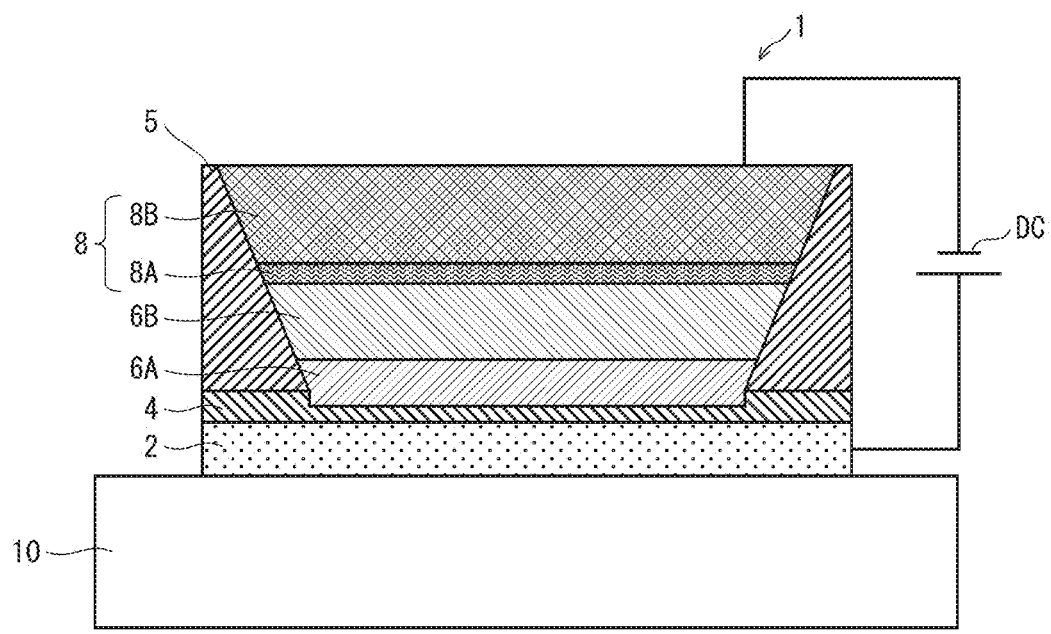
FIG. 1 is a schematic cross-sectional view illustrating the structure of an organic EL element pertaining to embodiment 1.

One aspect of the present invention is a method for manufacturing an organic light-emitting element, the method comprising: forming a tungsten oxide layer containing tungsten oxide on a base layer including an anode, the tungsten oxide layer formed to have an oxygen vacancy structure therein; firing the tungsten oxide layer; forming a film of barrier wall material on the fired tungsten oxide layer; forming barrier walls by patterning the film of barrier wall material in a predetermined pattern by using an etching solution, the barrier walls defining an aperture; forming an organic layer within the aperture, the organic layer containing organic material; and forming a cathode above the organic layer. In the method pertaining to one aspect of the present invention, in the firing of the tungsten oxide layer, the firing is performed to provide the fired tungsten oxide layer with higher dissolution resistance to the etching solution compared to the tungsten oxide layer, while ensuring that the fired tungsten oxide layer has an oxygen vacancy structure therein.

By forming a tungsten oxide layer under predetermined film forming conditions, an oxygen vacancy structure is formed in the tungsten oxide layer, which provides the tungsten oxide layer with an occupied energy level bringing about an improvement in the hole injection characteristics. In addition, by firing the tungsten oxide layer so formed under predetermined, strictly-defined conditions, the dissolution resistance of the tungsten oxide layer with respect to the etching solution, the cleaning liquid, etc., used during the bank forming process is improved, while ensuring that the tungsten oxide layer retains the oxygen vacancy structure even after having undergone the firing. Accordingly, the film thickness reduction amount is reduced, and a tungsten oxide layer having excellent hole injection characteristics is formed as a hole injection layer. As such, an organic light-emitting element manufactured according to the method pertaining to one aspect of the present invention drives at low voltage and has excellent light-emission efficiency.

In addition, the method pertaining to one aspect of the present invention reduces the film thickness reduction amount of the hole injection layer. Accordingly, when manufacturing each of a plurality of organic light-emitting elements included in an organic EL panel according to the method pertaining to one aspect of the present invention, the unevenness in film thickness between the hole injection layers included in the manufactured organic EL panel is reduced over the entire panel, and thus the ununiformity of light-emission efficiency between the organic light-emitting elements included in the manufactured organic EL panel is reduced.

In the method pertaining to one aspect of the present invention, in the firing of the tungsten oxide layer, the firing may be performed to provide the fired tungsten oxide layer with a film density of at least 5.8 g/cm$^3$ and at most 6.0 g/cm$^3$.

In the method pertaining to one aspect of the present invention, in the forming of the tungsten oxide layer, the tungsten oxide layer may be formed to have an occupied energy level within a binding energy range from approximately 1.8 electron volts to approximately 3.6 electron volts lower than a lowest binding energy of a valence band, and in the firing of the tungsten oxide layer, the firing may be performed while ensuring that the fired tungsten oxide layer has an occupied energy level within the binding energy range.

In the method pertaining to one aspect of the present invention, in the forming of the tungsten oxide layer, the tungsten oxide layer may be formed such that at least one of an ultraviolet photoelectron spectroscopy spectrum and an X-ray photoelectron spectroscopy spectrum of the tungsten oxide layer exhibits an upward protrusion within a binding energy range from approximately 1.8 electron volts to approximately 3.6 electron volts lower than a lowest binding energy of a valence band, and in the firing of the tungsten oxide layer, the firing may be performed while ensuring that at least one of an ultraviolet photoelectron spectroscopy spectrum and an X-ray photoelectron spectroscopy spectrum of the fired tungsten oxide layer exhibits an upward protrusion within the binding energy range.

In the method pertaining to one aspect of the present invention, in the forming of the tungsten oxide layer, the tungsten oxide layer may be formed such that a differential spectrum obtained by differentiating an ultraviolet photoelectron spectroscopy spectrum of the tungsten oxide layer has a shape that is expressed by a non-exponential function throughout a binding energy range from approximately 1.8 electron volts to approximately 3.6 electron volts lower than a lowest binding energy of a valence band, and in the firing of the tungsten oxide layer, the firing may be performed while ensuring that a differential spectrum obtained by differentiating an ultraviolet photoelectron spectroscopy spectrum of the fired tungsten oxide layer has a shape that is expressed by a non-exponential function throughout the binding energy range.

In the method pertaining to one aspect of the present invention, in the forming of the tungsten oxide layer, the tungsten oxide layer may be formed to include tungsten atoms with a valence of six and tungsten atoms with a valence of five and thus have an oxygen vacancy structure therein, a ratio $W^{5+}/W^{6+}$ of the number of the tungsten atoms with a valence of five to the number of the tungsten atoms with a valence of six being at least 3.2% and at most 7.4%, and in the firing of the tungsten oxide layer, the firing is performed while ensuring that the ratio $W^{5+}/W^{6+}$ in the fired tungsten oxide layer is at least 3.2% and at most 7.4%.

Another aspect of the present invention is a method for manufacturing an organic light-emitting element, the method comprising: forming a tungsten oxide layer on a base layer including an anode, the tungsten oxide layer containing tungsten oxide; firing the tungsten oxide layer to obtain a fired tungsten oxide layer; forming a film of barrier wall material on the fired tungsten oxide layer; forming barrier walls by patterning the film of barrier wall material in a predetermined pattern by using an etching solution, the barrier walls defining an aperture; forming an organic layer within the aperture, the organic layer containing organic material; and forming a cathode above the organic layer. In the method pertaining to another aspect of the present invention, in the forming of the tungsten oxide layer, the tungsten oxide layer is formed such that at least one of an ultraviolet photoelectron spectroscopy spectrum and an X-ray photoelectron spectroscopy spectrum of the tungsten oxide layer exhibits an upward protrusion within a binding energy range from approximately 1.8 electron volts to approximately 3.6 electron volts lower than a lowest binding energy of a valence band, and in the firing of the tungsten oxide layer, the firing is performed to provide the fired tungsten oxide layer with higher dissolution resistance to the etching solution compared to the tungsten oxide layer, while ensuring that at least one of an ultraviolet photoelectron spectroscopy spectrum and an X-ray photoelectron spectroscopy spectrum of the fired tungsten oxide layer exhibits an upward protrusion within the binding energy range.

A yet another aspect of the present invention is a method for manufacturing an organic light-emitting element, the method comprising: forming a tungsten oxide layer on a base layer including an anode, the tungsten oxide layer containing tungsten oxide; firing the tungsten oxide layer to obtain a fired tungsten oxide layer; forming a film of barrier wall material on the fired tungsten oxide layer; forming barrier walls by patterning the film of barrier wall material in a predetermined pattern by using an etching solution, the barrier walls defining an aperture; forming an organic layer within the aperture, the organic layer containing organic material; and forming a cathode above the organic layer. In the method pertaining to yet another aspect of the present invention, in the forming of the tungsten oxide layer, the tungsten oxide layer is formed to include tungsten atoms with a valence of six and tungsten atoms with a valence of five and thus have an oxygen vacancy structure therein, a ratio $W^{5+}/W^{6+}$ of the number of the tungsten atoms with a valence of five to the number of the tungsten atoms with a valence of six being at least 3.2% and at most 7.4%, and in the firing of the tungsten oxide layer, the firing is performed to provide the fired tungsten oxide layer with higher dissolution resistance to the etching solution compared to the tungsten oxide layer, while ensuring that the ratio $W^{5+}/W^{6+}$ in the fired tungsten oxide layer is at least 3.2% and at most 7.4%.

Each of the following embodiments includes description on an organic EL element and a manufacturing method for an organic EL element, description on performance assessment experiments and observations.

Note that the drawings provide schematic illustration of components for the sake of explanation, and thus, the illustration of the components in the drawings may not be in accordance with their actual scale.

Embodiment 1

(Structure of Organic EL Element)

FIG. 1 is a schematic cross-sectional view illustrating the structure of an organic EL element 1 pertaining to embodiment 1.

The organic EL element 1 is an application type organic EL element. As such, the organic EL element 1 includes one or more functional layers having been formed by applying functional layer material by wet processing. The organic EL element 1 includes: a hole injection layer 4; one or more functional layers each containing organic material and having a predetermined function; and a pair of electrodes, composed of an anode 2 and a cathode 8. The hole injection layer 4 and the set of one or more functional layers, a buffer layer 6A and a light-emitting layer 6B in this example, are disposed one on top of the other, and are disposed between the pair of electrodes.

In specific, the organic EL element 1 includes, as illustrated in FIG. 1, a substrate 10, and the anode 2, the hole injection layer 4, the buffer layer 6A, the light-emitting layer 6B, and the cathode 8 (a combination of a barium layer 8A and an aluminum layer 8B) disposed in the stated order on one main surface of the substrate 10. The anode 2 and the cathode 8 are connected to a power supply indicated by DC in FIG. 1. Thus, power is supplied to the organic EL element 1 from the outside.

(Substrate)

The substrate 10 is the base of the organic EL element 1. For example, the substrate 10 is made of insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

While not illustrated in FIG. 1, at least one thin film transistor (TFT) for driving the organic EL element 1 is formed on the surface of the substrate 10.

(Anode)

The anode 2 is made of a 50 nm-thick transparent conductive film of ITO. However, the anode 2 is not limited to having such a structure. For example, the anode 2 may be made of: a transparent conductive film of IZO or the like; a film of a metal such as aluminum; a film of an alloy such as APC (an alloy of silver, palladium, and copper), ARA (an alloy of silver, rubidium, and gold), MoCr (an alloy of molybdenum and chromium) and NiCr (an alloy of nickel and chromium); or a combination of a plurality of such films.

(Hole Injection Layer)

The hole injection layer 4 is a layer of tungsten oxide having a film thickness of at least 2 nm (10 nm in this example). Further, in the composition formula (WOx) denoting the composition of tungsten oxide contained in the hole injection layer 4, x is a real number existing within a range of approximately $2<x<3$. The film thickness of the hole injection layer 4 is set to at least 2 nm since the forming of a hole injection layer with uniformity is difficult when the film thickness is set to less than 2 nm and also since it becomes difficult to form a Schottky ohmic contact between the hole injection layer 4 and the anode 2 when the film thickness is set to less than 2 nm. Note that further description on the Schottky ohmic contact is provided later in the present disclosure. The Schottky ohmic contact is stably formed when the tungsten film is formed to have a film thickness of at least 2 nm. Therefore, by forming the hole injection layer 4 to have a film thickness of at least 2 nm, the injection of holes from the anode 2 to the hole injection layer 4 is performed stably via the Schottky ohmic contact, and thus, the hole injection layer 4 is provided with excellent hole injection efficiency. Meanwhile, the hole injection layer 4 has a film density within a range of at least 5.8 $g/cm^3$ to at most 6.0 $g/cm^3$. The hole injection layer 4 is provided with such a film density by a firing process being performed to densify the tungsten oxide contained in the hole injection layer 4. More specifically, after a tungsten oxide film is formed, the firing process is performed to fire and thus densify the tungsten oxide film so formed. In the firing process, atmospheric firing of the tungsten oxide film is performed under predetermined conditions (at a firing temperature of at least 200° C. and at most 230° C., and for a processing time of at least 15 minutes to at most 45 minutes). By performing the firing process, the film density of the tungsten oxide film, which is approximately within a range of at least 5.4 $g/cm^3$ to at most 5.7 $g/cm^3$ immediately following the forming thereof, is increased to be within the above-described range of at least 5.8 $g/cm^3$ to at most 6.0 $g/cm^3$. Increasing the film density of the tungsten oxide film in such a manner provides the tungsten oxide film with improved dissolution resistance to the etching solution, the cleaning liquid, etc., used in the bank forming process during the manufacturing of the organic EL element 1, and thus the film-thickness reduction amount of the tungsten oxide film is suppressed to as small an amount as possible.

Note that as illustrated in FIG. 1, the hole injection layer 4 has a depression (hereinafter referred to as "concave portion") that is concave in the direction of the anode 2, at one surface thereof on the side of the light-emitting layer 6B. The concave portion is formed due to a part of the surface on the side of the light-emitting layer 6B being removed by being exposed to the etching solution, the cleaning liquid, etc., used in the bank forming process for forming banks 5. Here, it should be noted that the depth of the concave portion is smaller than the depth of the hole injection layer 4 at the bottom of the concave portion. As such, by the firing process being introduced in the manufacturing of the organic EL element 1, the film thickness reduction amount is suppressed by a considerable level compared to when an organic EL element is manufactured according to conventional technology. More specifically, the hole injection layer 4 has a film thickness of at least 7 nm, which means that the hole injection layer 4, even when the film thickness reduction occurs, maintains a film-thickness of at least 50% the film thickness (14 nm) of the tungsten oxide film immediately following the forming thereof.

Here, while it is desirable for the hole injection layer 4 to be made of only tungsten oxide, the inclusion of a trace level of impurities is acceptable, provided that the amount does not exceed the amount of impurities that might normally be incorporated.

The hole injection layer 4 is formed under specific film forming conditions. By forming the hole injection layer 4 under such specific film forming conditions, the hole injection layer 4 is provided with an oxygen vacancy structure. In the present disclosure, an oxygen vacancy structure refers to a structure where a tungsten atom is not bound to the number of oxygen atoms regularly bound to the tungsten atom in tungsten oxide. Further, due to having the oxygen vacancy structure, the hole injection layer 4 is provided, in an electronic state thereof, with an occupied energy level within the binding energy range from 1.8 electron bolts (eV) to 3.6 eV lower than the lowest binding energy of the valence band. This occupied energy level corresponds to the highest occupied energy level of the hole injection layer 4. Further, the occupied energy level is closest to the Fermi level (Fermi surface) of the hole injection layer 4 in terms of binding energy. As such, this occupied energy level of the hole injection layer 4 is hereinafter referred to as "occupied energy level near the Fermi surface".

Note that the expression "occupied energy level" in the context of the present disclosure includes an energy level of a so-called semi-occupied orbital, which is an electron orbital occupied by one electron.

Due to the existence of the occupied energy level near the Fermi surface in the hole injection layer 4, a so-called interface energy level alignment is formed at the layer interface between the hole injection layer 4 and the functional layer (the buffer layer 6A in this example). As such, the binding energy of the highest occupied molecular orbital (HOMO) of the buffer layer 6A and the binding energy of the occupied energy level near the Fermi surface of the hole injection layer 4 become approximately equal.

Note that the expressions "approximately equal" and "interface energy level alignment" as referred to herein indicate a state where the difference between the lowest binding energy of the occupied energy level near the Fermi surface of the hole injection layer 4 and the lowest binding energy of the HOMO of the functional layer, at an interface between the hole injection layer 4 and the functional layer, is within a range of ±0.3 eV inclusive.

Furthermore, the expression "interface" in this case refers to an area that includes a surface of the hole injection layer 4 and a portion of the buffer layer 6A within a distance of 0.3 nm from the surface of the hole injection layer 4.

In addition, while it is desirable that the occupied energy level near the Fermi surface exist throughout the hole injection layer 4, it suffices for the occupied energy level near the Fermi surface to exist at least at the interface with the buffer layer 6A. Further, it should be noted that not all tungsten oxide has the occupied energy level near the Fermi surface; rather, the occupied energy level near the Fermi surface is a unique energy level that is formed within the hole injection layer 4 and at the interface with the buffer layer 6A only when forming the hole injection layer 4 under the predetermined film forming conditions described below.

Additionally, the hole injection layer 4 is characterized for forming the so-called Schottky ohmic contact at the interface with the anode 2.

The expression "Schottky ohmic contact" as referred to herein denotes that the difference between the Fermi level of the anode 2 and the above-described lowest binding energy of the occupied energy level near the Fermi surface of the hole injection layer 4 is relatively small, namely within a range of ±0.3 eV inclusive, at a position that is 2 nm away from the surface of the anode 2 towards the hole injection layer 4. Furthermore, the expression "interface" in this case refers to a region that includes a surface of the anode 2 and the Schottky barrier formed away from the surface towards the hole injection layer 4.

Meanwhile, through much consideration, the present inventors have found that the dissolution resistance of a tungsten oxide film against the etching solution, the cleaning liquid, etc., used in the bank forming process increases proportionally as the film density of the tungsten oxide film increases. In addition, the present inventors also have found that the hole injection characteristics of a tungsten oxide film decrease inverse-proportionally as the film density of the tungsten oxide film increases. That is, the present inventors have found that there is a trade-off relation between the hole injection characteristics and the dissolution resistance of the tungsten oxide film. In view of this, the hole injection layer 4 pertaining to embodiment 1 realizes both excellent hole injection characteristics and high dissolution resistance at the same time and at a high level. This is realized by (i) providing the hole injection layer 4 with the occupied energy level near the Fermi surface by forming the tungsten oxide film according to the predetermined film forming conditions and (ii) providing the hole injection layer 4 with increased dissolution resistance by increasing the film density of the tungsten oxide film by performing a firing process according to predetermined, strictly-defined conditions after forming the tungsten oxide film.

In addition, the present invention reduces the film thickness reduction amount of the hole injection layer 4 as described above. Due to this, when forming an organic EL panel by disposing a plurality of the organic EL elements 1, the unevenness in film thickness between the hole injection layers 4 in the organic EL panel manufactured is suppressed over the entire panel. Thus, the ununiformity of light-emission efficiency between the plurality of organic EL elements 1 is reduced.

(Banks)

On the surface of the hole injection layer 4, banks (barrier walls) 5 are formed. The banks 5 define the area of the light-emitting layer 6B. The banks 5 are made of organic material having insulating property (for example, acrylic resin, polyimide resin, or novolac type phenolic resin). The banks 5 are formed so as to have uniform trapezoidal cross-sections, and so as to form either a line bank structure or a pixel bank structure.

Here, it should be noted that the banks 5 are not indispensable in the present invention, and need not be formed when the organic EL element 1 is to be used by itself.

(Functional Layer)

On a portion of the surface of the hole injection layer 4 defined by the banks 5, the one or more functional layers, composed of the buffer layer 6A and the light-emitting layer 6B in this example, are formed. Here, the light-emitting layer 6B corresponds to one of the colors R, G, and B. Each of the one or more functional layers is an organic layer containing organic material. Further, when forming an organic EL panel by using a plurality of the organic EL elements 1, a plurality of pixel units each composed of three, sequentially arranged organic EL elements 1 for the colors R, G, and B are arranged in an array on the substrate 10.

(Buffer Layer)

The buffer layer 6A is a layer that efficiently transports holes from the hole injection layer 4 to the light-emitting layer 6B. The buffer layer 6A is a 20 nm-thick layer made of TFB (poly(9,9-di-n-octylfluorene-alt-(1,4-phenylene-((4-sec-butylphenyl)imino)-1,4-phenylene)), which is an amine-containing organic high molecular material.

(Light-Emitting Layer)

The light-emitting layer 6B is a 70 nm-thick layer made of F8BT (poly(9,9-di-n-octylfluorene-alt-benzothiadiazole)), which is an organic high molecular material. However, the light-emitting layer 6B is not limited to being made of such material, and the light-emitting layer 6B may include a commonly-known organic material. Examples of such a commonly-known organic material that may be included in the light-emitting layer 6B include fluorescent material, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc., as disclosed in Japanese Patent Application Publication No. H5-163488.

Note that in the present disclosure, the one or more functional layers may refer to either one of, a combination of more than two of, or a combination of all of layers such as a hole transfer layer, a light-emitting layer, and a buffer layer. A hole transfer layer transfers holes, a light-emitting layer emits light as a result of recombination of holes and electrons which are injected thereto, and a buffer layer is used for adjusting optical characteristics and/or for blocking electrons. Further, a typical organic EL element may include, in addition to a hole injection layer, a layer performing the respective functions of the above-described hole transfer layer, light-emitting layer, and the like. As such, the term one or more functional layers in the present disclosure refers to one or more layers, excluding the hole injection layer, that need to be included in the organic EL element 1 and that are disposed between the anode 2 and the light-emitting layer 6B.

(Cathode)

The cathode 8 is formed by layering a 5 nm-thick barium layer 8A and a 100 nm-thick aluminum layer 8B one on top of the other.

Note that an electron transport layer may be disposed between the light-emitting layer 6B and the cathode 8. Further, the barium layer 8A may be considered as being an electron transport layer (or an electron injection layer).

(Effects of Organic EL Element)

In the organic EL element 1 having the structure described above, the hole injection layer 4 is provided with the oxygen vacancy structure, and thus the hole injection layer 4 has the occupied energy level near the Fermi surface. Further, a so-called interface energy level alignment is formed between the occupied energy level near the Fermi surface and the HOMO of the buffer layer 6A, thereby reducing the hole injection barrier between the hole injection layer 4A and the buffer layer 6A to an extremely low level.

In addition to the above, in the organic EL element 1, excellent Schottky ohmic contact is formed between the anode 2 and the hole injection layer 4, thereby suppressing the hole injection barrier between the anode 2 and the hole injection layer 4 to a low level.

Hence, when voltage is applied for driving the organic El element 1, holes are smoothly injected, even at low voltage, from the Fermi surface of the anode 2 to the occupied energy level near the Fermi surface of the hole injection layer 4, and from the occupied energy level near the Fermi surface of the hole injection layer 4 to the HOMO of the buffer layer 6A. As such, the organic EL element 1 has excellent hole injection efficiency. Due to this, when the holes so injected arrive at the light-emitting layer 6B and recombine with electrons at the light-emitting layer 6B, the organic EL element 1 exhibits excellent light-emission characteristics. More specifically, the difference in binding energy between the Fermi level of the anode 2 and the lowest binding energy of the occupied energy level near the Fermi surface of the hole injection layer 4 and the difference in binding energy between the lowest binding energy of the occupied energy level near the Fermi surface of the hole injection layer 4 and the lowest binding energy of the HOMO of the buffer layer 4A are both within the range of ±0.3 eV inclusive, and thus, the hole injection efficiency of the organic EL element 1 is enhanced to an extremely high level.

In addition, the Schottky ohmic contact between the anode 2 and the hole injection layer 4 is highly stable not affected much, by the surface condition of the anode 2 (including characteristics of the surface such as the work function thereof). Due to this, there is no need of carefully controlling the surface condition of the anode 2 during the manufacturing of the organic EL element 1. As such, the organic EL element 1, which has excellent hole injection efficiency, and a large-size organic EL panel including a plurality of the organic EL elements 1 formed therein are manufacturable at a low cost and with a high yield.

Here, note that the surface condition of the anode 2 specifically refers to the surface condition of the anode 2 immediately before the forming of the hole injection layer 4, in a typical manufacturing procedure of an organic EL element or an organic EL panel.

In addition, in the manufacturing of the organic EL element 1, the film-density of the hole injection layer 4 is increased. Due to this, the hole injection layer 4 is provided with high dissolution resistance and the film thickness reduction amount of the hole injection layer 4 is reduced. Meanwhile, by forming the hole injection layer 4 under the predetermined, strictly defined film forming conditions, the hole injection layer 4 is provided with the occupied energy level near the Fermi surface. Thus, the hole injection layer 4 exhibits excellent hole injection characteristics, which further leads to effectively reducing the driving voltage of the organic EL element 1.

Note that a report has been made in the past of the technology of using tungsten oxide as the material for a hole injection layer (refer to Non-Patent Literature 1). However, the hole injection layer obtained in this report has an optimum film thickness of approximately 0.5 nm, and further, element characteristics were greatly dependent upon film thickness. Thus, Non-Patent Literature 1 does not disclose technology having a level of practicality which enables mass production of large-sized organic EL panels. Furthermore, Non-Patent Literature 1 does not disclose deliberately forming the occupied energy level near the Fermi surface in a hole injection layer. In contrast, the present invention provides the predetermined occupied energy level near the Fermi surface to a hole injection layer made of tungsten oxide, which has chemical stability and withstands processing during mass production of large-sized organic EL panels. The provision of the occupied energy level near the Fermi surface to the hole injection layer realizes excellent hole injection efficiency of the hole injection layer and enables the organic EL element to be driven at low voltage. In addition, the present invention further distinguishes over such conventional technology for providing the hole injection layer with increased dissolution resistance and thereby ensuring that the excellent hole injection characteristics of the hole injection layer are stably maintained.

In the following, description is provided of an example of a method for manufacturing the entire organic EL element 1.
(Method for Manufacturing Organic EL Element)

Firstly, the substrate 10 is mounted inside a chamber of a sputtering film forming device. Then, a predetermined gas is introduced into the chamber, and the anode 2, having a thickness of 50 nm and made of ITO, is formed by reactive sputtering.

Subsequently, the hole injection layer 4 is formed on a base layer including the anode 2. The hole injection layer 4 is made of a tungsten oxide film containing tungsten oxide having an oxygen vacancy structure. In this example, the hole injection layer 4 is formed directly on a surface of the anode 2. Here, it is desirable that the hole injection layer 4 be formed by reactive sputtering. Especially, when the organic EL element 1 is to be used in a large-sized organic EL panel, where there is a need of forming a plurality of the hole injection layers 4 over a large area, the forming of the hole injection layer 4 by vapor deposition is problematic in that there is a risk of unevenness in film thickness, etc., occurring. However, by forming the hole injection layer 4 by reactive sputtering, the occurrence of such unevenness in the forming of the hole injection layer 4 can be readily prevented.

In specific, reactive sputtering is performed after replacing the sputtering target with metal tungsten. Further, argon gas and oxygen gas are respectively introduced into the chamber as the sputtering gas and the reactive gas. Under this condition, application of high voltage is performed, whereby the argon in the argon gas is ionized, and the ionized argon is caused to bombard the sputtering target. The metal tungsten ejected as a result of the sputtering phenomenon reacts with the oxygen gas, and produces tungsten oxide. As a result, a tungsten oxide film is formed on the anode 2, above the substrate 10.

In the present disclosure, note that the predetermined film forming conditions under which the tungsten oxide film (the hole injection layer 4) is formed are also referred to as "low rate" conditions. Typically, a film forming rate when forming a film (i.e., a deposition rate) is set by controlling both an input power density of a film forming device and a ratio of a flow amount of a gas to the total flow amount of the chamber gas (partial pressure of the gas) in the film forming device. In specific, when forming a tungsten oxide film, the film forming rate can be decreased by increasing the flow amount of oxygen gas in the chamber gas (i.e., by increasing the partial pressure of the oxygen gas). Desirably, the specific "low rate" conditions are film forming conditions such that: a pressure of the gas introduced into the sputtering device (a total pressure of gas) is greater than 2.7 pascals (Pa) and at most 7.0 Pa; a partial pressure of the oxygen gas is at least 50% and at most 70% of the total pressure of gas; and an input power density per unit area of the sputtering target is at least 1 W/cm$^2$ and smaller than 2.8 W/cm$^2$. By being formed under the low rate, the tungsten oxide film has porousness close to that of a vapor deposition film. Further, the tungsten oxide film has an oxygen vacancy structure formed at least at a surface portion thereof, and thus an occupied energy level within a binding energy range from 1.8 eV to 3.6 eV lower than the lowest binding energy of the valence band. As such, it is ensured that the hole injection layer 4 has excellent hole injection characteristics.

Subsequently, a firing process is performed with respect to the tungsten oxide film so formed. Specifically, atmospheric firing of the tungsten oxide film is performed under predetermined conditions, i.e., at a firing temperature of at least 200° C. and at most 230° C., and for a processing time of at least 15 minutes to at most 45 minutes. In the firing process, care should be taken concerning the firing temperature, since when an interlayer insulating film (planarizing film), etc., are disposed on the surface of the substrate 10, there is a risk of such films undergoing degradation if the firing temperature is too high.

This firing process is performed to apply heat and thereby harden and densify the tungsten oxide film. Specifically, by conducting the firing process, the film density of the tungsten oxide film, which is within a range of at least 5.4 g/cm$^3$ and at most 5.7 g/cm$^3$ immediately after forming, changes (increases) to be within a range of at least 5.8 g/cm$^3$ and at most 6.0 g/cm$^3$. In addition, by performing the firing process according to the predetermined conditions described above, the oxygen vacancy structure existing within the film is retained. As such, the tungsten oxide film retains the occupied energy level near the Fermi surface even after the firing process is performed, and thus, there is no concern of the hole injection characteristics of the hole injection layer 4 being deteriorated by the firing process. Further, since the film density of the tungsten oxide film is increased by conducting the firing process, the dissolution resistance of the tungsten oxide film with respect to the etching solution, the cleaning liquid, etc., to be used for processing bank material as later described is increased to at least twice the level at the point immediately after the forming of the tungsten oxide film. Thus, the film thickness reduction amount of the tungsten oxide film is effectively reduced.

The hole injection layer 4 is formed by performing such processes.

Subsequently, as the material for forming the banks 5, photosensitive resin material for example, or more desirably, photoresist material containing fluorine material is prepared. The bank material so prepared is uniformly applied on the hole injection layer 4, and prebaking is performed. Subsequently, a mask having an opening of a predetermined shape that is in accordance with the pattern of the banks 5 to be formed is placed over the bank material film having been formed. After exposing the bank material film to light from over the mask, patterning of the bank material film is performed by washing away unhardened, redundant bank material by using a developer (the etching solution). Here, a conventional etching solution may be used, such as a tetramethylammonium hydroxide (TMAH) solution. After the etching is completed, cleaning by using the cleaning liquid (pure water, for example) is performed to complete the forming of the banks 5.

As described above, the firing process is performed to densify the hole injection layer 4 in embodiment 1. Due to this, the hole injection layer 4 exhibits a certain level of dissolution resistance with respect to alkaline solutions, water, organic solvents, etc. As such, even when the hole injection layer 4 falls in contact with the etching solution, pure water, etc., during the bank forming process, the occurrence of the film thickness reduction of the hole injection layer 4 due to dissolution to the etching solution, the cleaning liquid, etc., is suppressed compared to a tungsten oxide film with respect to which the firing process has not been performed. Thus, the hole injection layer 4 is maintained in appropriate form until completion of the manufacturing of the organic EL element 1. This too enables the efficient injection of holes via the hole injection layer 4 to the buffer layer 6A after the manufacturing of the organic EL element 1 is completed, and thus realizes excellent low voltage drive of the organic EL element 1.

Following this, the buffer layer 6A is formed by depositing drops of ink composition containing organic amine-containing molecular material onto a surface of the hole injection layer 4 that is exposed from between adjacent ones of the banks 5 and by removing the solvent of the ink composition by volatilization. Here, the application of ink composition is performed by wet processing such as the inkjet method and the gravure printing method. Thus, the buffer layer 6A is formed.

Next, drops of ink composition containing organic light-emission material are deposited onto the surface of the buffer layer 6A, and the solvent of the ink composition is removed by volatilization. Here, note that the application of ink composition is performed according to a method similar to that used in the forming of the buffer layer 6A. Thus, the light-emitting layer 6B is formed.

Here, it should be noted that the method applied for forming the buffer layer 6A and the light-emitting layer 6B is not limited to the above-described method. Other conventional methods besides the inkjet method and the gravure printing method may be used in the deposition and application of ink. Such conventional methods include: the dispenser method; the nozzle coating method; the spin coating method; intaglio printing; and relief printing.

Subsequently, the barium layer 8A and the aluminum layer 8B are formed on a surface of the light-emitting layer 6B by vacuum vapor deposition. Thus, the cathode 8 is formed.

Note that although not illustrated in FIG. 1, a sealing layer may be additionally provided on the surface of the cathode 8, or a sealing cap may be provided to isolate the entire organic EL element 1 from external space, in order as to prevent atmospheric exposure of the organic EL element 1. Such a sealing layer as described above is formed, for example, by using material such as silicon nitride (SiN) and silicon oxynitride (SiON), and is disposed such that the organic EL element 1 is sealed therein. Such a sealing cap as described above is formed by using, for example, the same material as the substrate 10, and a getter which absorbs moisture and the like is provided within the sealed space formed by the substrate 10 and the sealing cap.

Through the above-described processes, the organic EL element 1 is manufactured.

<Experiments and Observations>
(Film Forming Conditions of Tungsten Oxide Film)

In embodiment 1, due to being formed under the predetermined film forming conditions, the tungsten oxide film which constitutes the hole injection layer 4 is provided with the occupied energy level near the Fermi surface. The occupied energy level near the Fermi surface reduces the hole injection barrier between the hole injection layer 4 and the buffer layer 6A, and thereby enables the organic EL element 1 to drive at low voltage.

A tungsten oxide film realizing the above-described performance of the organic EL element 1 is desirably formed by performing reactive sputtering in a DC magnetron sputtering device, by using metal tungsten as the sputtering target, not performing any control of substrate temperature, and using a chamber gas composed of argon gas and oxygen gas, and further, by performing the reactive sputtering under the predetermined film forming conditions such that: the pressure of the gas introduced into the sputtering device (the total pressure of gas) is greater than 2.7 Pa and at most 7.0 Pa; the partial pressure of the oxygen gas is at least 50% and at most 70% of the total pressure of gas; and the input power density per unit area of the sputtering target is at least 1 W/cm$^2$ and smaller than 2.8 W/cm$^2$.

The effectiveness of such film forming conditions has been proved through the following experiments.

Firstly, the present inventors prepared hole-only devices as assessment devices to be used in accurately determining the dependence of hole injection efficiency upon film forming conditions. Needless to say, here the hole injection efficiency refers to the efficiency with which holes are injected from the hole injection layer 4 into the buffer layer 6A.

Note that in an organic EL element, electric current is typically formed of carriers consisting of both holes and electrons. As such, the electrical characteristics of an organic EL element reflects electron current as well as hole current. However, in hole-only devices such as those prepared by the present inventors, the injection of electrons from the cathode is blocked and thus there is almost no flow of electron current. As such, electrical current flowing in the hole-only devices consists almost entirely of hole current, and it could be considered that only holes function as carriers in such hole-only devices. This is why, the hole-only devices are desirable for assessing hole injection efficiency.

In specific, the present inventors prepared hole-only devices each differing from the organic EL element 1 illustrated in FIG. 1 in that the cathode 8 is replaced with a cathode 8C made of gold (Au), as illustrated in FIG. 2. More specifically, as illustrated in FIG. 2, each hole-only device includes a substrate 10 and a 50 nm-thick anode 2 made of an ITO thin film and formed on the substrate 10, and further includes the following layers disposed above the anode 2 in the stated order: a 30 nm-thick hole injection layer 4 made of tungsten oxide; a 20 nm-thick buffer layer 6A made of TFB, which is an organic amine-containing organic high molecular material; a 70 nm-thick light-emitting layer 6B made of F8BT, which is an organic high molecular material; and a 100 nm-thick cathode 8C made of gold. Note that, considering that the hole-only devices are assessment devices, the banks 5 were not included therein.

In the manufacturing of the hole-only devices, the hole injection layers 4 were formed by reactive sputtering in a DC magnetron sputtering device. The chamber gas was composed of at least one of argon gas and oxygen gas, and metal tungsten was used as the sputtering target. Further, no control was performed of substrate temperature, while control of the partial pressure of the argon gas, the partial pressure of the oxygen gas, and the total pressure of gas was performed by controlling the flow amount of the gases. Further, the hole injection layer 4 in each of the hole-only devices was formed according to different film forming conditions. Here, the film forming conditions differ from each other in terms of the total pressure of gas, the partial pressure of the oxygen gas, and input power, as illustrated in Table 1. As a result, hole-only devices 1B (devices No. 1 through No. 14) having hole injection layers 4 formed under different film forming conditions were obtained. Note that, hereinafter, the partial pressure of the oxygen gas is indicated in percentage (%) with respect to the total pressure of the chamber gas.

TABLE 1

Film Forming Conditions of the Hole-only Devices 1B

| Device No. | 1 | 2 | 3 | 4 | 5 | 6 | 7 |
|---|---|---|---|---|---|---|---|
| Oxygen Partial Pressure (%) | 70 | 50 | 100 | 50 | 70 | 100 | 70 |
| Total Pressure (Pa) | 2.7 | 4.8 | 1.7 | 1.7 | 2.7 | 1.7 | 2.7 |
| Input Power (W) | 500 | 500 | 500 | 500 | 250 | 250 | 1000 |
| T-S (mm) | 113 | 113 | 113 | 113 | 113 | 113 | 113 |
| Film Forming Rate (nm/s) | 0.164 | 0.14 | 0.111 | 0.181 | 0.057 | | 0.308 |
| Film Thickness (nm) | 30 | 30 | 30 | 30 | 30 | 30 | 30 |

| Device No. | 8 | 9 | 10 | 11 | 12 | 13 | 14 |
|---|---|---|---|---|---|---|---|
| Oxygen Partial Pressure (%) | 50 | 100 | 50 | 70 | 30 | 30 | 50 |
| Total Pressure (Pa) | 4.8 | 1.7 | 2.7 | 1.7 | 1.7 | 2.7 | 4.8 |
| Input Power (W) | 1000 | 1000 | 500 | 500 | 500 | 500 | 250 |
| T-S (mm) | 113 | 113 | 113 | 113 | 113 | 113 | 113 |
| Film Forming Rate (nm/s) | 0.311 | 0.246 | 0.154 | 0.153 | 0.364 | 0.177 | 0.049 |
| Film Thickness (nm) | 30 | 30 | 30 | 30 | 30 | 30 | 30 |

Table 2 illustrates the relation between input power and input power density of the DC magnetron sputtering device.

TABLE 2

| Input Power (W) | Input Power Density (W/cm²) |
|---|---|
| 250 | 1.4 |
| 500 | 2.8 |
| 1000 | 5.6 |

Each of the hole-only devices 1B so prepared was connected to the direct current power supply DC, and voltage was applied thereto. Here, different voltages were applied to the hole-only devices 1B for experimentation, and current values for different voltage values were measured. Further, the current values were converted into current values per unit surface area of the devices (current densities). Note that hereinafter, the expression "driving voltage" refers to applied voltage for a current density of 10 mA/cm².

Here, assumption is made that the lower the driving voltage of a hole-only device, the greater the hole injection efficiency from the hole injection layer 4 to the buffer layer 6A in the hole-only device. This is since, parts of the hole-only devices 1B other than the hole injection layer 4 were prepared in the same way, and thus, assumption is made that the hole injection barrier between two adjacent layers, excluding the hole injection layer 4, is uniform in each of the hole-only devices 1B. Furthermore, as described below, it was confirmed through another experiment that Schottky ohmic contact is formed between the anode 2 and the hole injection layer 4 in each of the hole-only devices 1B used in this experiment. For the above reasons, the differences observed in the hole-only devices 1B, which are due to the different film forming conditions, are considered to strongly reflect the hole injection efficiency from the hole injection layer 4 to the buffer layer 6A in the hole-only devices 1B and the hole conduction efficiency of the hole injection layer 4 itself in the hole-only devices 1B.

As described above, assumption is made that, in addition to the hole injection efficiency from the hole injection layer 4 to the buffer layer 6A, the hole conduction efficiency of the hole injection layer 4 influences the characteristics of the hole-only devices 1B used in the experiments in embodiment 1. From the assessment of energy diagrams described below, it is at least evident that the hole injection barrier between the hole injection layer 4 and the buffer layer 6A definitely and strongly influences the characteristics of the hole-only devices 1B.

Further, note that in embodiment 1, results of observation concerning the hole injection efficiency from the hole injection layer 4 to the buffer layer 6A are mainly provided, whereas in embodiment 2, results of observation concerning the hole conduction efficiency of the hole injection layer 4 are mainly provided.

Table 3 illustrates driving voltage values of the hole-only devices 1B in relation to different film forming conditions, namely different values of the total pressure of the chamber gas, the partial pressure of the oxygen gas, and input power. Note that the numbers enclosed in circles in Table 3 indicate device numbers of the hole-only devices 1B.

TABLE 3

Film Forming Conditions and Driving Voltages of the Hole-only Devices 1B (Applied Voltage Value under Electric Current Density of 10 mA/cm$^2$)

|  |  | Total Pressure | | |
|---|---|---|---|---|
|  |  | 1.7 Pa | 2.7 Pa | 4.8 Pa |
| Oxygen Partial Pressure | 30% | ⑫ 500 W (Unmeasured) | ⑬ 500 W (19 V) | Film not formed |
|  | 50% | ④ 500 W (19 V) | ⑩ 500 W (19 V) | ⑭ 250 W (13.7 V) ② 500 W (13.7 V) ⑧ 1000 W (>20 V) |
|  | 70% | ⑪ 500 W (Unmeasured) | ⑤ 250 W (14.7 V) ① 500 W (18.2 V) ⑦ 1000 W (>20 V) | Film not formed |
|  | 100% | ⑥ 250 W (Unmeasured) ③ 500 W (>20 V) ⑨ 1000 W (>20 V) | Film not formed | Film not formed |

*Numbers enclosed in circles indicate device No., numbers without parenthesis indicate input electricity, and numbers placed in parenthesis indicate driving voltage.

Further, FIGS. 3A through 3C are graphs summarizing the dependence of driving voltages of the hole-only devices 1B on different film forming conditions. Each of the points in FIG. 3A indicates, from left to right, a driving voltage of devices No. 4, 10, and 2. Similarly, each of the points in FIG. 3B indicates, from left to right, a driving voltage of the devices No. 13, 10, and 1. Finally, each of the points in FIG. 3C indicates, from left to right, a driving voltage of the devices No. 14, 2, and 8.

Note that in the present embodiment, the forming of the hole injection layer 4 was not performable under specific film forming conditions due to limitations on the flow amount of gas, etc., on the side of the sputtering device. Specifically, the forming of the hole injection layer 4 was not performable for each of the following film forming conditions: (i) when the total pressure of gas is 2.7 Pa and the partial pressure of the oxygen gas is 100%; (ii) when the total pressure of gas is 4.8 Pa and the partial pressure of the oxygen gas is 30%; (iii) when the total pressure of gas is 4.8 Pa and the partial pressure of the oxygen gas is 70%; and (iv) when the total pressure of gas is 4.8 Pa and the partial pressure of the oxygen gas is 100%.

Firstly, the dependence of driving voltage on the total pressure of chamber gas is analyzed by referring to experiment results for hole-only devices 1B formed with the partial pressure of the oxygen gas being set to 50% and the input power being set to 500 W (devices No. 4, 10, and 2). When comparing such hole-only devices 1B, an obvious decrease in driving voltage was observed at least while the total pressure of gas was within a range of greater than 2.7 Pa and at most 4.8 Pa, as illustrated in FIG. 3A. In addition, the present inventors observed through another experiment that this tendency of decrease in driving voltage continues at least until the total pressure of gas equals 7.0 Pa. Taking this into account, it is desirable that the total pressure of gas be within a range of greater than 2.7 Pa and at most 7.0 Pa.

Next, the dependence of driving voltage on the partial pressure of the oxygen gas is analyzed by referring to experiment results for hole-only devices 1B formed with the total pressure being set to 2.7 Pa and the input power being set to 500 W (devices No. 13, 10, and 1). When comparing such hole-only devices 1B, it was observed that, at least while the partial pressure of the oxygen gas is within the range of at least 50% and at most 70% of the total pressure of gas, the driving voltage decreases as the partial pressure of the oxygen gas increases, as illustrated in FIG. 3B. Meanwhile, the present inventors observed through another experiment that when the partial pressure of the oxygen gas exceeds this range, the driving voltage increases adversely. Taking this into account, it is desirable that the oxygen gas partial pressure be set to at least 50%, while setting an upper limit at approximately 70%.

Finally, the dependence of driving voltage on input power is analyzed by referring to experiment results for hole-only devices 1B formed with the total pressure being set to 4.8 Pa and the partial pressure of the oxygen gas being set to 50% (devices No. 14, 2, and 8). When comparing such hole-only devices 1B, the driving voltage rapidly increases when the input power exceeds 500 W, as illustrated in FIG. 3C. Taking this into account, it is desirable that input power be set to at most 500 W. Here, it should be noted that, the experiment results for devices No. 1 and 3 in Table 3 indicate that even when the input power is set to 500 W, driving voltage increases when the total pressure is no greater than 2.7 Pa.

Figure 4:
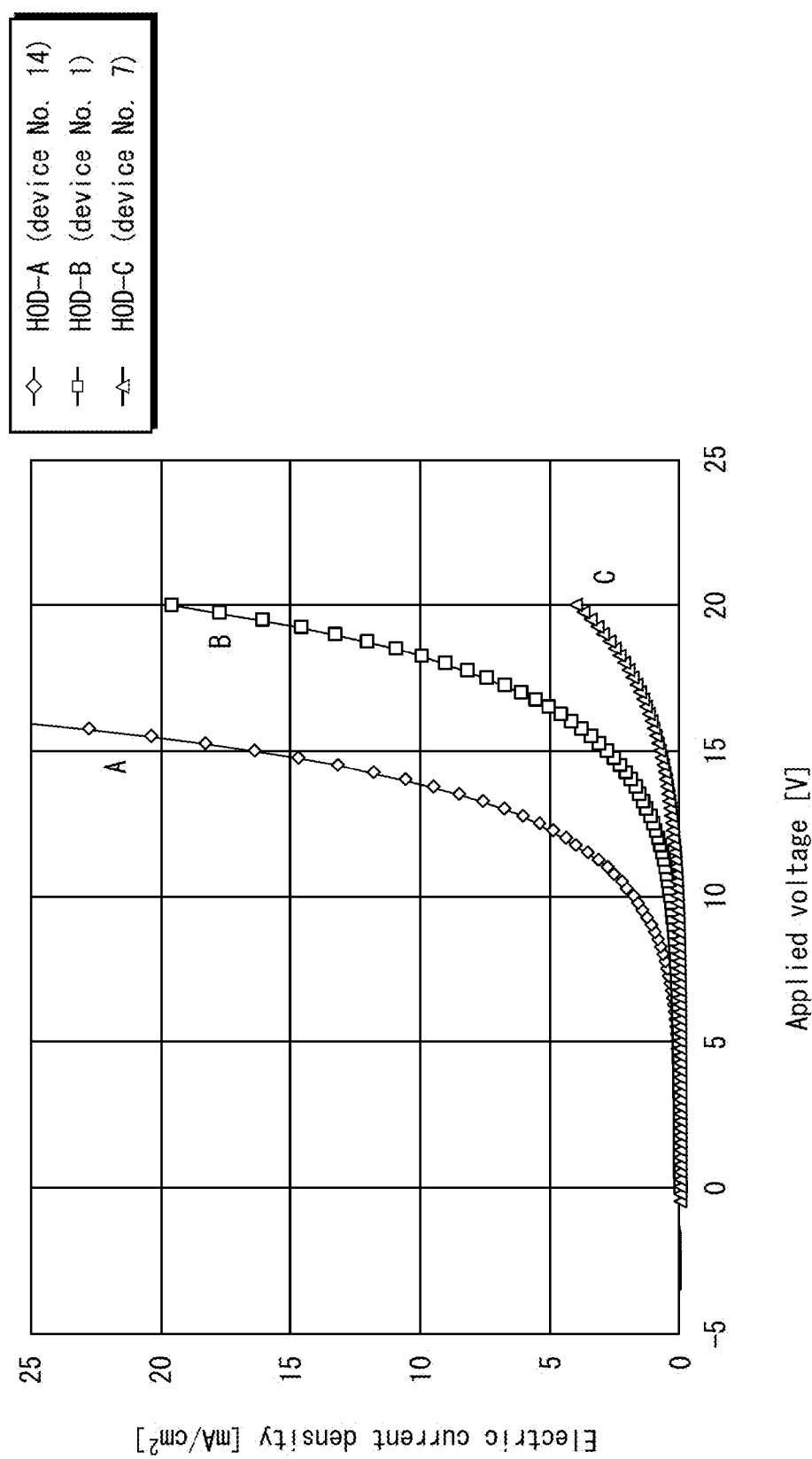
FIG. 4 is a device characteristics diagram showing curves illustrating the relation between applied voltages and current densities of the hole-only devices.

FIG. 4 illustrates current density-applied voltage curves for the hole-only devices 1B. In FIG. 4, curves corresponding to devices No. 14, 1, and 7 are illustrated for example. In FIG. 4, the vertical axis indicates current density (mA/cm$^2$), whereas the horizontal axis indicates applied voltage (V). The hole-only device No. 14 is a hole-only device formed with the desirable conditions being fulfilled for each film forming condition, i.e., the total pressure of gas, the partial pressure of the oxygen gas, and input power. On the other hand, devices No. 1 and 7 are hole-only device formed with the desirable conditions not being fulfilled for at least one film forming condition.

In order to facilitate explanation, hereinafter, the film forming conditions under which the hole injection layer 4 in device No. 14 was formed is referred to as film forming conditions A, the film forming conditions under which the hole injection layer 4 in device No. 1 was formed is referred to as film forming conditions B, and the film forming conditions under which the hole injection layer 4 in device No. 7 was formed is referred to as film forming conditions C. In accordance, devices No. 14, 1, and 4 are respectively labeled HOD-A, HOD-B, and HOD-C in FIG. 4.

As illustrated in FIG. 4, the current density-applied voltage curve for HOD-A indicates a rise at a lower applied voltage compared to those for HOD-B and HOD-C, and reaches a high current density at a lower applied voltage compared to those for HOD-B and HOD-C. Based on this, assumption is made that the hole injection efficiency from the hole injection layer 4 to the buffer layer 6A in the HOD-A is higher than that in HOD-B and HOD-C. Further, HOD-A operates at the lowest driving voltage among the hole-only devices 1B.

In the above, observation has been made of the hole injection efficiency from the hole injection layer 4 to the buffer layer 6A in the hole-only devices 1B. Here, as already described above, the structure of the hole-only devices 1B and the structure of the organic EL element 1 are similar, differing only in the cathodes. Therefore, the hole injection efficiency from the hole injection layer 4 to the buffer layer 6A in the organic EL element 1 is dependent upon the film forming conditions, in the same way as the hole injection efficiency from the hole injection layer 4 to the buffer layer 6A in the hole-only devices 1B is dependent upon the film forming conditions. In order to confirm this, the present inventors prepared three organic EL elements 1 having hole injection layers 4 formed under the respective film forming conditions A, B, and C.

More specifically, as illustrated in FIG. 1, each of the organic EL elements 1 prepared by the present inventors for this experiment includes a substrate 10 and a 50 nm-thick anode 2 made of an ITO thin film and formed on the substrate 10, and further includes the following layers disposed above the anode 2 in the stated order: a 30 nm-thick hole injection layer 4 made of tungsten oxide; a 20 nm-thick buffer layer 6A made of TFB, which is an organic amine-containing organic high molecular material; a 70 nm-thick light-emitting layer 6B made of F8BT, which is an organic high molecular material; and a cathode 8C composed of a 5 nm-thick barium layer and a 100 nm-thick aluminum layer. Note that, considering that the organic EL elements 1 here are assessment devices, the banks 5 were not included therein.

Figure 5:
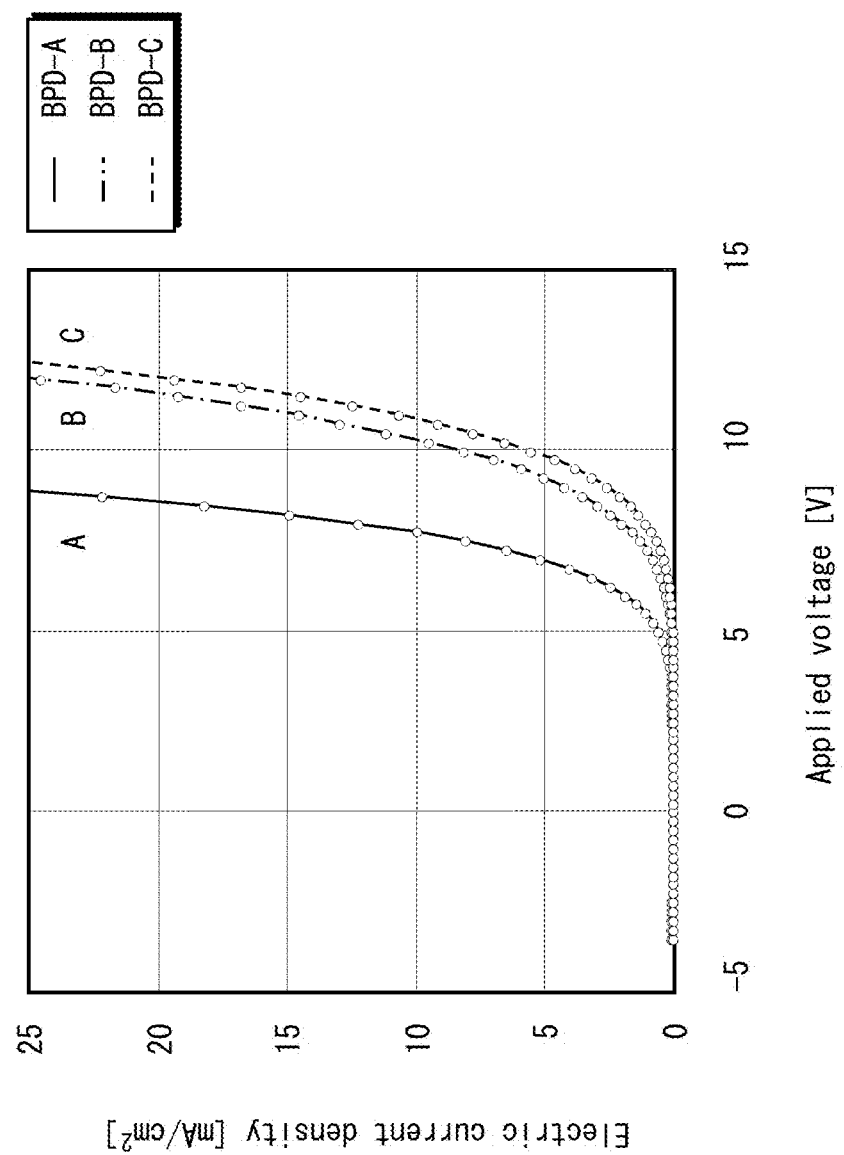
FIG. 5 is a device characteristics diagram showing curves illustrating the relation between applied voltages and current densities of organic EL elements.

Each of the organic EL devices 1 corresponding to the respective film forming conditions A, B, and C so prepared were then connected to the direct current power supply DC, and voltage was applied thereto. FIG. 5 illustrates current density-applied voltage curves for the organic EL devices 1 corresponding to the respective film forming conditions A, B, and C. In FIG. 5, the vertical axis represents current density ($mA/cm^2$), and the horizontal axis represents applied voltage (V).

In order to facilitate explanation, hereinafter, the organic El elements 1 corresponding to the film forming conditions A, B, and C are respectively referred to as BPD-A, BPD-B, and BPD-C. This is in accordance with the illustration provided in FIG. 5.

As illustrated in FIG. 5, the current density-applied voltage curve for BPD-A indicates a rise at a lower applied voltage compared to those for BPD-B and BPD-C, and reaches a high current density at a lower applied voltage compared to those for BPD-B and BPD-C. This trend is similar to the trend which could be seen in the hole-only devices HOD-A, HOD-B, and HOD-C, which were prepared under the same respective film forming conditions as BPD-A, BPD-B, and BPD-C.

Figure 6:
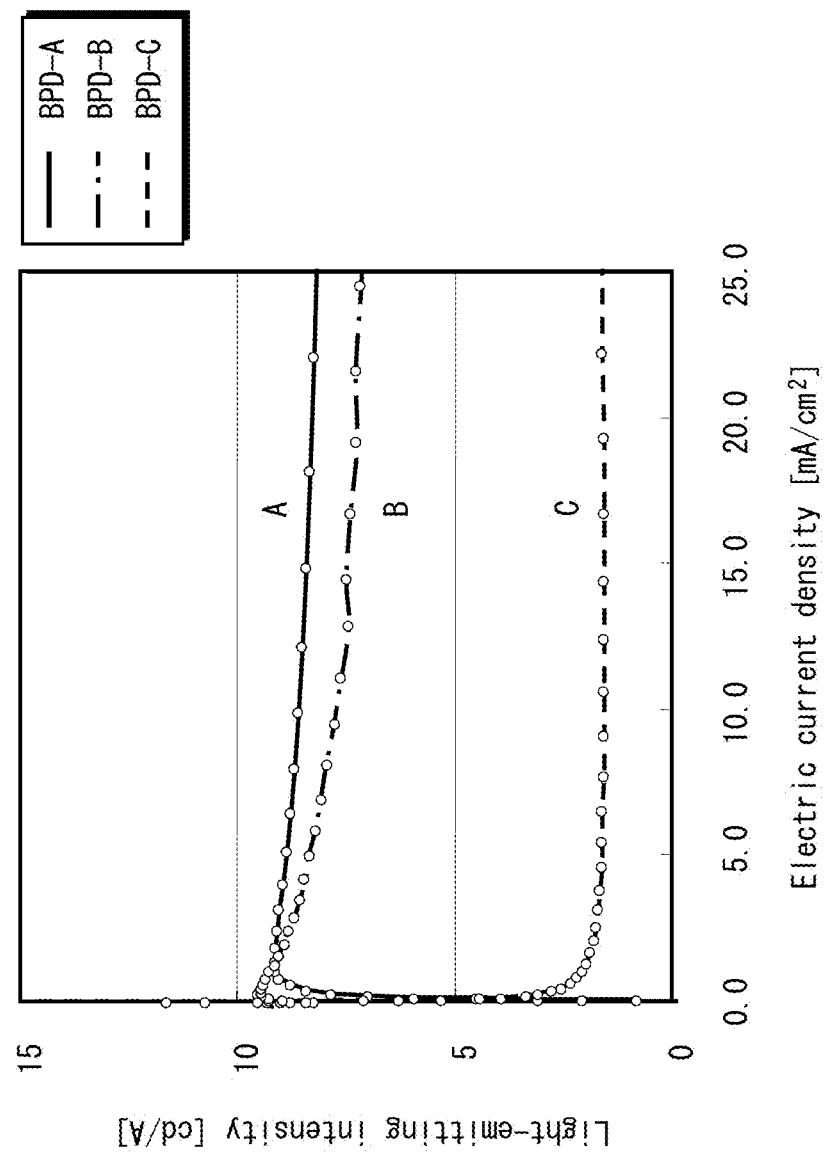
FIG. 6 is a device characteristics diagram showing curves illustrating the relation between current densities and light-emission intensities of the organic EL elements.

FIG. 6 illustrates light-emission intensity-current density curves for the above organic EL elements 1. Each curve in FIG. 6 indicates light-emission intensities for different current densities. In FIG. 6, the vertical axis indicates light-emission intensity (cd/A), whereas the horizontal axis indicates current density ($mA/cm^2$). According to FIG. 6, it can be seen that, at least within the range of current densities measured in the experiment, BPD-A has the highest light-emission intensity among the three organic EL elements 1.

From the above results, assumption is made that the hole injection efficiency from the hole injection layer 4 to the buffer layer 6A in the organic EL element 1 is dependent upon the film forming conditions, in the same way as the hole injection efficiency from the hole injection layer 4 to the buffer layer 6A in the hole-only devices 1B is dependent upon the film forming conditions. That is, assumption is made that excellent hole injection efficiency from the hole injection layer 4 to the buffer layer 6A is realized, and accordingly, excellent low voltage drive and high light-emission efficiency of the organic EL element 1 are realized by forming the hole injection layer 4 by performing reactive sputtering in a DC magnetron sputtering device, by using metal tungsten as the sputtering target, not performing any control of substrate temperature, and using a chamber gas composed of argon gas and oxygen gas, and further, by performing the reactive sputtering under the predetermined film forming conditions such that: the pressure of the gas introduced into the sputtering device (the total pressure of gas) is greater than 2.7 Pa and at most 7.0 Pa; the partial pressure of the oxygen gas is at least 50% and at most 70% of the total pressure of gas; and the input power density per unit area of the sputtering target is at least 1 $W/cm^2$ and smaller than 2.8 $W/cm^2$.

Note that in the above, the film forming condition concerning input power is presented by using input power density instead, in accordance with Table 2. Accordingly, when using a DC magnetron sputtering device that is different from the DC magnetron sputtering device used in the present experiment, a hole injection layer 4 that realizes excellent low voltage drive and high light-emission efficiency of the organic EL element 1 as that in the present embodiment is yielded by adjusting input power according to the size of the sputtering target so that input power density fulfills the condition concerning input power in the above-described film forming conditions. Further, note that in the above-described film forming conditions, the condition concerning the total pressure of gas and the condition concerning the partial pressure of oxygen gas remain the same regardless of such factors as the device used for the film forming and the size of the sputtering target.

Additionally, when forming the hole injection layer 4 by reactive sputtering in the sputtering device, no deliberate adjustment of substrate temperature is performed in the sputtering device, which is assumed to be placed under room temperature. Therefore, the substrate is at room temperature at least before the forming of the hole injection layer 4. However, it should be noted that there is a possibility of the substrate temperature increasing by several tens of degrees Celsius during the forming of the hole injection layer 4.

Furthermore, the organic EL element 1 having the hole injection layer 4 formed under film forming conditions A corresponds to the organic EL element 1 in embodiment 1, having the occupied energy level near the Fermi surface. Further observation is to be made regarding this point in the following.

(Electronic State of Hole Injection Layer)

The tungsten oxide composing the hole injection layer 4 in the organic EL element 1 pertaining to embodiment 1 has the occupied energy level near the Fermi surface. The occupied energy level near the Fermi surface is formed by adjusting the film forming conditions under which the hole injection layer 4 is formed in the manner indicated through the above experiments. Details concerning this point are provided in the following.

The present inventors conducted an experiment to check whether or not the occupied energy level near the Fermi surface exists in tungsten oxide films formed under the respective film forming conditions A, B, and C.

Figure 7:
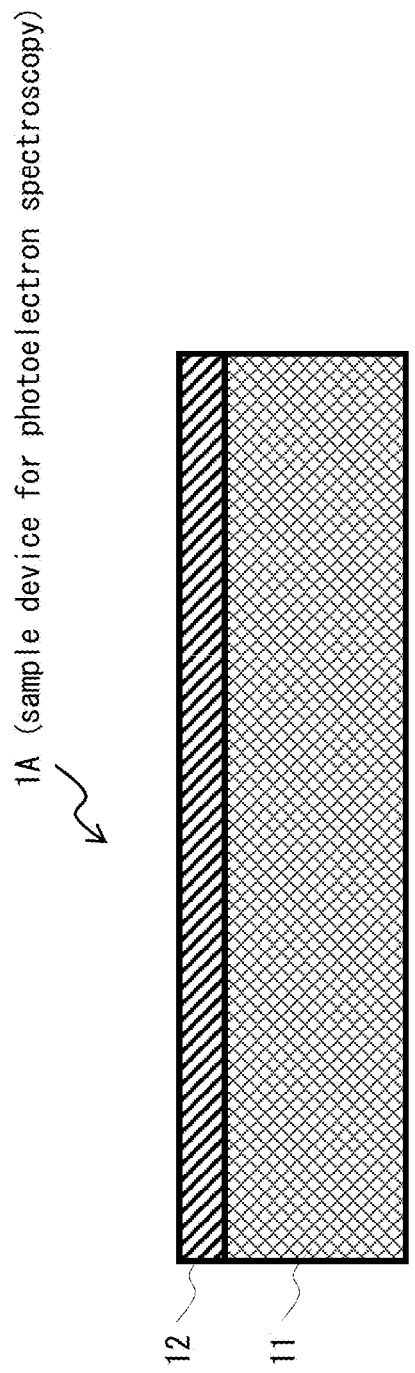
FIG. 7 is a schematic cross-sectional view illustrating the structure of a sample device for photoelectron spectroscopy measurement.

The present inventors prepared sample devices for photoelectron spectroscopy measurement by applying the respective film forming conditions A, B, and C. More specifically, each of the sample devices in the experiment has a structure indicated by 1A in FIG. 7, where a 10 nm-thick tungsten oxide layer 12 (corresponding to the hole injection layer 4) is formed on a conductive silicon substrate 11 by reactive sputtering. In the following, a sample device 1A formed under film forming conditions A is referred to as sample device A, a sample device 1A formed under film forming conditions B is referred to as sample device B, and a sample device 1A formed under film forming conditions C is referred to as sample device C.

After forming the tungsten oxide layers 12 inside a sputtering device, the sample devices A, B, and C were then transported to a glovebox connected to the sputtering device and filled with nitrogen gas to prevent atmospheric exposure. Subsequently, the sample devices A, B, and C were sealed inside transfer vessels in the glovebox, and were then mounted on a photoelectron spectroscopy device. Thus, ultraviolet photoelectron spectroscopy (UPS) measurement of the sample devices A, B, and C was performed while preventing the tungsten oxide layers 12 from undergoing atmospheric exposure after forming thereof.

Commonly, a UPS spectrum obtained as a result of the UPS measurement reflects a state of occupied energy levels, such as a valence band, within several nanometers in distance from the surface of the target of measurement. As such, the present experiment was conducted to observe the state of occupied energy levels at a surface portion of the tungsten oxide layer 12 by utilizing UPS measurement.

The conditions under which the UPS measurement was conducted are as follows. Here, it should be noted that since a conductive silicon substrate (i.e., the conductive silicon substrate 11) is used in each of the sample devices A, B, and C, charge-up did not occur during the UPS measurement of the sample devices A, B, and C.

Figure 8:
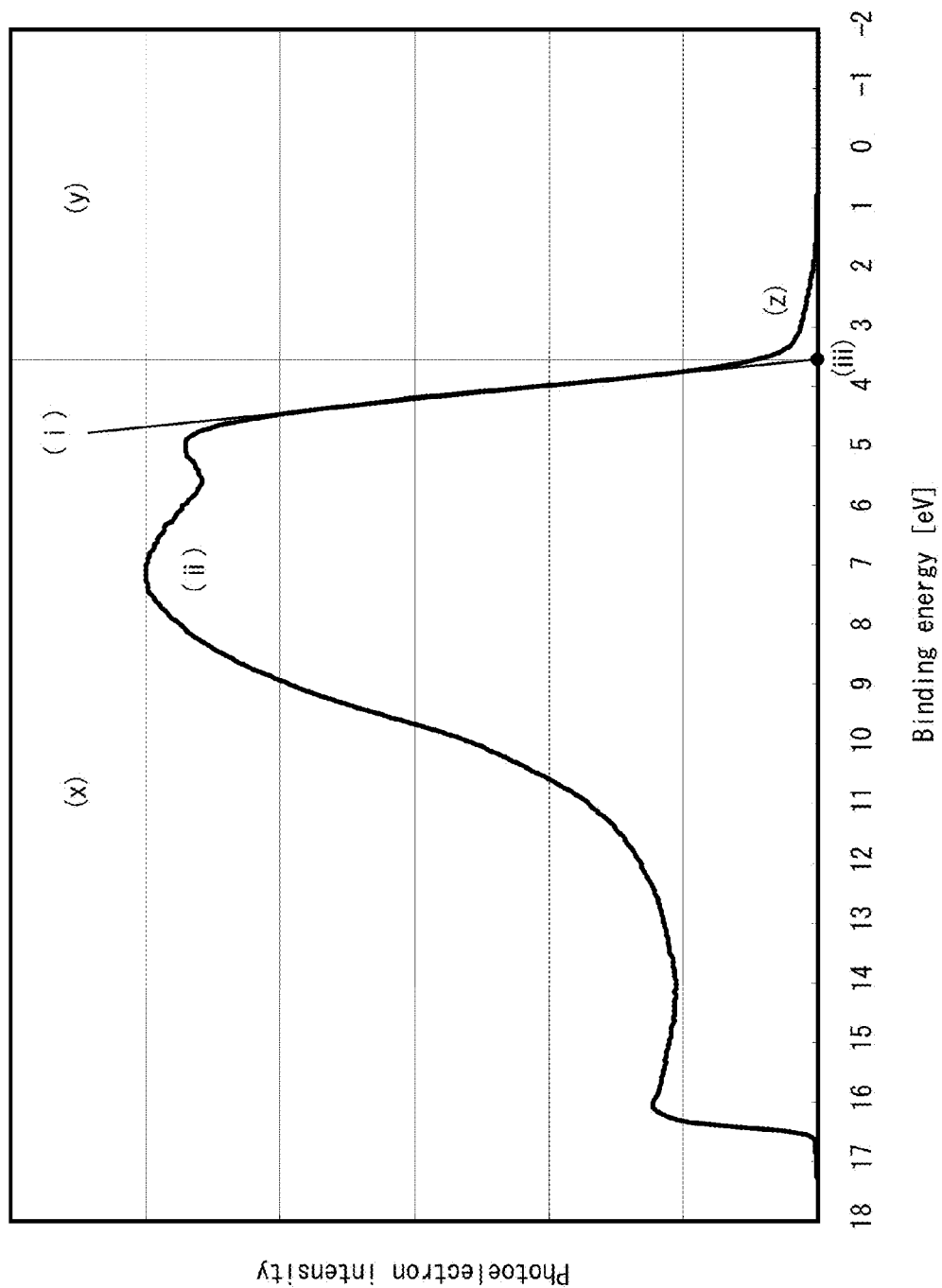
FIG. 8 illustrates a UPS spectrum of a tungsten oxide layer.

Light source: He I line
Bias: None
Electron emission angle: Direction of normal line to the substrate
Interval between measurement points: 0.05 eV FIG. 8 illustrates a UPS spectrum of the tungsten oxide layer 12 of the sample device A. The origin of the horizontal axis, which represents binding energy, corresponds to the Fermi surface of the conductive silicon substrate 11, and the left direction with respect to the origin is positive.

In the following, description is provided on the occupied energy levels of the tungsten oxide layer 12 with reference to FIG. 8.

Typically, a UPS spectrum of tungsten oxide indicates a large and rapid rise which can be uniquely distinguished from other areas thereof. Here, a tangential line passing through an inflection point of the above rise is illustrated as line (i), and the point at which line (i) intersects the horizontal axis is illustrated as point (iii). Further, a UPS spectrum of tungsten oxide can be divided into two areas: area x that extends in the high binding energy direction from point (iii), and area y that extends in the low binding energy direction from point (iii).

Here, according to the composition ratios of the tungsten oxide layers 12 given in Table 4, the ratio between tungsten atoms and oxygen atoms is approximately 1:3 in each of the sample devices A, B, and C. The composition ratios in Table 4 were obtained by performing X-ray photoelectron spectroscopy (XPS) measurement with respect to the tungsten oxide layers 12. More specifically, XPS measurement of the sample devices was performed by using the photoelectron spectroscopy device while preventing atmospheric exposure of the tungsten oxide layer 12 in the sample devices, in a similar way as in the UPS measurement. By conducting the XPS measurement, the composition ratio between tungsten and oxygen within several nanometers in distance from the surface of the tungsten oxide layer 12 was estimated for each of the sample devices A, B, and C. Note that the film forming conditions under which the tungsten oxide layer 12 in each of the sample devices A, B, and C was formed are also illustrated in Table 4.

TABLE 4

| Sample Device | Sample Device A | Sample Device B | Sample Device C |
|---|---|---|---|
| Film Forming Conditions | Film Forming Conditions A | Film Forming Conditions B | Film Forming Conditions C |
| Total Pressure (Pa) | 4.8 | 2.7 | 2.7 |
| Oxygen Partial Pressure (%) | 50 | 70 | 70 |

TABLE 4-continued

| Sample Device | Sample Device A | Sample Device B | Sample Device C |
|---|---|---|---|
| Input Power (W) | 250 | 500 | 1000 |
| Composition Ratio (Oxygen/Tungsten) | 3.0 | 2.9 | 2.8 |

According to the composition ratios, assumption is made that in each of the samples A, B, and C, the tungsten oxide layer 12, at least within several nanometers in distance from the surface thereof, has an atomic arrangement based on that of tungsten trioxide. That is, the tungsten oxide layer 12 in each of the samples A, B, and C has a basic structure where six oxygen atoms bond with one tungsten atom in octahedral coordination and the octahedrons share oxygen atoms at corners thereof with adjacent octahedrons. As such, the area x in FIG. 8 corresponds to an energy level deriving from the above-described basic structure, and is an area corresponding to a so-called valence band. Here, the occupied energy level deriving from the basic structure is an occupied energy level possessed by a tungsten trioxide crystal, or by an amorphous structure in which crystalline order is disturbed (yet in which bonds are not broken, thus the above basic structure being preserved). Note that the present inventors performed X-ray absorption fine structure (XAFS) measurement with respect to the tungsten oxide layer 12 of each of the sample devices A, B, and C, and have confirmed that the above-mentioned basic structure is formed in each of the sample devices A, B, and C.

Based on the above, the area y in FIG. 8 corresponds to the band gap between the valence band and the conduction band of the tungsten oxide layer 12. Further, as is suggested by the UPS spectrum in FIG. 8, it is known that an occupied energy level that differs from the occupied energy level of the valence band may exist in the area y of the tungsten oxide. This occupied energy level in area y derives from a structure different from the above-mentioned basic structure, and is referred to as a band gap energy level (in-gap state or gap state).

Figure 9:
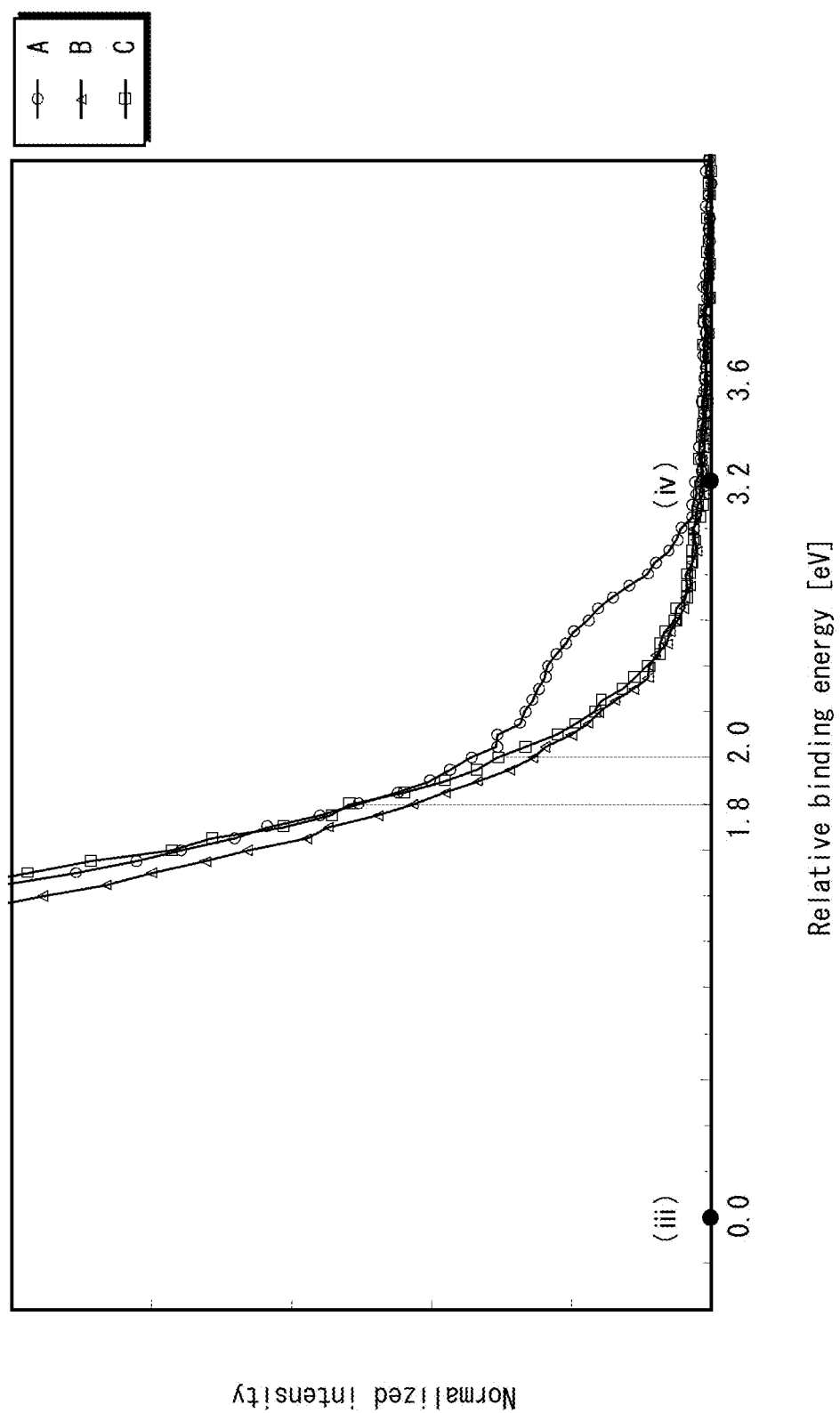
FIG. 9 illustrates UPS spectra of tungsten oxide layers.

FIG. 9 illustrates a UPS spectrum of the tungsten oxide layer 12 for each of the sample devices A, B, and C within area y. The spectrum intensity indicated by the vertical axis in FIG. 9 has been normalized using the peak-top intensity value of a peak (ii) in FIG. 8, which is located approximately between 3 eV and 4 eV in the high binding energy direction from point (iii). In addition, note that point (iii) in FIG. 9 is illustrated at the same point on the horizontal axis as in FIG. 8. In FIG. 9, the horizontal axis indicates a relative value (relative binding energy) with respect to point (iii), and the binding energy decreases from left to right.

As illustrated in FIG. 9, the spectrum indicating the tungsten oxide layer 12 in the sample device A exhibits a peak within a binding energy range from 3.6 eV lower than point (iii) to 1.8 eV lower than point (iii). The point at which this peak clearly begins is labeled as point (iv) in FIG. 9. Here, it should be noted that the existence of such a peak is not observed in the spectra corresponding to sample devices B and C.

As such, the present invention uses, as the hole injection layer, a film of tungsten oxide whose UPS spectrum indicates an upward protrusion (not necessarily a peak) within a binding energy range from 1.8 eV lower than point (iii) to 3.6 eV lower than point (iii). Due to this, the organic EL element pertaining to the present invention exhibits excellent hole injection efficiency.

Furthermore, it has been found that the hole injection efficiency in the organic EL element tends to increase when the upward protrusion has a higher degree of sharpness. Therefore, as illustrated in FIG. 9, it can be said that the binding energy range from 2.0 eV lower than point (iii) to 3.2 eV lower than point (iii) is particularly important, since the upward protrusion is relatively easier to confirm and has a relatively sharp inclination within this binding energy range.

Note that, in the following, the above-described upward protrusion observed in the UPS spectrum is referred to as "a spectral protrusion near the Fermi surface". Furthermore, the energy level corresponding to this spectral protrusion near the Fermi surface is the "the occupied energy level near the Fermi surface", which has been already described in the above.

Subsequently, the present inventors performed differentiation on the normalized intensity of the UPS spectrum of each of the sample devices A, B, and C illustrated in FIG. 9. The differentiation was performed for the purpose of making the spectral protrusion near the Fermi surface more distinguishable.

In specific, by using the graph analysis software IGOR Pro 6.0, the present inventors conducted binomial smoothing (where the smoothing factor was set to 1) 11 times with respect to the UPS spectra illustrated in FIG. 9, and then performed differentiation by applying the central difference method. Such processing of data was conducted so as to remove fluctuation factors such as background noise generated during the UPS measurement, to smoothen the differential curves, and to convey the arguments presented in the following in as clear a manner as possible.

Figure 10:
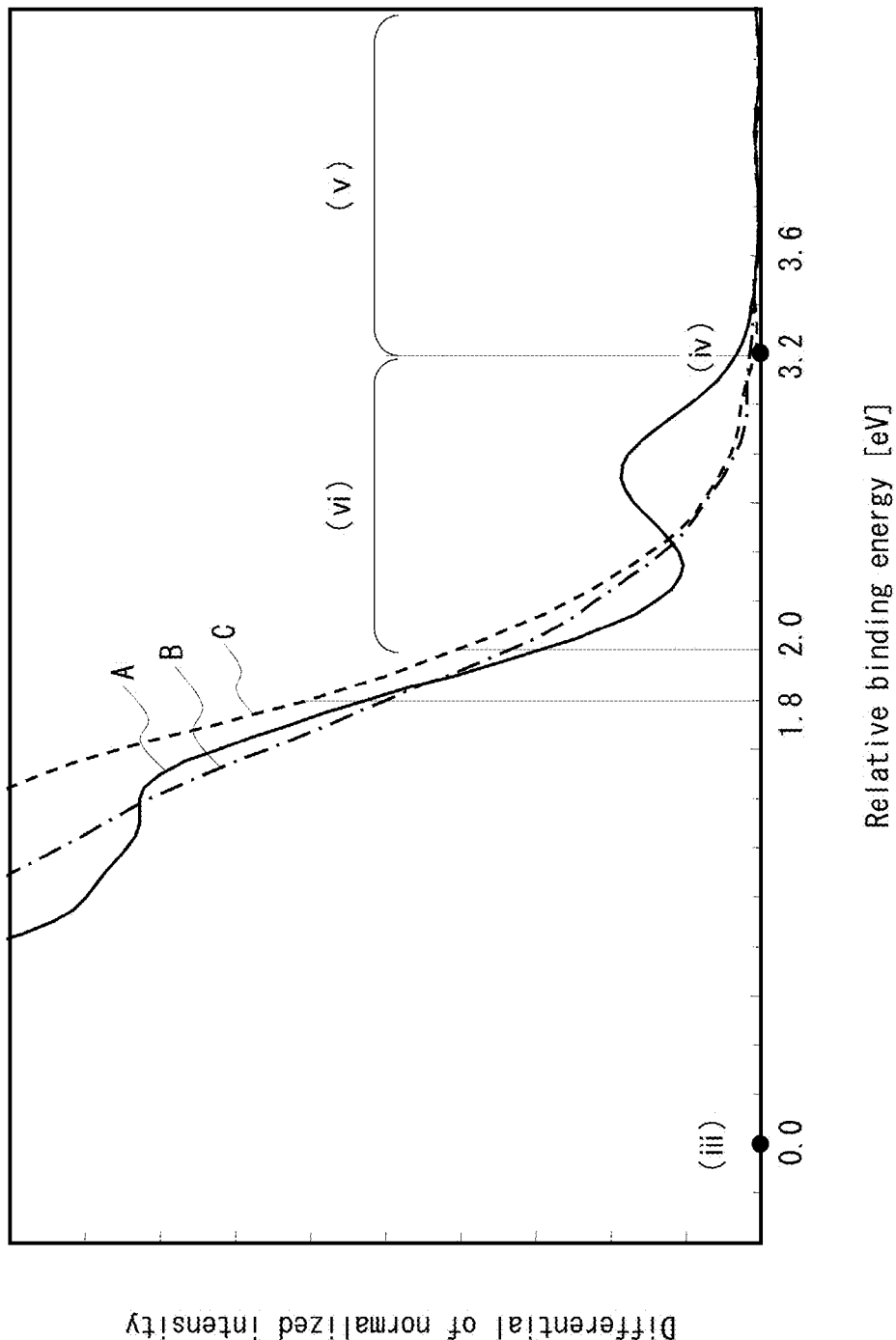
FIG. 10 illustrates differential curves derived from the UPS spectra illustrated in FIG. 9.

FIG. 10 illustrates differential curves yielded as a result of the above processing. Points (iii) and (iv) in FIG. 10 are provided at the same points on the horizontal axis as the respective points (iii) and (iv) in FIG. 9.

According to the differential curves illustrated in FIG. 10, the derivatives of normalized intensities of the tungsten oxide layers 12 corresponding to sample devices B and C do not depart from the vicinity of "0" within an area (v). Area (v) indicates an area which extends from a point which indicates a minimal binding energy that can be measured by using the photoelectron spectroscopy device to point (iv). Furthermore, in an area (vi) extending approximately 1.2 eV in the high binding energy direction from point (iv), the derivatives corresponding to sample devices B and C exhibit only a slight increase as approaching the high binding energy direction, although increase is observed in the increase rates thereof. Here, the shapes of the differential curves corresponding to sample devices B and C within areas (v) and (vi) turn out to exhibit similarity with the respective UPS spectra illustrated in FIG. 9, from which the differential curves of FIG. 10 have been derived. Therefore, it can be said that the shapes of the UPS spectrum and the differential curve derived therefrom of each of sample devices B and C within areas (v) and (vi) resemble the shape of an exponential function curve.

On the other hand, the differential curve for the tungsten oxide layer 12 of sample A exhibits a rapid rise from around point (iv) towards the direction of higher binding energy. Thus, the shape of the differential curve within the areas (v) and (vi) clearly differs from the shape of an exponential function curve. Similarly, in FIG. 9, the spectrum corresponding to the tungsten oxide layer 12 of the sample device A, from which the differential curve in FIG. 10 corresponding to sample device A is derived, begins to protrude in the vicinity of point (iv). At the same time, it could also be seen that the spectrum in FIG. 9 exhibits a spectral protrusion near the Fermi surface, which is not found in a spectrum having the shape of an exponential function curve.

In other words, sample A as described above is characterized in that an occupied energy level near the Fermi surface is found within a binding energy range from approximately 1.8 eV to approximately 3.6 eV lower than the lowest binding energy of the valence band. In particular, the spectral protrusion near the Fermi surface, corresponding to the occupied energy level near the Fermi surface, can be clearly seen in the UPS spectrum in a binding energy range from approximately 2.0 eV to approximately 3.2 eV lower than the lowest binding energy of the valence band.

Figure 11:
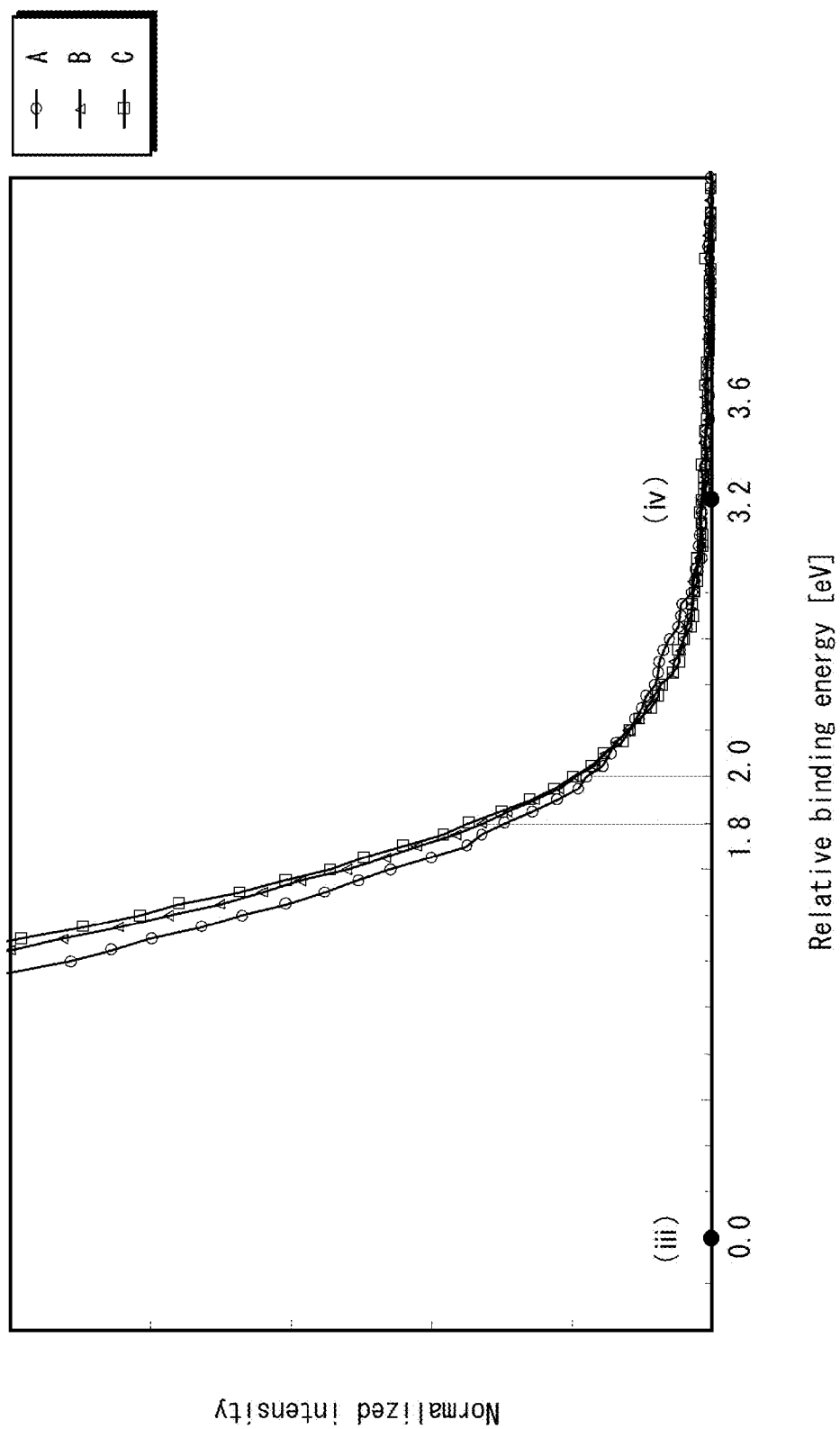
FIG. 11 illustrates UPS spectra of tungsten oxide layers after atmospheric exposure.

Next, the present inventors conducted atmospheric exposure of the tungsten oxide layer 12 of each of the sample devices A, B, and C for a period of one hour at normal temperature. Note that the sample devices A, B, and C are the same sample devices as used in conducting the UPS measurement to obtain the UPS spectra in FIG. 9, and therefore have not been exposed to the atmosphere since the forming of the tungsten oxide layers 12 therein. Following atmospheric exposure, the present inventors conducted UPS measurement once again with respect to the tungsten oxide layer 12 in each of the sample devices A, B, and C. The measurement was conducted focusing on the changes in the UPS spectrum corresponding to each of the sample devices A, B, and C. FIG. 11 illustrates UPS spectra within the above area y. The horizontal axis in FIG. 11 is similar to the horizontal axis in FIG. 9, and points (iii) and (iv) in FIG. 11 are provided at the same points on the horizontal axis as the respective points (iii) and (iv) in FIG. 9.

Based on the UPS spectra illustrated in FIG. 11, the tungsten oxide layer 12 in each of the samples B and C does not exhibit the spectral protrusion near the Fermi surface either before or after atmospheric exposure. Contrariwise, it can be seen that the tungsten oxide layer 12 of the sample device A still exhibits the spectral protrusion near the Fermi surface after atmospheric exposure, although the spectrum differs in intensity and shape compared to before atmospheric exposure. Hence, it is observed that the sample device A retains the same characteristics before and after atmospheric exposure performed for a certain period of time. Therefore, it can be concluded that the sample device A has a certain level of stability with respect to ambient atmosphere.

In the above, description has been provided focusing on the UPS spectra obtained by performing UPS measurement with respect to the sample devices A, B, and C. However, it should be noted that the existence of the spectral protrusion near the Fermi surface is similarly observed in spectra obtained by performing XPS measurement and hard X-ray photoemission spectroscopy measurement.

Figure 12:
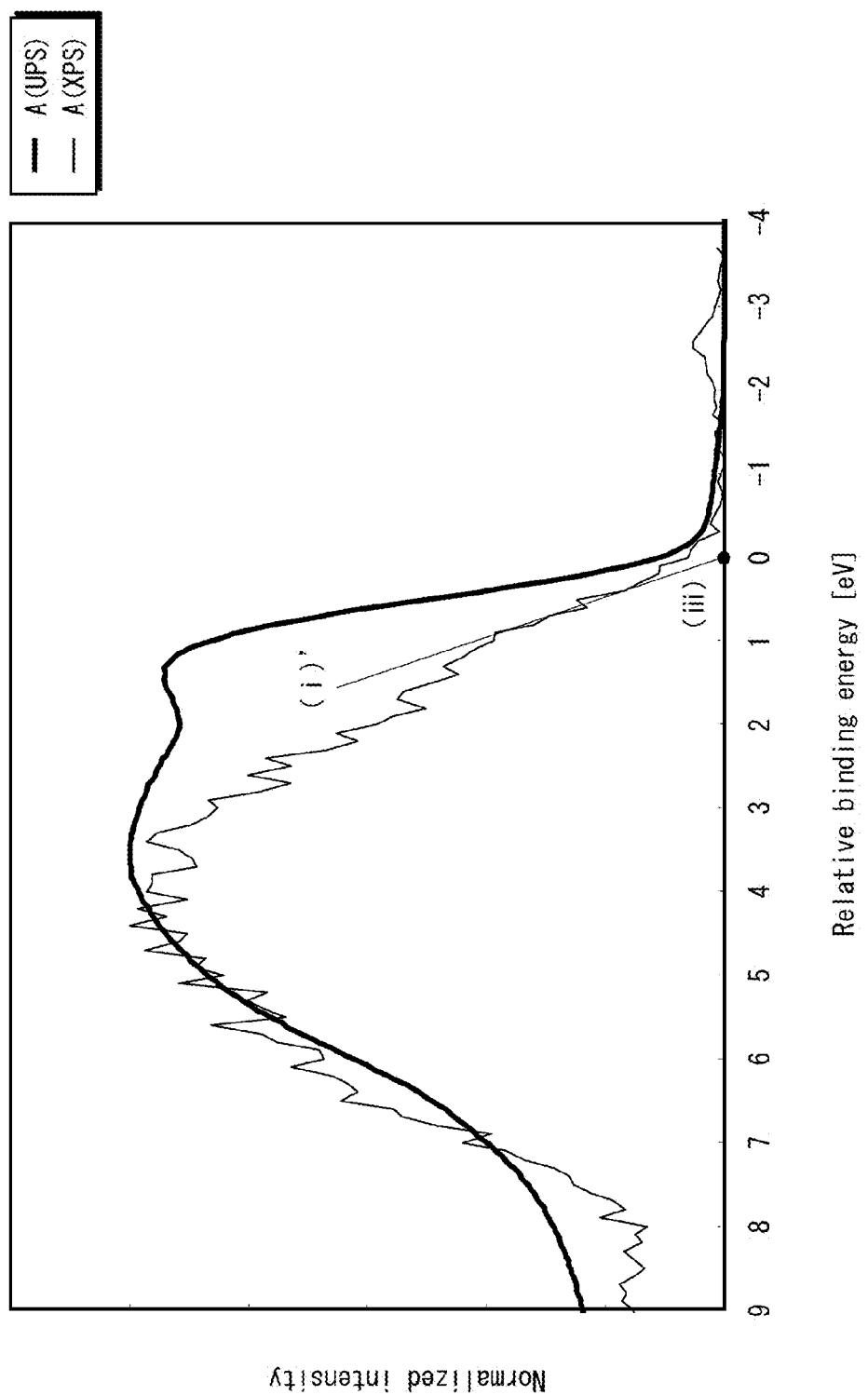
FIG. 12 illustrates a UPS spectrum and an XPS spectrum of a tungsten oxide layer pertaining to the present invention.

FIG. 12 illustrates an XPS spectrum of the tungsten oxide layer 12 in the sample device A after the atmospheric exposure as described above. Note that, in FIG. 12, the XPS spectrum is overlaid with a UPS spectrum of the tungsten oxide layer 12 in the sample device A (the same UPS spectrum as illustrated in FIG. 8), so as to enable comparison between the two spectra.

The conditions under which the XPS measurement was conducted are similar to the above-described conditions under which the UPS measurement was conducted, differing only in that an Al—K alpha line was used as the light source. Also, the interval between measurement points was set to 0.1 eV, differing from the UPS measurement. In FIG. 12, point (iii) is provided at the same point on the horizontal axis as point (iii) in FIG. 8, and further, the horizontal axis indicates a relative binding energy with respect to point (iii), similar as in FIG. 9. In addition, a line in the XPS spectrum corresponding to the line (i) in FIG. 8 is illustrated as line (i)' in FIG. 12.

As illustrated in FIG. 12, the spectral protrusion near the Fermi surface is found in the XPS spectrum of the tungsten oxide layer 12 in the sample A, as well as in the UPS spectrum, as a protrusion of a considerable degree within a binding energy range from approximately 1.8 eV to approximately 3.6 eV lower than the lowest binding energy of the valence band. Further, the spectral protrusion near the Fermi surface was similarly found when the present inventors performed a hard X-ray photoemission spectroscopy measurement with respect to the tungsten oxide layer 12 in the sample A.

In the above, the sample device 1A (illustrated in FIG. 7) was used, instead of the organic EL element 1 which is illustrated in FIG. 1, as the sample device for conducting the photoelectron spectroscopy measurements. The sample device 1A has a structure where the tungsten oxide layer 12 is formed on the conductive silicon substrate 11. Here, it should be noted that this measure has been taken merely for the sake of preventing the occurrence of charge-up during measurement, and thus, the structure of the organic EL element pertaining to the present invention is not to be limited to the structure of the sample device 1A.

According to another experiment conducted by the present inventors, when UPS measurement and XPS measurement were conducted by using sample devices having the structure of the organic EL element 1 illustrated in FIG. 1 (i.e., the structure where the anode 2 made of ITO and the hole injection layer 4 made of tungsten oxide are formed in the stated order on one surface of the substrate 10), the occurrence of charge-up was encountered during the measurement of tungsten oxide layers formed under film forming conditions B and C.

However, when a neutralizing electron gun for cancelling charge-up was used in such measurements, although there were cases where the absolute values of the binding energy indicated by the occupied energy levels of the hole injection layer 4 (for example, the binding energy value when the Fermi surface of the photoelectron spectroscopy device itself is determined as the reference point) differed from that of the tungsten oxide layer 12 of the sample device 1A, a spectrum having a similar shape as the spectrum of the sample device 1A was obtained, at least within a binding energy range extending from the band gap energy level to the lowest binding energy of the valence band.

(Observation on Hole Injection Efficiency from Hole Injection Layer to Functional Layer)

The principle of the effect that the existence of the occupied energy level near the surface in the hole injection layer made of tungsten oxide, observed as a spectral protrusion near the Fermi surface in, for instance, a UPS spectrum of the hole injection layer, has on hole injection efficiency can be explained as provided in the following.

It has been frequently reported, with reference to results of experiments and first principles calculations, that the occupied energy level near the Fermi surface, found in thin films or crystals of tungsten oxide, derives from an oxygen vacancy structure or a similar structure.

More specifically, assumption has been made that the occupied energy level near the Fermi surface derives from a binding orbital formed by 5d orbitals of adjacent tungsten atoms due to an oxygen atom vacancy or from 5d orbitals of single tungsten atoms which are not terminated with an oxygen atom and which exist at the surface or within a tungsten oxide film. Further, assumption has been made that such 5d orbitals, either in semi-occupied state or unoccupied state and when coming in contact with an organic molecule, are capable of pulling an electron off of the HOMO of the organic molecule for mutual stabilization of energetic states.

As a matter of fact, a report has been made that, when a layer composed of α-NPD, which is an organic low molecular material, is layered on a thin film of molybdenum oxide, an electron transfers from the α-NPD molecule to the molybdenum oxide thin film (Non-Patent Literature 2). Note that molybdenum oxide has many physical properties in common with tungsten oxide, such as a catalyst effect, electrochromism, and photochromism.

Meanwhile, the present inventors have made an assumption that, in the case of tungsten oxide, a semi-occupied 5d orbital of a single tungsten atom, which is lower in terms of binding energy than a binding orbital of 5d orbitals of adjacent tungsten atoms, or a structure similar to such a semi-occupied 5d orbital corresponds to the occupied energy level near the Fermi surface.

Figure 13:
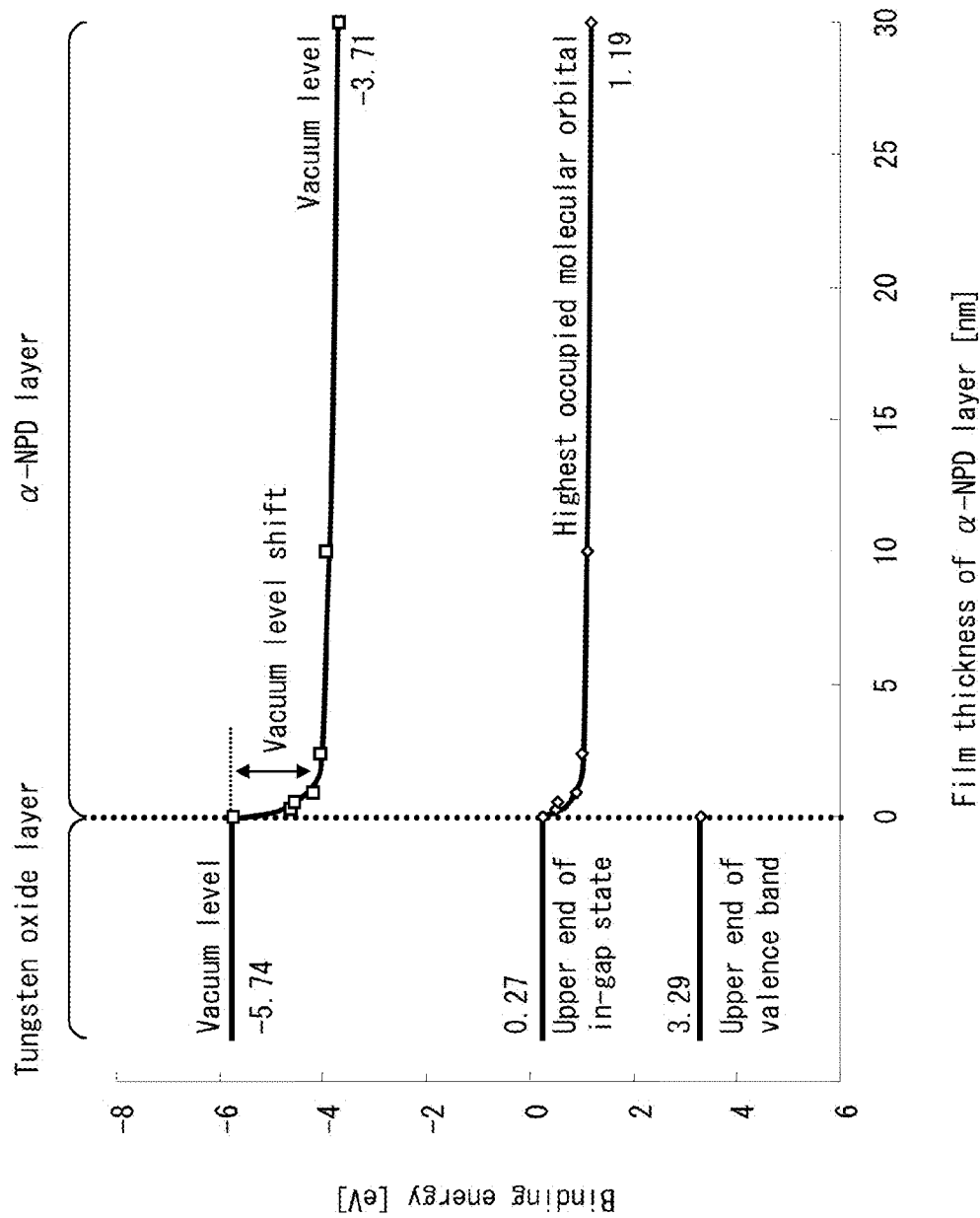
FIG. 13 illustrates an energetic state at an interface between the tungsten oxide layer pertaining to the present invention and an α-NPD layer.

FIG. 13 illustrates an energetic state at an interface between a tungsten oxide layer that has the occupied energy level near the Fermi surface pertaining to the present invention, and an α-NPD layer.

First of all, FIG. 13 illustrates the lowest binding energy of the valence band (the "upper end of the valence band" in FIG. 13) of the tungsten oxide layer (corresponding to the hole injection layer), and the lowest binding energy of the occupied energy level near the Fermi surface of the tungsten oxide layer, corresponding to the point at which the spectral protrusion near the Fermi surface begins to rise (the "upper end of the in-gap state" in FIG. 13). In the UPS spectrum, the upper end of the valence band corresponds to point (iii) in FIG. 8, and the upper end of the in-gap state corresponds to point (iv) in FIG. 9.

In addition, FIG. 13 illustrates the relation between the tungsten oxide layer and the α-NPD layer (corresponding to a functional layer) when the α-NPD layer is layered on the tungsten oxide layer. Specifically, to illustrate such a relation, illustration is provided of a thickness of the α-NPD layer, a binding energy of the HOMO of the α-NPD, and a vacuum level of the α-NPD layer. Here, the binding energy of the HOMO of the α-NPD layer corresponds to a binding energy in a UPS spectrum of the α-NPD layer at a point at which a peak of binding energy corresponding to the HOMO begins. In other words, the binding energy of the HOMO is the lowest binding energy of the HOMO of the α-NPD.

More specifically, the energy diagram illustrated in FIG. 13 is obtained through repeated alternate execution of the UPS measurement and ultra high vacuum vapor deposition, where the tungsten oxide layer, which is formed on an ITO substrate, is transferred back and forth between a photoelectron spectroscopy device and a ultra high vacuum vapor deposition device connected to the photoelectron spectroscopy device. Since the occurrence of charge-up was not encountered during the UPS measurement, the binding energy on the vertical axis in FIG. 13 is indicated as an absolute value taken with respect to a reference point, which is the Fermi level of the ITO substrate.

FIG. 13 shows that, at least within a range of 0 nm to 0.3 nm from the surface of the α-NPD layer, i.e. in a vicinity of the interface between the tungsten oxide layer and the α-NPD layer, the upper end of the in-gap state of the tungsten oxide layer and the HOMO of the α-NPD layer approximately equal one another in terms of binding energy. In other words, the energy levels are in a state of alignment (the state described above as the "interface energy level alignment"). Here, it should be noted that the state of being "approximately equal" as referred to above actually includes a state where a slight difference exists between the binding energies of the two layers, and denotes a range of ±0.3 eV inclusive, to be specific.

Further, FIG. 13 shows that the interface energy level alignment is formed as a result of interaction between the tungsten oxide and the α-NPD, and not by mere coincidence.

For instance, the change in vacuum level (vacuum level shift) of the α-NPD observed at the interface between the tungsten oxide layer and the α-NPD layer indicates that an electrical double layer (EDL) is formed at the interface. Considering the direction of the vacuum level shift, the EDL is formed to be negative in the direction of the tungsten oxide layer and positive in the direction of the α-NPD layer. In addition, since the magnitude of the vacuum level shift is considerably large being near 2 eV, it is reasonably assumed that the EDL has been formed not due to physical adsorption or the like, but rather as a result of a chemical bond or a similar effect. That is, there is enough evidence to assume that the interface energy level alignment as mentioned above has been formed as a result of interaction between the tungsten oxide and the α-NPD.

Specifically, the present inventors assume that the interaction is caused by a mechanism as described in the following.

First of all, as described above, the occupied energy level near the Fermi surface derives from the 5d orbital of a tungsten atom, which forms an oxygen vacancy structure or a similar structure. In the following, the 5d orbital of the tungsten atom is referred to as a "W5d orbital corresponding to the spectral protrusion".

When the HOMO of the α-NPD molecule approaches the W5d orbital corresponding to the spectral protrusion at the surface of the tungsten oxide layer, an electron transfers from the HOMO of the α-NPD molecule to the W5d orbital corresponding to the spectral protrusion for the mutual stabilization of energetic states. Hence, an EDL is formed at the interface, thus causing the vacuum level shift as seen in FIG. 13 and the interface energy level alignment.

More specifically, many reports have been made, as a result of first principles calculations, that the electron density of the HOMO of an organic amine-containing molecule, such as α-NPD, typically exhibits a distribution biased towards a nitrogen atom in the amine structure, and that the main component of the HOMO of an organic amine-containing molecule is a lone pair of electrons of the nitrogen atom. Assumption is therefore made that, particularly, at the interface between the tungsten oxide layer and a layer of an organic amine-containing molecule, an electron transfers from the lone pair of electrons of the nitrogen atom in the amine structure of the amine-containing molecule to the W5d orbital corresponding to the spectral protrusion.

This assumption is supported by reports made of an interface energy level alignment, similar to the interface energy level alignment between the tungsten oxide layer and the α-NPD layer illustrated in FIG. 13, being formed at an interface between a vapor deposition film of molybdenum oxide, which has a physical property similar to tungsten oxide as described above, and α-NPD or F8BT (refer to Non-Patent Literatures 3, 4, and 5).

The excellent hole injection efficiency, with respect to the one or more functional layers, of the hole injection layer of the organic EL element pertaining to the present invention is explained by the interface energy level alignment as described above. That is, an interface energy level alignment is formed between the hole injection layer made of tungsten oxide that has the occupied energy level near the Fermi surface, and the adjacent one of the one or more functional layers. As a result, the binding energy at the point at which the occupied energy level near the Fermi surface begins to rise and the binding energy at the point at which the HOMO of the adjacent one of the one or more functional layers begins to rise approximately equal one another. Further, the injection of holes takes place between such energy levels having the interface energy level alignment formed therebetween. Therefore, according to the present invention, the hole injection barrier between the hole injection layer and the adjacent one of the one or more functional layers is reduced to a nearly-nonexistent level.

Meanwhile, it is quite unlikely, in reality, that tungsten oxide exists that does not include at all an oxygen vacancy structure or a similar structure, which forms the occupied energy level near the Fermi surface. That is, it can be reasonably assumed that, for example, even in such tungsten oxide as used to prepare each of the above-mentioned sample devices B and C, whose photoelectron spectroscopy spectrum does not exhibit the spectral protrusion near the Fermi surface, an oxygen vacancy structure or a similar structure is present, however minimal they may be in terms of number.

In view of the above, explanation is provided hereinafter with reference to FIGS. 14A and 14B, of why the hole-only element HOD-A and the organic EL element BPD-A, both having a hole injection layer 4 corresponding to the tungsten oxide layer 12 of the sample device A, exhibit particularly excellent hole injection efficiency as observed through the above experiments.

When disposing a functional layer on a tungsten oxide layer, for the interaction between the HOMO of the organic molecule composing the functional layer and the occupied energy level near the Fermi surface of the tungsten oxide layer to be triggered, a portion of the organic molecule where the electron density of the HOMO is high and an oxygen vacancy structure or a similar structure at the surface of the tungsten oxide layer must approach (i.e. contact) each other to a certain distance at the interface between the layers. The above-described portion of the organic molecule is, for instance, a nitrogen atom in the amine structure of an organic amine-containing molecule, and is illustrated as "injection site y" in FIG. 14A. Further, an oxygen vacancy structure or a similar structure on the surface of the tungsten oxide layer is illustrated as "injection site x" in FIG. 14A.

Figure 14A:
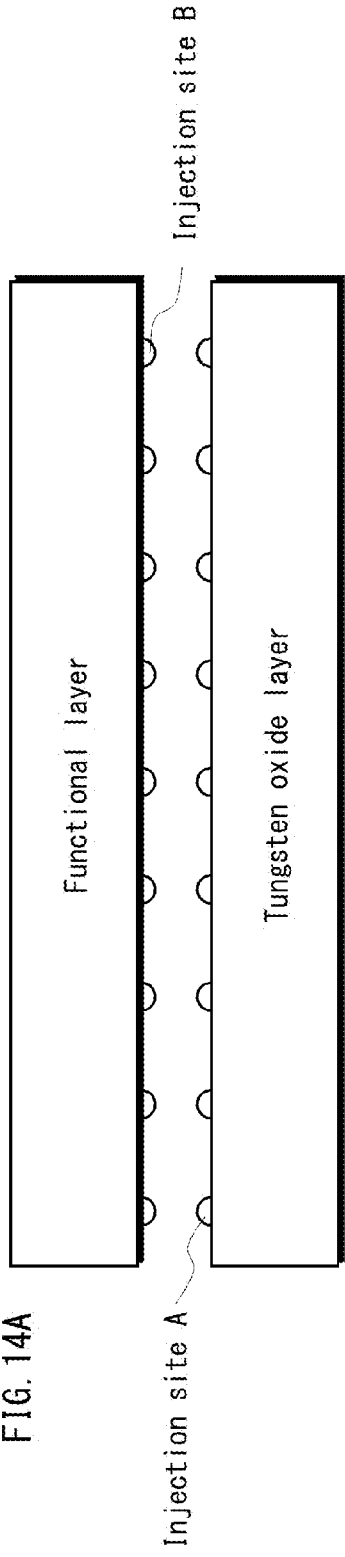
FIGS. 14A and 14B explain the effects of injection sites of a hole injection layer and a functional layer.
Figure 14B:
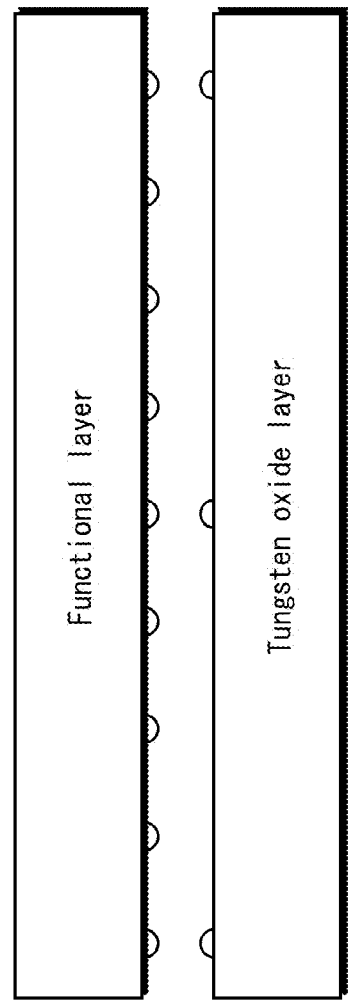

However, in a tungsten oxide layer as incorporated in the samples B and C, the number density of injection sites x, if any, is extremely small, as illustrated in FIG. 14B, and it is for this reason that the upward protrusion near the Fermi surface does not appear in the UPS spectrum thereof. Thus, the possibility of the injection sites y and the injection sites x coming into contact is extremely low. Since the injection of holes takes place where the injection sites x and the injection sites y come into contact, it is clear that hole injection efficiency in samples B and C is extremely low.

In contrast to this, an abundance of injection sites y exists in a tungsten oxide layer that exhibits the spectral protrusion near the Fermi surface such as the tungsten oxide layer incorporated in the above-mentioned sample device A, as illustrated in FIG. 14A. Thus, there is a high possibility of the injection sites y and the injection sites x coming into contact, and thus it is clear that the hole injection efficiency from the hole injection layer to the functional layer is high when using such a tungsten oxide layer.

To further substantiate the observations made thus far, the energy diagram at the interface with the α-NPD layer was also measured, as in FIG. 13, for the tungsten oxide layer formed under film forming conditions C, in which no protrusion near the Fermi surface was observed at all.

Figure 15:
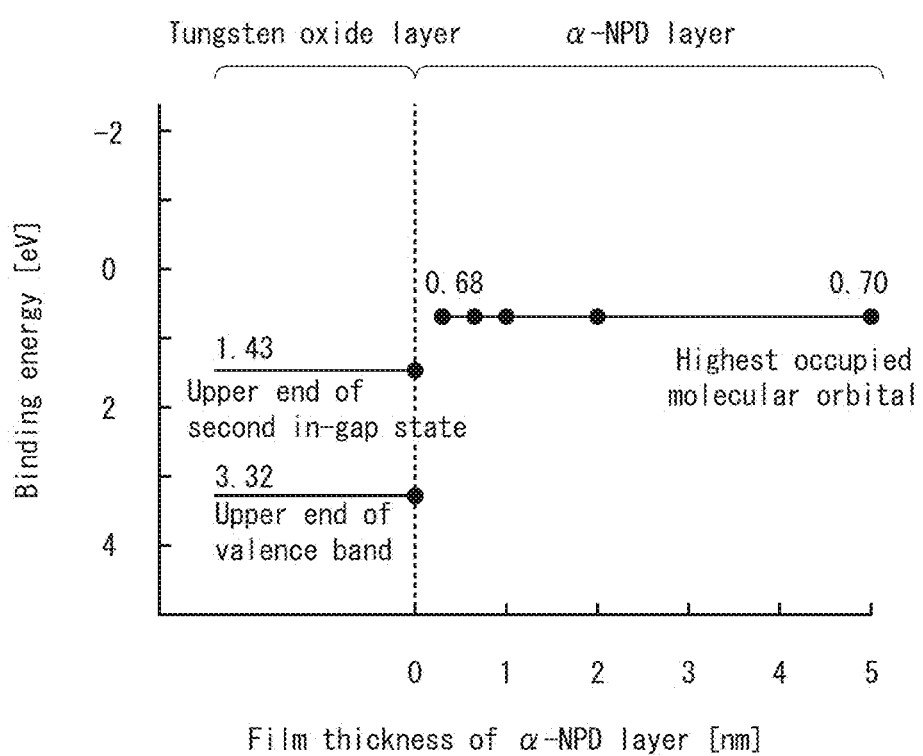
FIG. 15 illustrates an energetic state at an interface between a tungsten oxide layer formed under film forming conditions C and the α-NPD layer.

FIG. 15 shows the results. As described above, the upper end of the in-gap state of the tungsten oxide layer, which corresponds to the spectral protrusion near the Fermi surface, was not observed at all in the tungsten oxide layer formed under film forming conditions C. Accordingly, as a candidate for another energy level used in hole injection, FIG. 15 shows the point at which a structure ((z) in FIG. 8) different from the spectral protrusion rises (the "upper end of second in-gap state"). In the UPS spectrum, this point is observed in the higher binding energy direction than the location of the spectral protrusion near the Fermi surface. FIG. 15 also shows the upper end of the valence band of the tungsten oxide layer.

However, differing completely from FIG. 13, the HOMO of the α-NPD in FIG. 15 approaches neither the upper end of the second in-gap state nor the upper end of the valence band. In other words, the interface energy level alignment is not formed at all. This means that the second in-gap state nor the valence band hardly interacts with the HOMO of the α-NPD. Further, even if holes can be injected from the upper end of the second in-gap state to the HOMO of the α-NPD, the injection barrier is 0.75 eV and is an extremely large value compared to the case in FIG. 13, where the injection barrier is nearly zero.

Assumption is made that this difference in injection barrier greatly affects the driving voltage and the light-emission efficiency of the hole-only devices 1B and the organic EL elements 1 corresponding to the different film forming conditions. Specifically, the differences in characteristics between the hole-only devices 1B of the different film forming conditions A, B, and C and between the organic EL elements 1 of the different film forming conditions A, B, and C strongly suggest that the organic EL element pertaining to the present invention has excellent hole injection efficiency from the hole injection layer to the functional layer.

When summarizing the above, the excellent hole injection efficiency of the organic EL element pertaining to the present invention is explained as follows.

First, in the organic EL element pertaining to the present invention, the hole injection layer made of tungsten oxide exhibits, in the photoelectron spectroscopy spectrum thereof, the spectral protrusion near the Fermi surface. The existence of the spectral protrusion near the Fermi surface indicates that a considerable number of oxygen vacancy structures or similar structures, as well as occupied energy levels near the Fermi surface deriving from such structures, exist at the surface of the hole injection layer.

The occupied energy level near the Fermi surface pulls an electron off from the organic molecule composing one of the one or more functional layers adjacent to the hole injection layer. As a result, the occupied energy level near the Fermi surface forms the interface energy level alignment with the HOMO of the organic molecule.

As such, if a considerable number of oxygen vacancy structures or similar structures are present at the surface of the hole injection layer, the possibility increases of the occupied energy level near the Fermi surface and a portion of the organic molecule where the electron density of the HOMO is high coming into contact with each other. Thus, the hole injection layer pertaining to the present invention efficiently forms the interface energy level alignment with the adjacent one of the one or more functional layers, and accordingly, excellent hole injection efficiency from the hole injection layer to the adjacent one of the one or more functional layers is achieved.

(Relation Between Film Thickness Reduction of Tungsten Oxide Layer and Hole Injection Characteristics, Driving Voltage, Etc.)

In the organic EL element 1 pertaining to the present invention, the hole injection layer 4 is yielded by firing the tungsten oxide film immediately after forming the tungsten oxide film under the predetermined film forming conditions. The firing process is performed to apply heat and thereby densify the tungsten oxide film. Due to this, the hole injection layer 4, at the same as retaining the hole injection characteristics as described above even after the firing process, is provided with increased dissolution resistance to the etching solution, the cleaning liquid, etc., used in the bank forming process.

Figure 16:
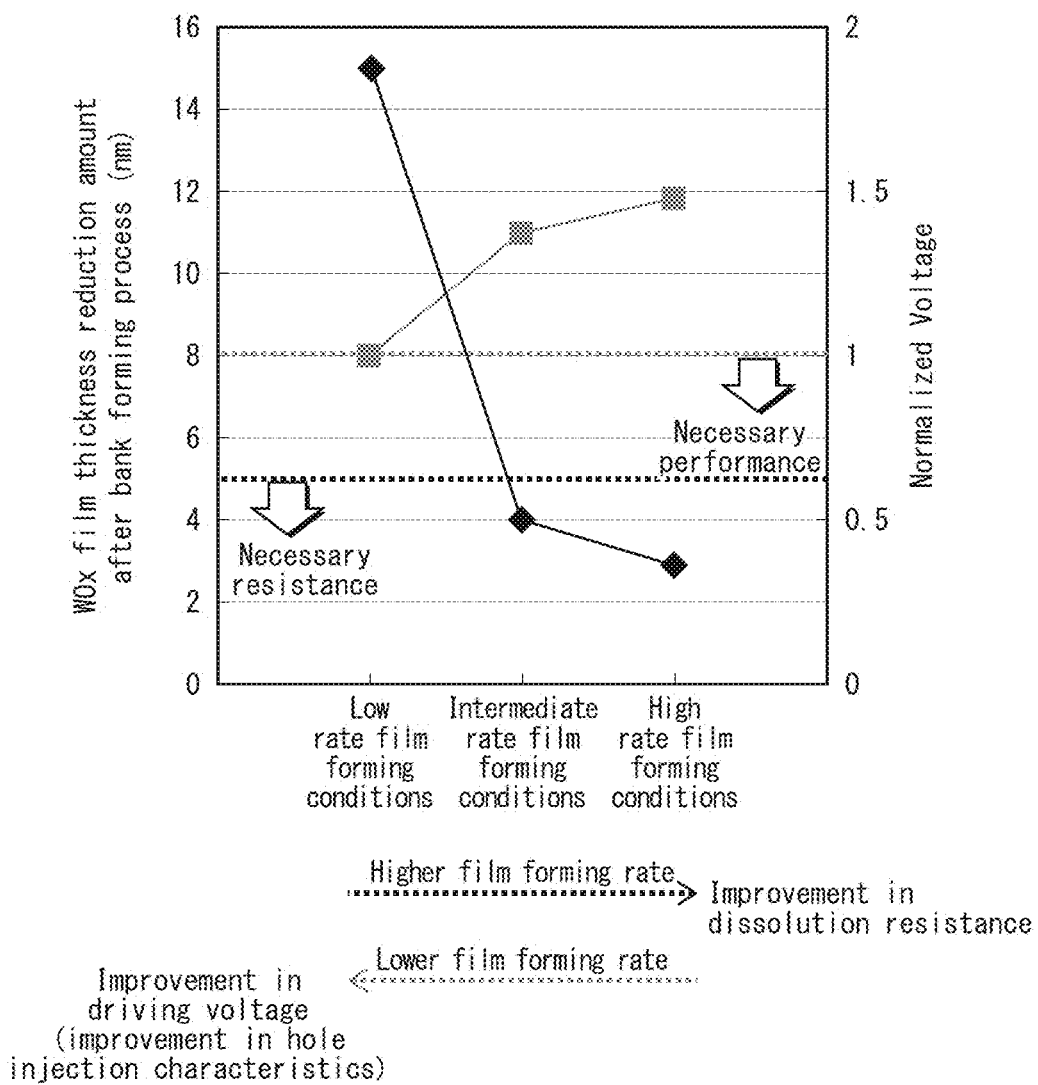
FIG. 16 is a graph illustrating the relation between film thickness reduction amounts and driving voltages, for different film forming rates when forming tungsten oxide films.

FIG. 16 is a graph illustrating the relation between driving voltages (normalized driving voltages) and the dissolution resistance of tungsten oxide (WOx) films formed under different film forming rates. Here, the dissolution resistance indicates the dissolution resistance that the tungsten oxide film exhibits when the etching solution (TMAH solution) is dropped on the tungsten oxide film immediately after the forming thereof. Here, note that in this experiment, the firing of the tungsten oxide film was not performed, and thus, control is performed of the film density of the tungsten oxide film solely by using different film forming rates, namely a "low rate", an "intermediate rate", and a "high rate". In specific, the three film forming rates correspond to the respective conditions provided in the following.

Low rate: Power density=1.4 W/cm$^2$; Ar/O$_2$ ratio in film forming atmosphere=100:100

Intermediate rate: Power density=2.8 W/cm$^2$; Ar/O$_2$ ratio in film forming atmosphere=100:43

High rate: Power density=5.6 W/cm$^2$; Ar/O$_2$ ratio in film forming atmosphere=100:43

Further, for the sake of assessment, the necessary dissolution resistance of the tungsten oxide film with respect to film thickness reduction was set, for example, such that when the film thickness reduction amount of the tungsten oxide film is no greater than half the film thickness of the tungsten oxide layer immediately after the forming thereof (14 nm), the tungsten oxide film has the necessary dissolution resistance. More specifically, the tungsten oxide film is considered as having the necessary dissolution resistance when the film thickness reduction amount is no greater than 7 nm, in this example. In addition, the necessary performance level of the tungsten oxide film in terms of driving voltage (normalized driving voltage) was set, for example, such that the tungsten oxide layer has the necessary performance level when the driving voltage thereof is no greater than 1.

As shown by the graph in FIG. 16, as the film forming rate becomes a higher rate, the film thickness reduction amount of the tungsten oxide film in the bank forming process decreases due to the dissolution resistance increasing, while the driving voltage increases. Contrariwise, as the film forming rate becomes a lower rate, the film thickness reduction amount of the tungsten oxide film increases due to the dissolution resistance decreasing, while the driving voltage decreases (improves). Here, it should be noted that when forming the tungsten oxide film at the low rate, the film thickness reduction amount increases and thus it becomes difficult to ensure that the resultant hole injection layer has uniform film thickness over the entirety of a light-emission area. As such, the low rate poses a risk of such problems as light-emission unevenness, etc., of the hole injection layer.

As described above, there is a trade-off relation between the film thickness reduction amount of the tungsten oxide film (indicated by line connecting rhombuses) and driving voltage (indicated by the line connecting squares), in terms of the film density of the tungsten oxide film. That is, it is observed that the film thickness reduction amount of the tungsten oxide film decreases as the film density of the tungsten oxide film increases.

Subsequently, the present inventors assessed the characteristics of tungsten oxide films formed under different film forming conditions and subjected to the firing processing after the forming thereof. Specifically, the present inventors prepared a plurality of samples of organic EL panels each having a plurality of organic EL elements formed therein (samples No. 1 through No. 7). Here, the hole injection layer in each of the samples was formed under film forming/firing conditions (conditions changed including: film forming atmosphere, power density, film forming device used, and performance/non-performance of the firing process after the forming of the tungsten oxide film) differing from the film forming/firing conditions under which a hole injection layer in a different one of the samples was formed. Having formed such samples, the present inventors measured the film thickness of the hole injection layer in each of the samples at two areas, namely at a center area of the sample panel and at a peripheral area of the sample panel. Further, the present inventors assessed the samples in terms of: (i) film density of the tungsten oxide film; (ii) film thickness reduction amount of the tungsten oxide film; (iii) device characteristics (driving voltage); (iv) dissolution resistance of the tungsten oxide film (resistance against the etching solution and the cleaning liquid used in the bank forming process, also referred to as BNK resistance in the following); and (v) total performance (overall assessment including device characteristics and dissolution resistance). The measurement of the dissolution resistance of the tungsten oxide film was performed by performing the resist forming/removing process described in the following in place of the bank forming process as a similar process. Specifically, the resist forming/removing process was performed by, after forming the tungsten oxide film in each of the samples, applying resist (TFR-940 produced by Tokyo Ohka Kogyo Co., LTD.) by spin-coating under a condition of 2500 rpm/25 sec. Following the application of resist, baking was performed at a temperature of 100° C. and for a 90 second period, followed by developing by using a developer (TMAH solution) having a concentration of 2.38%. Further, cleaning was performed for a 60 second period by using water. The resist so formed was removed by using acetone.

Specifically, the assessment of dissolution resistance was performed such that when the film thickness reduction amount of a tungsten oxide film in the resist forming/removing process was no greater than half the film thickness of the tungsten oxide film immediately after the forming thereof, the tungsten oxide film was assessed as being desirable, whereas when the film thickness reduction amount was greater than half the film thickness of the tungsten oxide film immediately after the forming thereof, the tungsten oxide film was assessed as being undesirable.

The assessment of device characteristics was performed such that when the driving voltage of a sample indicated a predetermined voltage value sufficient to realize performance at least equivalent to that of an LCD, the sample was assessed as being desirable, whereas when the driving voltage of a sample indicated a greater value than the predetermined voltage value, the sample was assessed as being undesirable.

Table 5 shows the film forming/firing conditions, the measurement results, and the assessment results. Note that here, samples 4 and 5 are those samples achieved through implementation of the film forming/firing conditions in embodiment 1.

TABLE 5

| WOx Film Forming Conditions and Film Thickness Reduction Amount | | | | | | | |
|---|---|---|---|---|---|---|---|
| Ar:O$_2$ | 100:100 | 100:100 | 100:100 | 100:100 | 100:100 | 100:43 | 100:43 |
| Power Density (W/cm$^2$) | 1.4 | 1.4 | 1.4 | 1.4 | 1.4 | 2.8 | 5.6 |
| WOx Firing Process | Not Performed | Not Performed | Not Performed | Performed | Performed | Not Performed | Not Performed |
| Film Forming Device | Large-sized | Large-sized | Large-sized | Large-sized | Large-sized | Small-sized | Small-sized |
| Panel Surface Measurement Position | Center | Center | Edge | Center | Edge | — | — |
| Film Density (g/cm$^3$) | 5.43 | 5.65 | 5.73 | 5.9 | 6.0 | 6.09 | 6.33 |
| Film Thickness Reduction Amount (nm) | 15 | 9.8 | 8 | 4.6 | 4 | 4 | 2.9 |
| Device Characteristics | Satisfactory | — | Satisfactory | — | Satisfactory | Unsatisfactory | Poor |
| BNK Resistance | Poor | Poor | Poor | Satisfactory | Satisfactory | Satisfactory | Satisfactory |
| Total Performance | Poor | Poor | Poor | Excellent | Excellent | Poor | Poor |
| Notes | Results upon Initial Introduction of Device | | Data after Stable Operation of Device | | | | |

Temperature: Room Temperature/Resist: tok(TFR-940)/Spin-coating: 2500 rpm for 25 sec/Baking: 100° C. for 90 sec
Conditions: Developing Solution 2.38%/Developing for 60 sec + Washing with Water for 60 sec/Resist Removal: Acetone The results in Table 5 show that samples No. 6 an No. 7, for which the power density was set relatively high and thus the film forming rate was set to a higher rate, have high film density and thus desirable BNK resistance, but undesirable device characteristics. Accordingly, samples No. 6 and No. 7 were assessed as having undesirable total performance. Here, note that when forming samples No. 6 and No. 7, the firing process was not performed since it was confirmed that the tungsten oxide films therein already had high dissolution resistance immediately after the forming thereof. As described above, samples No. 6 and No. 7 had undesirable device characteristics. The present inventors conducted another consideration and made an assumption that when tungsten oxide films are formed with the film forming rate set to a higher rate, it becomes less likely that tungsten atoms with a valence of five are formed in the tungsten oxide, which results in the tungsten oxide films having almost no oxygen vacancy structures generated therein (i.e., all tungsten atoms in the tungsten oxide films are tungsten atoms with a valence of six) and thus the device characteristics of the samples including such tungsten oxide films being relatively low.

On the other hand, in each of samples No. 1 through No. 3, for which the power density was set relatively low and the firing process was not performed, a relatively large number of tungsten atoms having a valence of five were generated in the tungsten oxide film due to film forming being performed at the low rate, and thus, oxygen vacancy structures were formed in the film. Due to this, such samples have desirable hole injection characteristics to some extent. However, the film thickness reduction amount in each of such samples is relatively high due to the tungsten oxide film having undesirable BNK resistance. As such, a decrease in total performance is observed in such samples.

In contrast to the samples described above, in each of samples No. 4 and No. 5, for which the power density was set relatively low (i.e., the film forming rate was set to the low rate) and the firing process was performed, tungsten atoms of the valence of five, and thus oxygen vacancy structures were formed in the tungsten oxide film. Thus, such samples exhibit excellent device characteristics, and at the same time have excellent BNK resistance due to the film density of the tungsten oxide layer therein being improved. Hence, samples No. 4 and No. 5 were assessed as having excellent total performance. The above results confirm the effectiveness of the predetermined film forming conditions and the firing process described in the examples of implementation described in embodiment 1.

Figure 17:
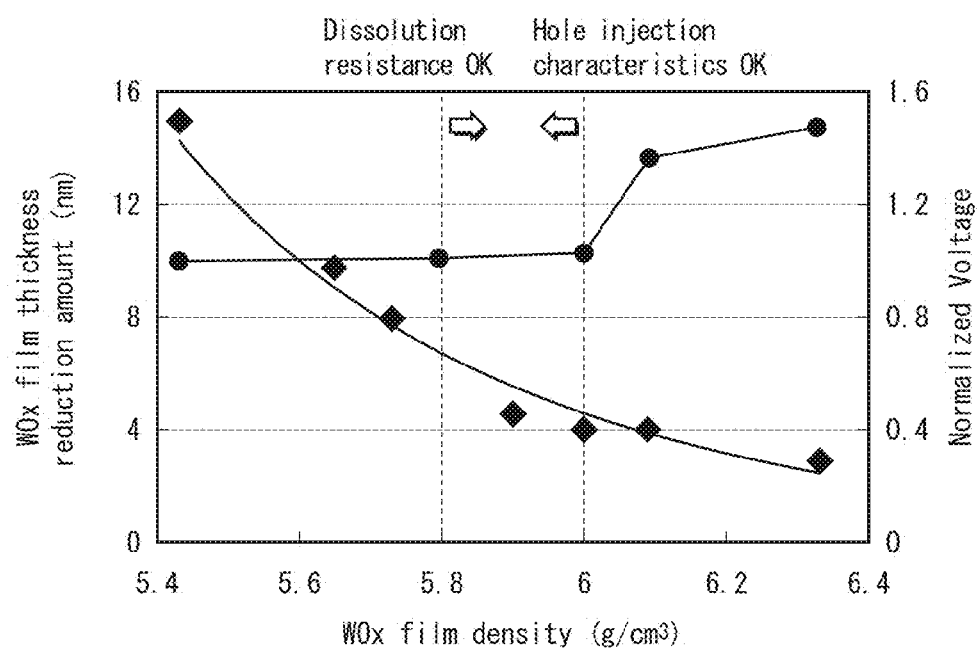
FIG. 17 is a graph illustrating the relation between WOx film thickness reduction amounts and driving voltages, for different film densities of tungsten oxide films.

FIG. 17 is a graph illustrating the relation between film thickness reduction amounts (indicated by the line connecting rhombuses) and driving voltages (indicated by the line connecting circular dots) for different film thicknesses of tungsten oxide (WOx) films. Here, note that in this experiment, the firing of the tungsten oxide film was not performed, and thus, control is performed of the film density of the tungsten oxide film solely by using different film forming rates.

As illustrated in FIG. 17, the driving voltage of the tungsten oxide film rapidly increases when the film density exceeds approximately 6 $g/cm^3$. This is assumed to be since the oxygen vacancy structures in the tungsten oxide film disappear and thus the occupied energy level near the Fermi surface in the tungsten oxide film also disappears, due to the increase in film density. Meanwhile, the film density needs to be approximately at least 5.8 $g/cm^3$ in order to limit the film thickness reduction amount to no greater than 7 nm. Further, in the graph illustrated in FIG. 17, there is a possibility of an inflection point existing near the film density of 5.8 g/cm3, which corresponds to a point in the graph at which a line connecting the measurement points corresponding to film thickness reduction amounts lower than or equal to approximately 5.7 $g/cm^3$ and a line connecting the measurement points corresponding to film thickness reduction amounts higher than or equal to 5.9 $g/cm^3$ intersect each other. Taking the above into consideration, assumption is made that as the film density of the tungsten oxide film, a film density within the range of at least 5.8 $g/cm^3$ and at most 6.0 $g/cm^3$ is appropriate.

Figure 18:
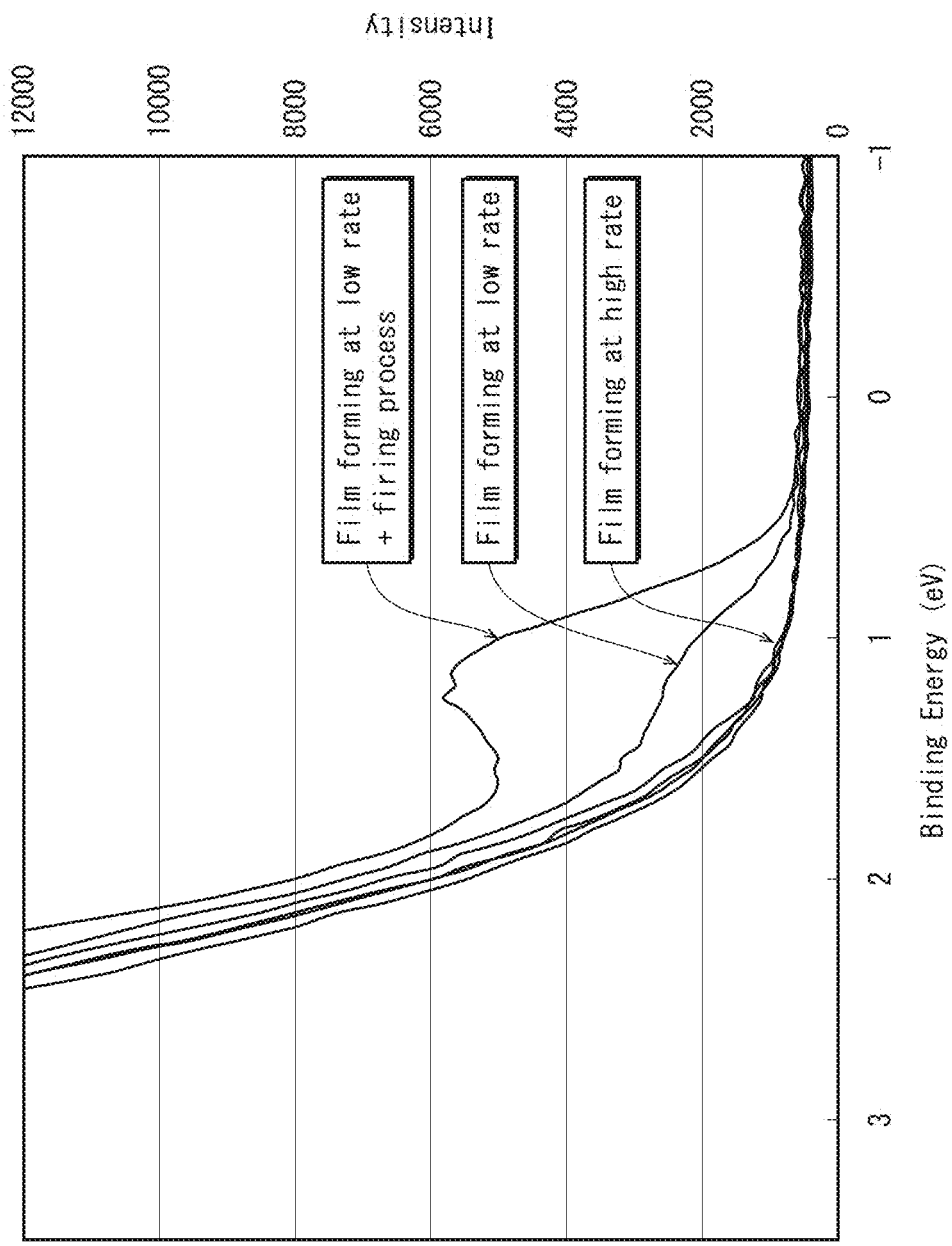
FIG. 18 is a graph comparing UPS spectra of tungsten oxide films formed according to different film forming conditions.

FIG. 18 is a diagram illustrating a UPS spectrum of a tungsten oxide film formed at the low rate, a UPS spectrum of a tungsten oxide film formed at the low rate and later subjected to the firing processing (i.e., corresponding to the hole injection layer 4), and a UPS spectrum of a tungsten oxide film formed at the high rate, overlaid one on top of another.

As illustrated in FIG. 18, the UPS spectrum of the tungsten oxide film formed at the high rate does not have the spectral protrusion near the Fermi surface, which indicates that the occupied energy level near the Fermi surface rarely exists in the tungsten oxide film.

On the other hand, the UPS spectrum of the tungsten oxide film formed at the low rate has the spectral protrusion near the Fermi surface similar as in FIG. 9, which indicates that the occupied energy level near the surface exists in the tungsten oxide film.

Further, when turning to the UPS spectrum of the tungsten oxide film formed at the low rate and later subjected to the firing processing, the spectrum indicates that the occupied energy level near the Fermi surface exists in the tungsten oxide film.

As such, it is confirmed that the hole injection layer 4, even when the firing process is performed, retains the occupied energy level near the Fermi surface at an excellent state.

Figure 19:
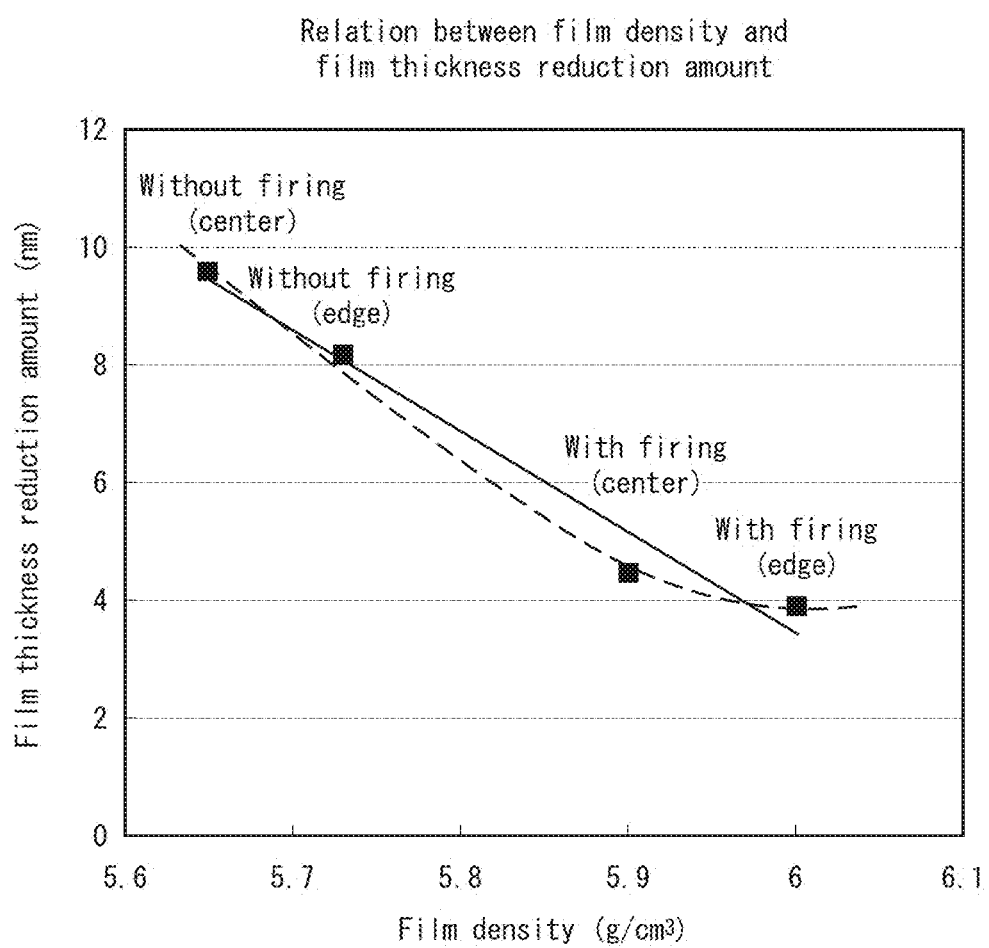
FIG. 19 is a graph illustrating the relation between film densities and film thickness reduction amounts for different tungsten oxide films.

FIG. 19 illustrates the relation between film densities and the film thickness reduction amounts for different tungsten oxide films. In this measurement, organic EL panels each having a plurality of organic EL elements formed therein were used. Further, in the graph in FIG. 19, "center" indicates an organic EL element near the center area of the panel, and "edge" indicates an organic EL element near a peripheral area of the panel.

It is confirmed from the results shown in FIG. 19 that the film density of the tungsten oxide film increases when the firing process is performed compared to when the firing processing is not performed, and as the film density increases, the film thickness reduction amount decreases at both the center area of the panel and the peripheral area of the panel.

Figure 20:
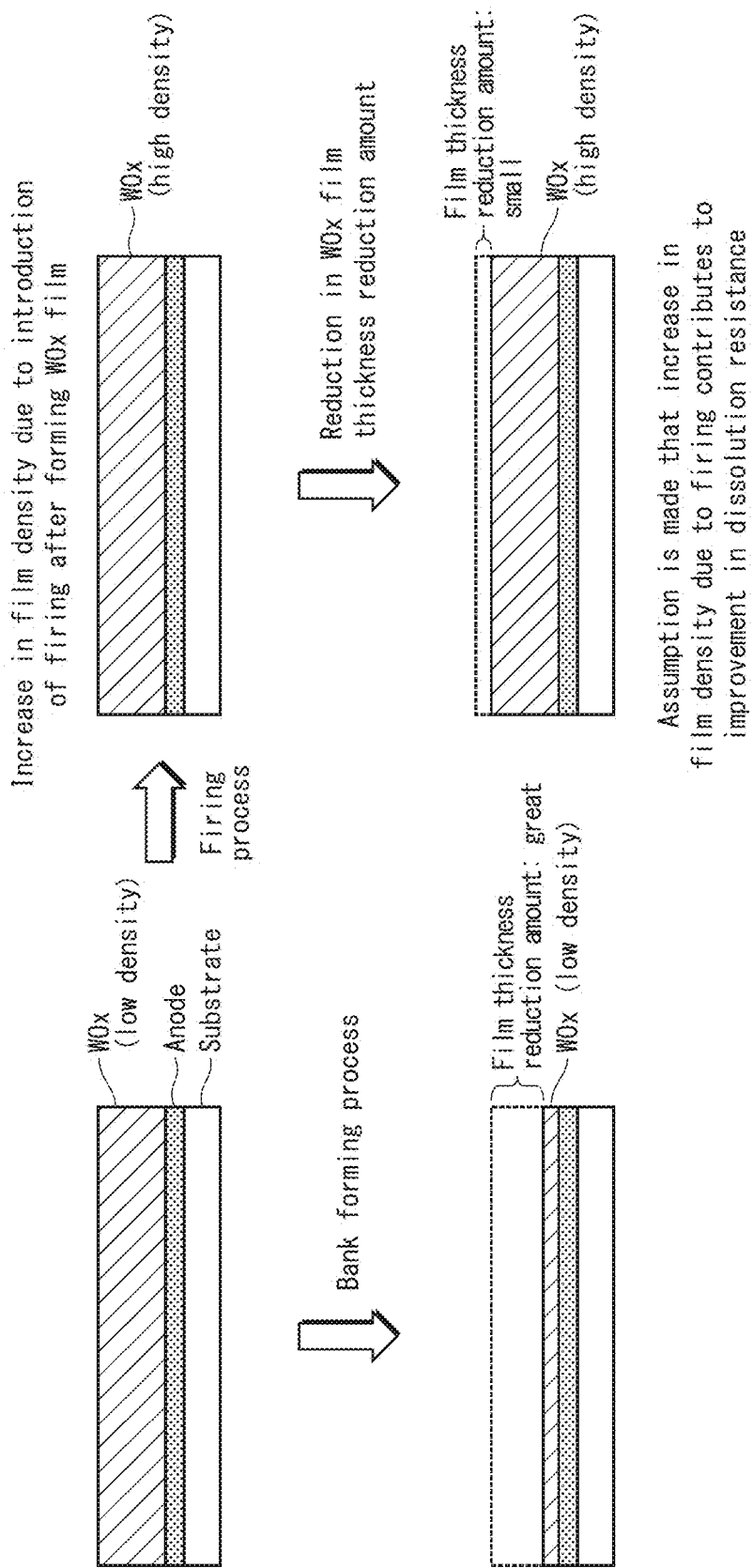
FIG. 20 explains the effects of introducing a firing process after forming of a tungsten oxide film.

In the following, description is provided on how the film thickness reduction of the tungsten oxide film takes place and on the effects of the firing process performed after the forming of the tungsten oxide film, with reference to FIG. 20. When the tungsten oxide film is formed at the low rate and then the bank forming process is performed with the tungsten oxide film in its original state (at the same state as when initially formed), the film thickness reduction amount of the tungsten oxide film in the bank forming process reaches a considerable level since the tungsten oxide film in this case has low film density. Meanwhile, when the predetermined firing process is performed with respect to the tungsten oxide layer having been formed, the film density of the tungsten oxide film increases as a result of the application of heat and the densification brought about in the firing process. By performing the firing process, the tungsten oxide film is provided with increased dissolution resistance, and thus, even when the bank forming process is later performed, the film thickness reduction amount of the tungsten oxide film in the bank forming process is suppressed to as low a level as possible.

(Surface Film Thickness Unevenness in Organic EL Panel)

Figure 21:
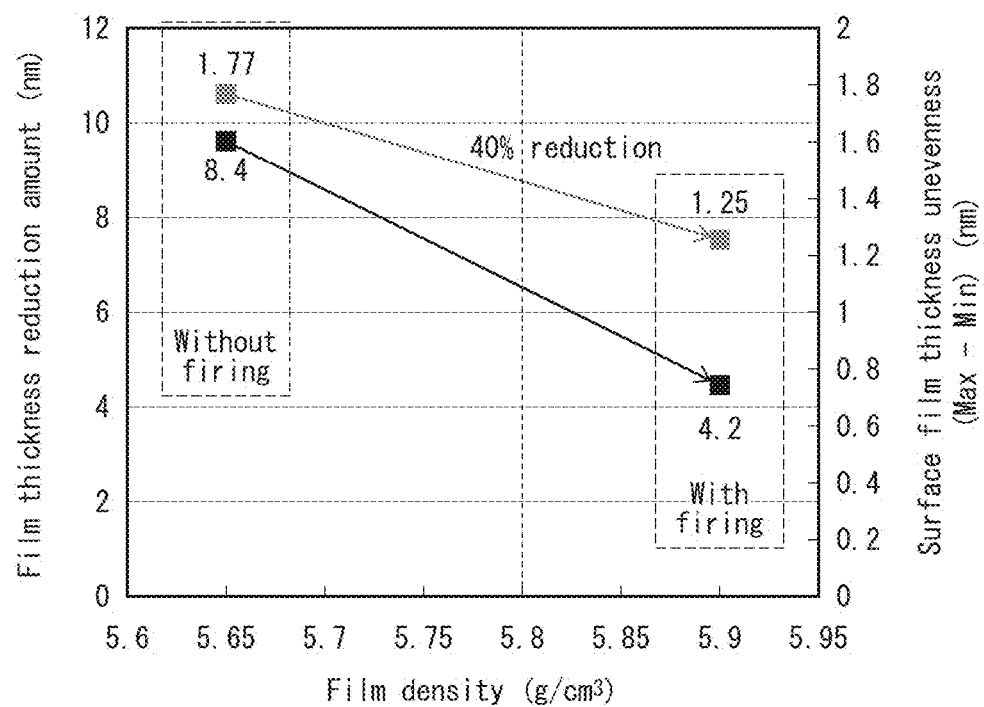
FIG. 21 is a graph illustrating the relation between film thickness reduction amounts and panel surface film thickness unevenness for different film densities of tungsten oxide films.

FIG. 21 illustrates the relation between film thickness reduction amounts and surface film thickness unevenness in an organic EL panel, for different film densities of tungsten oxide films.

In the experiment described in the following, the present inventors prepared a plurality of samples each including tungsten oxide films formed at a plurality of areas on the surface of a substrate. Further, the present inventors calculated the film thickness reduction amount when performing the firing process and the film thickness reduction amount when not performing the firing process, for different film densities of the tungsten oxide film. In addition, the present inventors calculated the unevenness in film thickness between tungsten oxide films on the substrate for different film densities of the tungsten oxide film. FIG. 21 shows the results. Here, note that the difference in film thickness reduction amount between tungsten oxide films at different areas on an organic EL panel, which is calculated as a difference between the maximum film thickness reduction amount and the minimum film thickness reduction amount, is referred to as "panel surface film thickness unevenness".

Nowadays, one specification requirement that an organic EL panel needs to satisfy is that the panel surface film thickness unevenness between hole injection layers in the organic EL panel is no greater than 4 nm (i.e., to be within a range of ±2 nm, inclusive). This is since a great panel surface film thickness unevenness between hole injection layers in an organic EL panel may negatively affect the cavity design, etc., of the organic EL panel.

At present, it is difficult to completely prevent film thickness reduction of tungsten oxide films from occurring. However, if a tungsten oxide film undergoing only relatively small film thickness reduction in the bank forming process is realized, the initial film thickness of the tungsten oxide film, at the point when the forming thereof is completed, can be set to a relatively small thickness. This is advantageous in that the absolute amount of panel surface film thickness unevenness at the point when the manufacturing of the organic EL panel is completed can be reduced accordingly. In view of this, the present invention utilizes the technology of suppressing the film thickness reduction amount of the tungsten oxide film during the bank forming process to as low a level as possible by providing the tungsten oxide film with improved dissolution resistance. Due to this, the initial film thickness of the tungsten oxide film, at the point when the forming thereof is completed, can be reduced, and further, the absolute amount of panel surface film thickness unevenness between hole injection layers in the organic EL panel can be suppressed. Additionally, such technology also has an advantageous effect of preventing ununiformity of light-emission efficiency between organic EL elements formed in the panel.

Specifically, when turning to the results in FIG. 21, in each of the samples used in this experiment, the panel surface film thickness unevenness was suppressed to no greater than 4 nm (i.e., to be within a range of ±2 nm, inclusive), regardless of whether or not the firing process was performed. In particular, the panel surface film thickness unevenness in the sample for which the firing process was performed was lower by at least 40% compared to the sample for which the firing process was not performed.

For achieving uniform light-emission characteristics in an organic EL panel, it is desirable that the panel surface film thickness unevenness be as small as possible. As such, the firing process performed with respect to the tungsten oxide film in the present invention is effective for effectively suppressing the absolute amount of panel surface film thickness unevenness.

Figure 22:
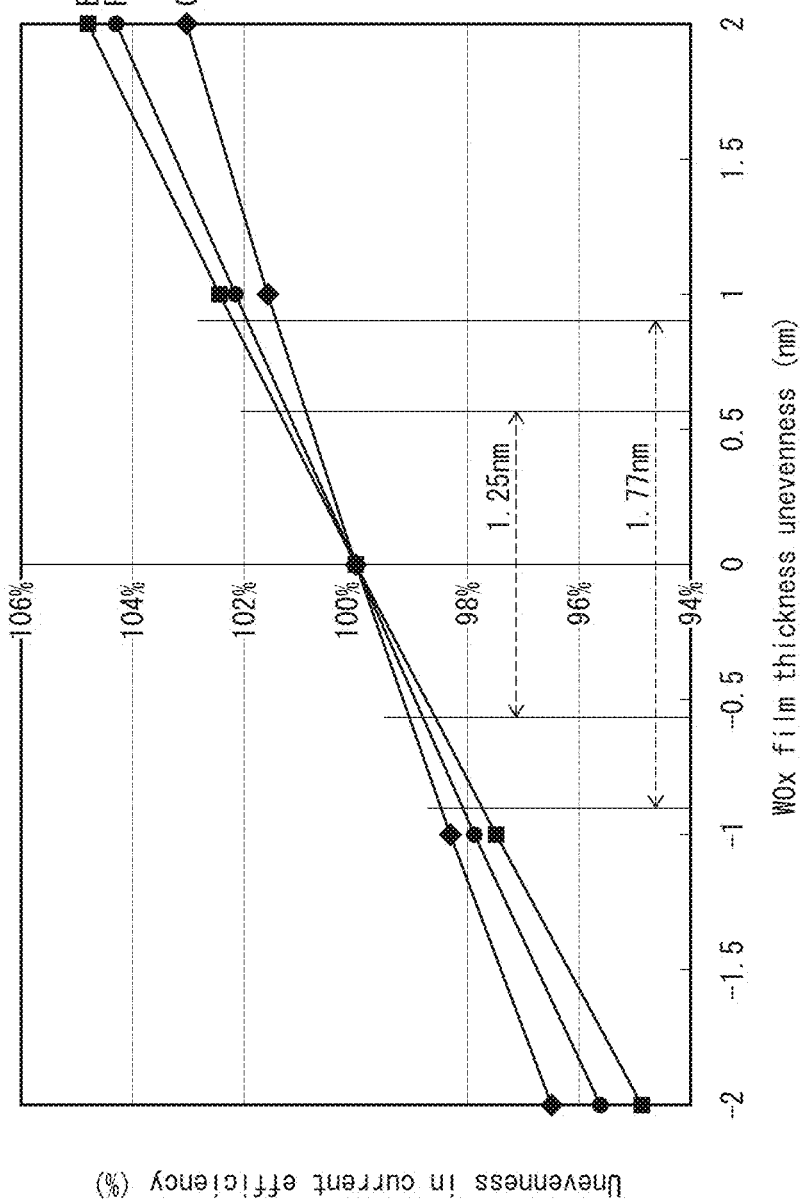
FIG. 22 is a graph illustrating the relation between film thickness unevenness and current efficiency unevenness of tungsten oxide films.

FIG. 22 is a graph illustrating the relation between panel surface film thickness unevenness (referred to hereinafter also as WOx film thickness unevenness) between hole injection layers made of tungsten oxide and unevenness in current efficiency between organic EL elements of the respective colors R, G, and B. Here, measurement was performed of the light-emission characteristics of organic EL elements each including a color filter of one of the colors R, G, B layered therein.

As shown in FIG. 22, the unevenness in current efficiency between organic EL elements increases in proportion with the increase in the panel surface film thickness unevenness between tungsten oxide films in the organic EL elements. Here, the present invention suppresses the unevenness in film thickness of hole injection layers between organic EL elements included in an organic EL panel, and thus realizes uniform current efficiency and uniform light-emission characteristics of the organic EL elements. This advantageous effect ultimately contributes to enhancing the image display performance of the entire organic EL panel.

Subsequently, the present inventors prepared organic EL panels each having a plurality of organic EL elements disposed therein. Here, each of the organic EL elements has, as a hole injection layer, a tungsten oxide film formed under the predetermined film-forming conditions defined in embodiment 1. Further, the organic EL elements in each of the organic EL panels has disposed therein a color filter of one of the colors R, G, and B. The present inventors then caused the organic EL panels to drive and calculated the unevenness in current efficiency between the organic EL elements at the panel surface (maximum current efficiency−minimum current efficiency). Then, the present inventors compared the calculation results with those for example organic EL panels for comparison (each having organic EL elements including, as hole injection layers, tungsten oxide films not having been subjected to the firing process after the forming thereof and corresponding to one of the colors R, G, and B). Table 6 shows the results.

TABLE 6

| Color Filter | Measurement Results of Unevenness in Panel Surface Efficiency (w/Color Filter) (Maximum Value − Minimum Value)(%) | |
|---|---|---|
| Color | Firing Process Not Performed | Firing Process Performed |
| R | ±2.0 | ±1.3 |
| G | ±1.5 | ±0.7 |
| B | ±2.3 | ±1.4 |

As shown in Table 6, for each of the organic EL panel corresponding to the color R, the organic EL panel corresponding to the color G, and the organic EL panel corresponding to the color B, by performing the firing process with respect to the tungsten oxide films included therein after the forming of the tungsten oxide films, the unevenness in current efficiency at the panel surface was reduced compared to when the firing process was not performed with respect to the tungsten oxide films. Thus, it is confirmed that each of the organic EL panels prepared can be expected to exhibit uniform light-emission characteristics at all areas of the panel.

FIG. 23 is a graph illustrating the results of a measurement performed concerning the relation between the film thickness reduction amount of the tungsten oxide film (indicated by the line connecting rhombuses) and the film density of the tungsten oxide film (indicated by the line connecting squares) for different processing times of the firing process performed after the forming of the tungsten oxide film. In this measurement, the thickness of the tungsten oxide film immediately after the forming thereof was set to 14 nm, and further, the firing temperature in the firing process was set to 230° C.

As shown by the results in FIG. 23, the film thickness reduction amount of the tungsten oxide film becomes substantially constant when the processing time is approximately 15 minutes or longer. Further, the film density of the tungsten oxide film becomes substantially constant when the processing time is approximately 45 minutes or longer. Meanwhile, even when the processing time was set to a longer time period than described above, no prominent change in the characteristics of the tungsten oxide film was observed. According to such measurement results, in order to increase the film density of the tungsten oxide film and reduce the film thickness reduction amount of the tungsten oxide film in the bank forming process, it suffices that the processing time of the firing process be set to at least 15 minutes and at most 45 minutes. As such, assumption is made that the desirable processing time for the firing process is within the range of at least 15 minutes and at most 45 minutes.

Embodiment 2

<Overall Structure of Organic EL Element 1C>

Figure 24A:
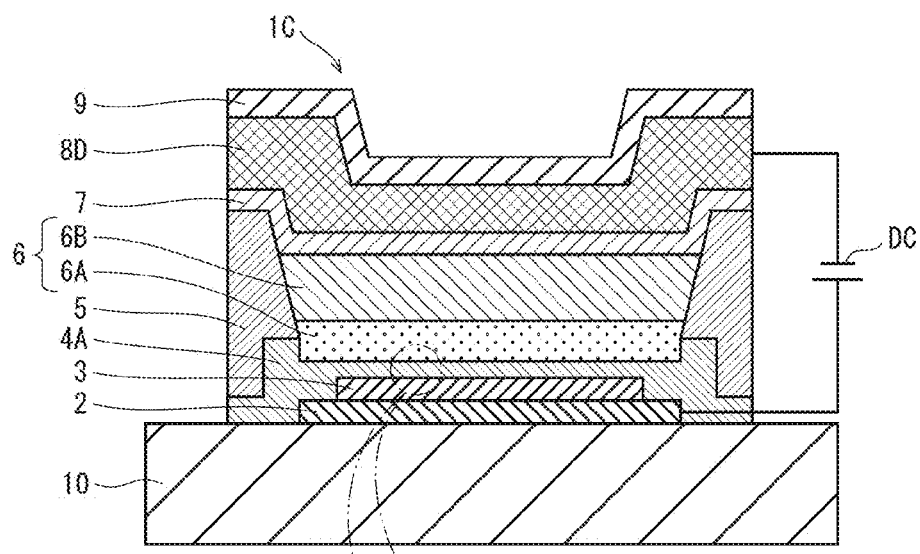
FIG. 24A is a schematic cross-sectional diagram illustrating the structure of an organic EL element 1C pertaining to embodiment 2.
Figure 24B:
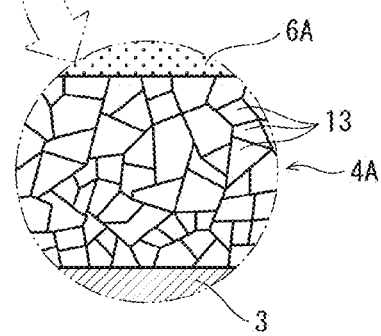
FIG. 24B is a partially expanded view near a hole injection layer 4A.

FIG. 24A is a schematic cross-sectional view illustrating the structure of an organic EL element 1C according to the present embodiment. FIG. 24B is a partially expanded view near a hole injection layer 4C.

The organic EL element 1C is, for example, an application type organic EL element including one or more functional layers each having been formed by applying material in wet processing. The hole injection layer 4A and a set of one or more functional layers, each containing organic material and having a predetermined function, are disposed one on top of the other, and are disposed between a pair of electrodes, composed of an anode 2 and a cathode 8D.

Specifically, the organic EL element 1C includes a substrate 10 having the following layered on one main surface thereof in the stated order: the anode 2, an ITO layer 3, the hole injection layer 4A, a buffer layer 6A, a light-emitting layer 6B, an electron injection layer 7, a cathode 8D, and a sealing layer 9. The following description focuses on the differences of the organic El element 1C from the organic EL element 1.

(ITO Layer 3)

The indium tin oxide (ITO) layer 3 is provided between the anode 2 and the hole injection layer 4A, and has the function of enhancing the bonding between the layers. In the organic EL element 1C, the ITO layer 3 and the anode 2 are separate, but the ITO layer 3 may be considered part of the anode 2.

(Hole Injection Layer 4A)

Like the hole injection layer 4 in embodiment 1, the hole injection layer 4C is a layer of tungsten oxide formed under the predetermined "low rate" film forming conditions and having a film thickness of at least 2 nm (30 nm in this example). Due to this, a Schottky ohmic contact is formed between the ITO layer 3 and the hole injection layer 4A, and thus, the difference in binding energy between the Fermi level of the ITO layer 3 and the lowest binding energy of the occupied energy level near the Fermi surface, at a position 2 nm away from the surface of the ITO layer 3 towards the hole injection layer 4A, is within the range of +0.3 eV inclusive. This results in the hole injection barrier between the ITO layer 3 and the hole injection layer 4A being moderated compared to the injection barrier between such layers in a conventional structure, and thus, the organic EL element 1C is able to operate excellently at low voltage. In addition, the film density of the hole injection layer 4A is set to a high density within a range of 5.8 g/cm$^3$ to 6.0 g/cm$^3$, and thus, the tungsten oxide film that becomes the hole injection layer 4A has increased dissolution resistance to the etching solution, the cleaning liquid, etc., that are used in the bank forming process for forming the banks 5. This results in the film thickness reduction amount of the tungsten oxide film during the bank forming process being suppressed to as small an amount as possible. Note that as illustrated in FIG. 24A, the hole injection layer 4A has a concave portion that is concave in the direction of the anode 2, at one surface thereof on the side of the light-emitting layer 6B. The concave portion is formed due to a slight film thickness reduction occurring at the surface of the hole injection layer 4A on the side of the light-emitting layer 6B during the bank forming process.

In the composition formula WOx denoting the composition of the tungsten oxide constituting the hole injection layer 4A, x is a real number existing within a range of approximately 2<x<3. While it is desirable for the hole injection layer 4A to be made of as pure a tungsten oxide as possible, the inclusion of a slight degree of impurities is acceptable, provided that the amount does not exceed the amount of impurities that might normally be incorporated.

Details on the predetermined film forming conditions for forming the hole injection layer 4A are provided in the sections "Method for Manufacturing Organic EL Element 1C" and "Film forming Conditions for Hole Injection Layer 4A".

In embodiment 2, since the tungsten oxide layer constituting the hole injection layer 4A is formed under predetermined film forming conditions, the hole injection layer 4A includes a plurality of tungsten oxide crystals 13, as illustrated in FIG. 24B. The particle diameter of each crystal 13 is on the order of nanometers. As an example, whereas the thickness of the hole injection layer 4A is approximately 30 nm, the particle diameter of the crystals 13 is approximately between 3 and 10 nm. Hereinafter, the crystals 13, whose particle diameter is on the order of nanometers, are referred to as "nanocrystals 13", and a layered structure composed of the nanocrystals 13 is referred to as a "nanocrystal structure". Note that apart from the nanocrystal structure, the hole injection layer 4A may include an amorphous structure.

In the hole injection layer 4A with the above nanocrystal structure, the tungsten atoms constituting the tungsten oxide are distributed to include both atoms at the maximum valence and atoms at a valence less than the maximum valence. Meanwhile, a tungsten oxide layer may typically include the oxygen vacancy structure or a similar structure. Here, it should be noted that a tungsten atom not included in the oxygen vacancy structure or a similar structure has a valence of six, while a tungsten atom included in the oxygen vacancy structure or a similar structure has a valence less than the maximum valence of six. Furthermore, the oxygen vacancy structures or similar structures are typically abundant at the surfaces of tungsten oxide crystals.

Accordingly, in the organic EL element 1C, in addition to the hole injection barrier between the ITO layer 3 and the hole injection layer 4A being moderated, a further improvement in hole conduction efficiency is expected to be brought about by distributing tungsten atoms with a valence of five throughout the hole injection layer 4A to create the oxygen vacancy structures or similar structures. In other words, by providing the hole injection layer 4A formed from tungsten oxide with the nanocrystal structure, the holes injected from the ITO layer 3 to the hole injection layer 4A are conducted by the oxygen vacancy structures or similar structures existing along the crystal interface of the nanocrystals 13. This increases the paths for conduction of holes and improves the hole conduction efficiency. This efficiently reduces the driving voltage of the organic EL element 1C.

In addition to the above, the hole injection layer 4A is formed by performing a predetermined firing process after the forming of the tungsten oxide film that later becomes the hole injection layer 4A. Due to the firing process being performed, the film density of the tungsten oxide film is increased, which leads to the tungsten oxide film being provided with increased chemical resistance and dissolution resistance. Therefore, even if the tungsten oxide film comes into contact with a dissolution solution, etc., used during processes performed after forming of the tungsten oxide film, damage to the tungsten oxide film and thus to the hole injection layer 4A due to dissolution, deterioration, or decomposition is reduced, and the film thickness reduction amount of the tungsten oxide film in such processes performed after the forming of the tungsten oxide film is effectively reduced. Further, due to the hole injection layer 4A being formed of material having excellent chemical resistance, prevention of the decrease in the hole conduction efficiency of the hole injection layer 4A is also expected.

Note that in the present embodiment, the hole injection layer 4A made of tungsten oxide may be formed of only the nanocrystal structure or may be formed of both the nanocrystal structure and the amorphous structures. Furthermore, it is desirable that the nanocrystal structure be present throughout the hole injection layer 4A. However, holes can be efficiently conducted from the lower edge of the hole injection layer 4A to the upper edge of the hole injection layer 4A as long as at least one connection of grain boundaries extends from the interface where the ITO layer 3 contacts with the hole injection layer 4A to the interface where the hole injection layer 4A contacts with the buffer layer 6A.

Note that examples have been reported on in the past of the technology itself of using a layer that includes tungsten oxide crystals as the hole injection layer. For example, Non-Patent Literature 1 suggests that crystallizing a tungsten oxide layer by annealing at 450° C. improves the hole conduction efficiency. However, Non-Patent Literature 1 does not disclose the conditions for forming a tungsten oxide layer with a large area, nor the effects that tungsten oxide formed above the substrate as a hole injection layer has on other layers above the substrate. Non-Patent Literature 1 therefore does not demonstrate the potential for practical mass-production of a large organic EL display panel. Furthermore, Non-Patent Literature 1 does not disclose purposely forming tungsten oxide nanocrystals having the oxygen vacancy structures or similar structures in the hole injection layer. In contrast, the hole injection layer according to one aspect of the present invention is formed from a tungsten oxide layer that is resistant to chemical reactions, is stable, and withstands the mass production process of large organic EL panels. Furthermore, purposely incorporating the oxygen vacancy structures or similar structures in the tungsten oxide layer achieves excellent hole conduction efficiency, which is a decisive difference from conventional technology.

(Electron Injection Layer 7/Cathode 8D/Sealing Layer 9)

The electron injection layer 7 has a function to inject electrons from the cathode 8D to the light-emitting layer 6B. It is desirable that the electron injection layer 7 be, for example, a 5-nm thick layer of barium, or a 1-nm thick layer of lithium fluoride or sodium fluoride, or a combination thereof.

The cathode 8D is, for example, composed of an ITO layer with a film thickness of approximately 100 nm. A direct current power supply DC is connected to the anode 2 and cathode 8D so as to supply power from an external source to the organic EL element 1C.

The sealing layer 9 has a function to seal the organic EL element 1C from being exposed to water or air. The sealing layer 9 is, for example, formed from a material such as silicon nitride (SiN) or silicon oxynitride (SiON). In the case of a top emission type organic EL element, it is desirable that the sealing layer 9 be formed from a light-transmissive material.

<Method of Manufacturing Organic EL Element 1C>

The following describes an example of a method for manufacturing the entire organic EL display panel 1C, with reference to FIGS. 26A through 26C, FIGS. 27A and 27B, FIGS. 28A through 28D, and FIGS. 29A through 29D.

Figure 26A:
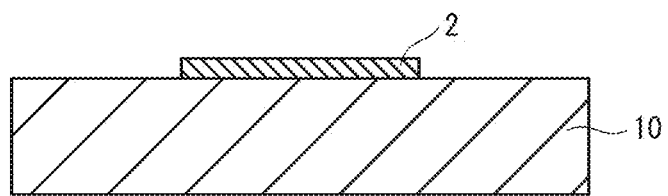
FIGS. 26A through 26C each explain a process in a method for manufacturing the organic EL element 1C pertaining to embodiment 2.

First, a thin film of silver is formed by sputtering, for example, on the substrate 10. The thin film is then patterned by, for example, photolithography to form the anode 2 in a matrix (FIG. 26A). Note that the thin film may be formed by another method such as vacuum deposition.

Next, an ITO thin film is formed by sputtering, for example, and the ITO thin film is patterned by photolithography, for example, to form the ITO layer 3.

Figure 26B:
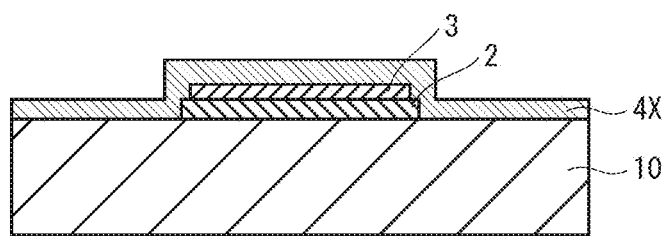

Subsequently, a thin film 4X containing tungsten oxide is then formed on an upper surface of a base layer including the anode 2 according to the predetermined film forming conditions (i.e., the low rate film forming conditions) described below (FIG. 26B). Here, the upper surface of the base layer corresponds to the upper surface of the ITO layer 3. By forming the thin film 4X, which corresponds to the hole injection layer 4A, in the manner described above, the oxygen vacancy structure is formed therein, and thus an occupied energy level is formed within a binding energy range from 1.8 eV to 3.6 eV lower than the lowest binding energy of the valence band. Thus, excellent hole injection characteristics of the hole injection layer 4A is ensured.

Subsequently, atmospheric firing of the thin film 4X is performed at a firing temperature of at least 200° C. to at most 230° C. for a processing time of at least 15 minutes to at most 45 minutes; i.e., in the similar manner as in embodiment 1. By firing the thin film 4X in such a manner, heat is applied to the thin film 4X, which brings about a densification of the thin film 4X to have an increased film density within a range of at least 5.8 g/cm$^3$ to at most 6.0 g/cm$^3$. By the film density of the thin film 4X being increased through the firing process, the dissolution resistance of the thin film 4X to the etching solution, the cleaning liquid, etc., used in the subsequent bank forming process increases.

Figure 26C:
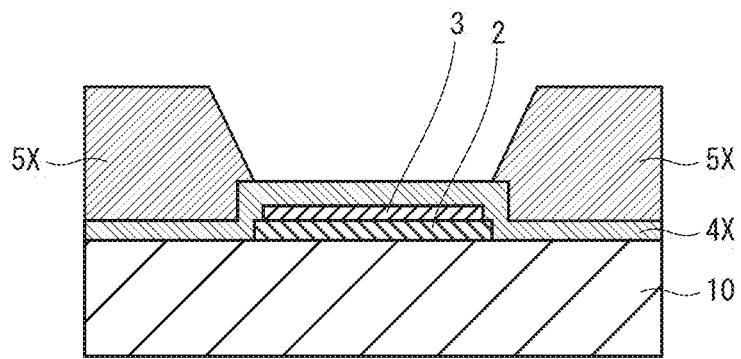

Subsequently, a bank material layer 5X is formed on the thin film 4X with bank material composed of organic material. Further, a portion of the bank material layer 5X is removed to expose a portion of the thin film 4X (FIG. 26C). The bank material layer 5X is formed by application or by another method. Here, the removal of the bank material layer 5X can be performed by patterning using a predetermined developer (a tetramethylammonium hydroxide (TMAH) solution or the like).

Figure 27A:
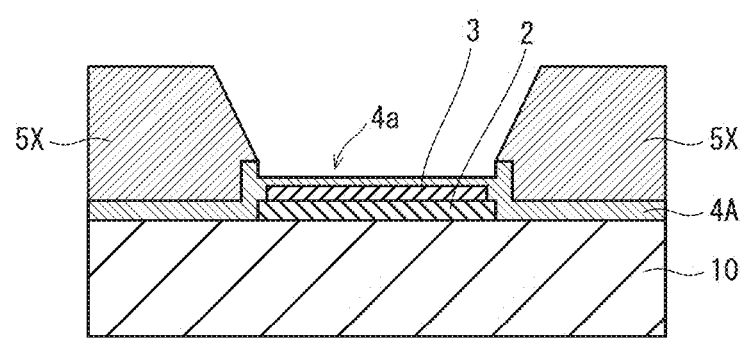
FIGS. 27A and 27B each explain a process in the method for manufacturing the organic EL element 1C pertaining to embodiment 2.

Although the thin film 4X has excellent chemical resistance due to having undergone the firing process following the forming thereof, the tungsten oxide constituting the thin film 4X dissolves to the TMAH solution to a certain extent. Specifically, when bank residue remaining adhered onto the surface of the thin film 4X is washed away by using the developer, erosion of the exposed portion of the thin film 4X takes place. Accordingly, a slight degree of film thickness reduction of the thin film 4X takes place, which results in a concave portion that is concave towards the direction of the anode 2 being formed in the thin film 4X (FIG. 27A). Thus, the hole injection layer 4A is formed to have a concave portion 4a.

Figure 27B:
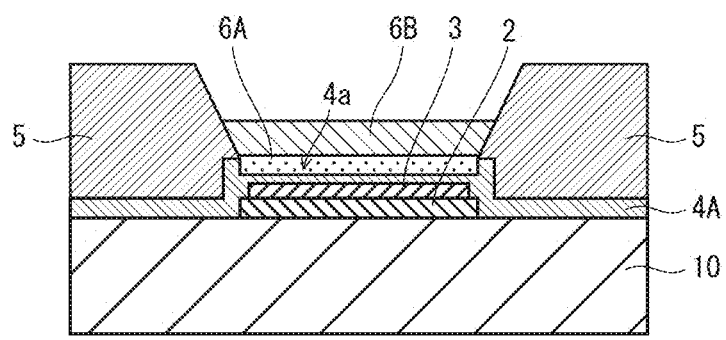

Next, repellency treatment is performed on the surface of the bank material layer 5X using fluorine plasma, for example, to form the banks 5. Subsequently, an ink composition containing organic material is dripped, for example using the inkjet method, into a region defined by the banks 5, and the ink is then dried. Each of the buffer layer 6A and the light-emitting layer 6B is formed in this way (FIG. 27B). Note that the depositing of ink may be performed according to other methods such as the dispenser method, the nozzle coating method, the spin coating method, intaglio printing, and relief printing.

Figure 28A:
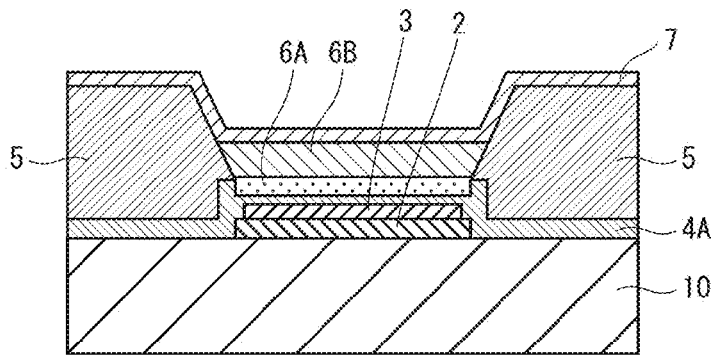
FIGS. 28A through 28C each explain a process in the method for manufacturing the organic EL element 1C pertaining to embodiment 2.

Next, a thin film of barium constituting the electron injection layer 7 is formed by vacuum deposition, for example (FIG. 28A).

Figure 28B:
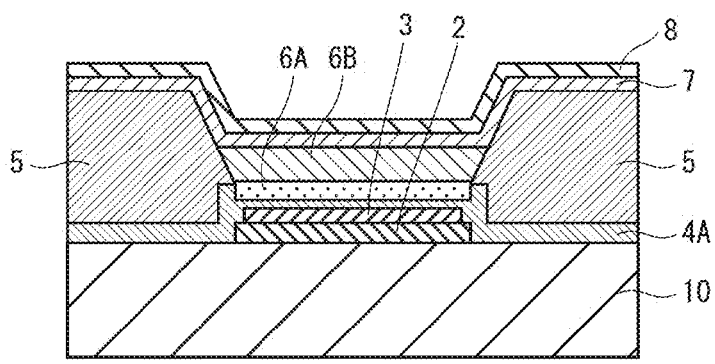

Then, an ITO thin film constituting the cathode 8D is formed by sputtering, for example (FIG. 28B).

Figure 28C:
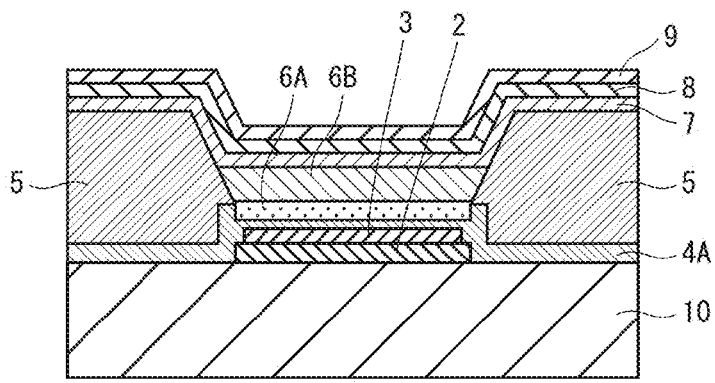

Next, on the cathode 8D, the sealing layer 9 is formed (FIG. 28C).

This completes the organic EL element 1C.

The following describes the film forming conditions for the hole injection layer 4A (thin film 4X). It is desirable that the hole injection layer 4A (thin film 4X) be formed by reactive sputtering. Specifically, metal tungsten is placed in the chamber as the sputtering target, and argon gas and oxygen gas are introduced into the chamber as the sputtering gas and oxygen gas, respectively. Under this condition, the argon in the argon gas is ionized by the application of high voltage, and the ionized argon is caused to bombard the sputtering target. The metal tungsten ejected as a result of the sputtering phenomenon reacts with the oxygen gas to produce tungsten oxide, thus forming a tungsten oxide layer on the ITO layer 3.

To provide a brief explanation of the film forming conditions under which the hole injection layer 4A (thin film 4X) is formed, the film forming conditions are such that: (i) the total pressure of the gas introduced into the chamber is at least 2.3 Pa and at most 7.0 Pa; (ii) the partial pressure of the oxygen gas is at least 50% and at most 70% of the total pressure of the gas; (iii) the input power density per unit area of the sputtering target is at least 1.4 W/cm$^2$ and smaller than 2.8 W/cm$^2$; and (iv) the value yielded by dividing the total pressure by the input power density is greater than 0.7 Pa·cm$^2$/W. Detailed description of the film forming conditions is provided later. The hole injection layer 4A composed of tungsten oxide having the nanocrystal structure is formed under these film forming conditions.

(Another Example of Processing from Anode Forming Process to Bank Forming Process)

Next, another example of the processing from the anode forming process to the bank forming process is described, with reference to FIGS. 29A through 29D and FIGS. 30A through 30C. Note that in this processing, description is provided on an example where a planarizing film 17 is formed on the surface of the substrate 10.

Figure 29A:
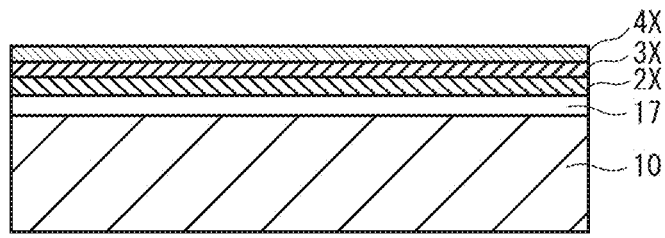
FIGS. 29A through 29D each explain a process in a method for manufacturing the organic EL element 1C pertaining to a modification of embodiment 2.

First, a planarizing film 17 is formed on the substrate 10 by using an insulating resin material such as polyimide or acrylic. With the vapor deposition method, the following three layers are layered sequentially on the planarizing film 17: an Al alloy thin film 2X, an IZO thin film 3X, and a thin film (tungsten oxide film) 4X (FIG. 29A). Aluminum-cobalt-lanthanum (ACL) material, for example, is used as the Al alloy material.

Figure 29B:
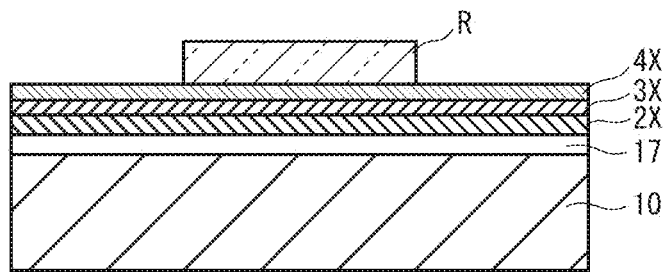

Next, a resist pattern R is formed by photolithography in the region above the substrate 10 in which the three layers of the anode 2, the IZO layer 3A, and the hole injection layer 4B are to be formed (FIG. 29B).

Figure 29C:
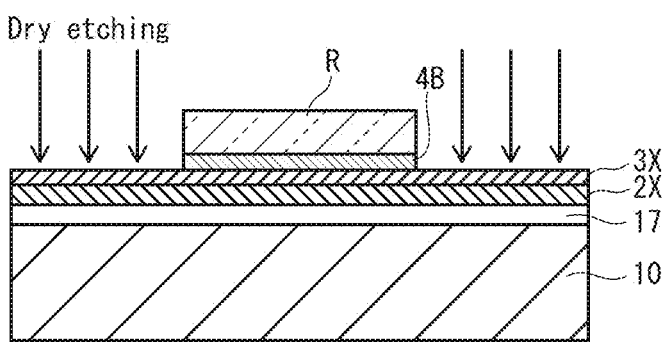

Next, patterning is performed by dry etching (D/E) the regions of the thin film 4X not covered by the resist pattern R (FIG. 29C). During this dry etching, only the thin film 4X is selectively etched by using either a mixture of fluorinated gas and N2 gas, or a mixture of fluorinated gas and O2 gas. The following is an example of the specific setting conditions for the dry etching.

[Conditions for Dry Etching]
Target of treatment: tungsten oxide film
Etching gas: fluorine-containing gas (SF$_6$, CF$_4$CHF$_3$)
Mixed gas: O$_2$, N,
Gas mixture ratio: CF$_4$:O$_2$=160:40
Supplied power: Source 500 W, Bias 400 W
Pressure: between 10 mTorr and 50 mTorr
Etching temperature: room temperature Performing the above dry etching yields the hole injection layer 4B. Subsequently, ashing is performed with O$_2$ gas to facilitate removal of the resist pattern R during the following wet etching (W/E) process.

Figure 29D:
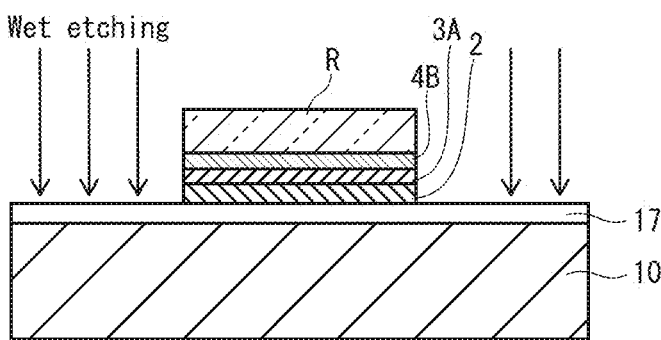

Then, the regions of the IZO thin film 3X and the Al alloy thin film 2X not covered by the resist pattern R are patterned by wet etching (FIG. 29D). By using a mixed solution of nitric acid, phosphoric acid, acetic acid, and water as the etchant, wet etching is performed simultaneously on both the IZO thin film 3X and the Al alloy thin film 2X.

The following is an example of the specific setting conditions for the wet etching.

[Conditions for Wet Etching]
Target of treatment: IZO thin film and Al alloy thin film
Etchant: mixed aqueous solution of nitric acid, phosphoric acid, and acetic acid
Blend ratio of solvent: not specified (mixing is possible under typical conditions)
Etching temperature: lower than room temperature Note that to perform the wet etching well, it is desirable that the IZO thin film 3X, which is the upper layer among the two layers, have a thickness of 20 nm or less. This is because the amount of side etching grows large if the thickness exceeds 20 nm.

Here, instead of an IZO layer formed from an IZO thin film, an ITO layer formed from an ITO thin film may of course be used.

Figure 30A:
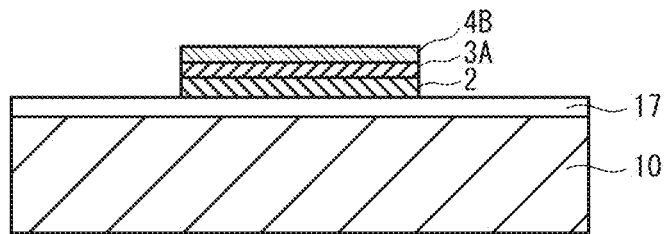
FIGS. 30A through 30C each explain a process in the method for manufacturing the organic EL element 1C pertaining to the modification of embodiment 2.

The anode 2 and the IZO layer 3A are formed through the above processes. Subsequently, the resist pattern R is removed through a resist removing step, yielding a patterned triple layer structure composed of the anode 2, the IZO layer 3A, and the hole injection layer 4B (FIG. 30A). In this process, the hole injection layer 4B is formed at a location corresponding to that of the anode 2 and the IZO layer 3A.

Figure 30B:
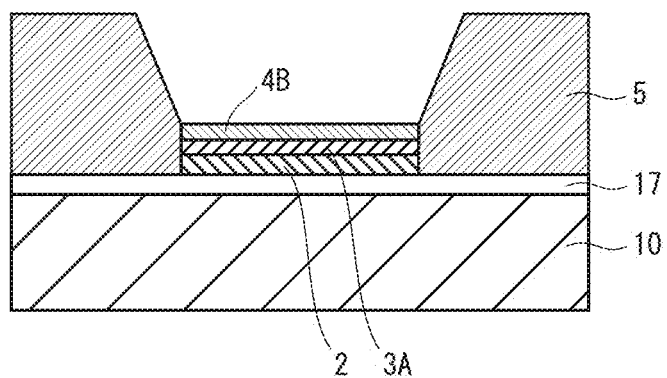

Next, the bank material film 5X is formed on the exposed surface of the planarizing film 17 (not shown in the figures) and is patterned to form the banks 5 (FIG. 30B).

Figure 30C:
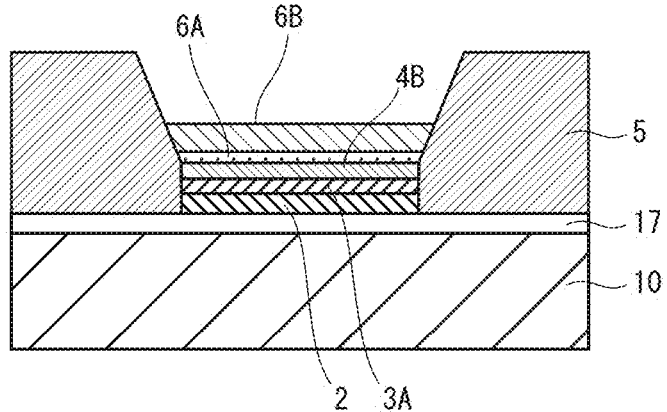

Note that following this point, each of the buffer layer 6A and the light-emitting layer 6B is formed by preparing a predetermined ink as described above, dripping the ink into regions partitioned by the banks 5, and drying the ink (FIG. 30C).

<Various Experiments Concerning Film Forming Conditions for Hole Injection Layers 4A, 4B and Observations>

(Film Forming Conditions for Hole Injection Layers 4A, 4B)

In embodiment 2, the hole injection layers 4A and 4B are each provided with the nanocrystal structure due to the tungsten oxide film that becomes the hole injection layer 4A/4B being formed under the predetermined film forming conditions (the low rate film forming conditions). Accordingly, the hole conduction efficiency of the hole injection layers 4A and 4B is improved, and further, the organic EL element 1C can be driven at low voltage. The predetermined film forming conditions are now described in detail.

In the forming of the hole injection layer 4A/4B, a DC magnetron sputtering device was used as the sputtering device, with metal tungsten as the sputtering target. The substrate temperature was not controlled. Further, it is considered desirable to form the tungsten oxide films by reactive sputtering by using argon gas and oxygen gas as the sputtering gas and the reactive gas, respectively, and by introducing the gases at equivalent amounts to flow in the chamber of the sputtering device. Note that the method of forming the hole injection layer 4A/4B is not limited to this, and well-known methods other than sputtering may be used for film formation, such as vapor deposition or CVD.

In order to form each of the hole injection layers 4A and 4B composed of tungsten oxide to have the nanocrystal structure, the atoms and clusters that hit the substrate need to reach the substrate with a kinetic energy low enough so as not to damage the orderly structure already formed on the substrate and to be able to bond together in an orderly manner while moving along substrate. It is therefore desirable to use as low a film forming rate (deposition rate) as possible.

Based on the experiments result described below, assumption is made that the above-described film forming conditions (i) through (iv) achieve the low film forming rate when film deposition is performed by reactive sputtering. The present inventors have confirmed that by forming a hole injection layer under the film forming conditions (i) through (iv), a hole injection layer composed of tungsten oxide having the nanocrystal structure is obtained, and the driving voltage of the organic EL element is reduced.

With respect to condition (i), note that while the upper limit of the total pressure in the experiment described below is 4.7 Pa, the present inventors confirmed separately that a similar trend is exhibited at least up to 7.0 Pa.

Furthermore, with respect to condition (ii), while the partial pressure of the oxygen gas is set to 50% of the total pressure of gas in the experiment described below, the present inventors confirmed the reduction in driving voltage at least while the partial pressure of the oxygen gas is in a range of at least 50% and at most 70% of the total pressure of gas.

A further explanation of condition (iv) is now provided. When the flow amounts of argon gas and oxygen gas in the chamber are equivalent, it is assumed that film properties are determined by the input power density and the total pressure. The input power density in (iii) changes both the number and kinetic energy of tungsten atoms and tungsten clusters released from the target by sputtering. In other words, lowering the input power density reduces the number of tungsten atoms released from the sputtering target and also lowers the kinetic energy. As a result, less tungsten reaches the substrate, arriving with a low kinetic energy. Hence, lowering the input power density should allow for film formation at a low film forming rate. Furthermore, the total pressure in (i) changes the mean free path of the tungsten atoms and tungsten clusters released from the sputtering target. In other words, if the total pressure is high, the tungsten atoms and tungsten clusters have a higher probability of repeatedly colliding with the gas in the chamber before reaching the substrate. The directions of arrival of the tungsten atoms and tungsten clusters thus become scattered, and kinetic energy is lost due to the collisions. As a result, less tungsten reaches the substrate, arriving with a low kinetic energy. Hence, raising the total pressure should allow for film formation at a low film forming rate.

It is considered, however, that there are limits to changing the film forming rate by independently controlling the input power density and the total pressure. Accordingly, the value yielded by dividing the total pressure by the input power density was adopted as a new parameter determining the film forming rate. This new parameter constitutes film forming condition (iv).

Specifically, the above-described parameter (total pressure/power density) for forming the nanocrystal structure in embodiment 2 is at least 0.78 Pa·cm$^2$/W in the range of the experiment described below. Further, a value larger than 0.7 Pa·cm$^2$/W is considered acceptable, and for even more reliable film formation, a value of 0.8 Pa·cm$^2$/W or greater is considered desirable. On the other hand, the upper limit for the parameter is 3.13 Pa·cm$^2$/W in the range of the experiment described below. Further, a value smaller than 3.2 Pa·cm$^2$/W is considered acceptable, and for even more reliable film formation, a value of 3.1 Pa·cm$^2$/W or less is desirable. Based on the above observation of the film forming rate and the nanocrystal structure, however, a lower film forming rate is considered more desirable, and therefore restrictions are not necessarily placed on the upper limit for the parameter. Film forming condition (iv) was determined based on the above considerations.

The present inventors confirmed in a separate experiment that for higher values of the above parameter, the film forming rate is lower, whereas for lower values of the above parameter, the film forming rate is higher.

Next, the present inventors confirmed the validity of the above film forming conditions through experiments.

Figure 25:
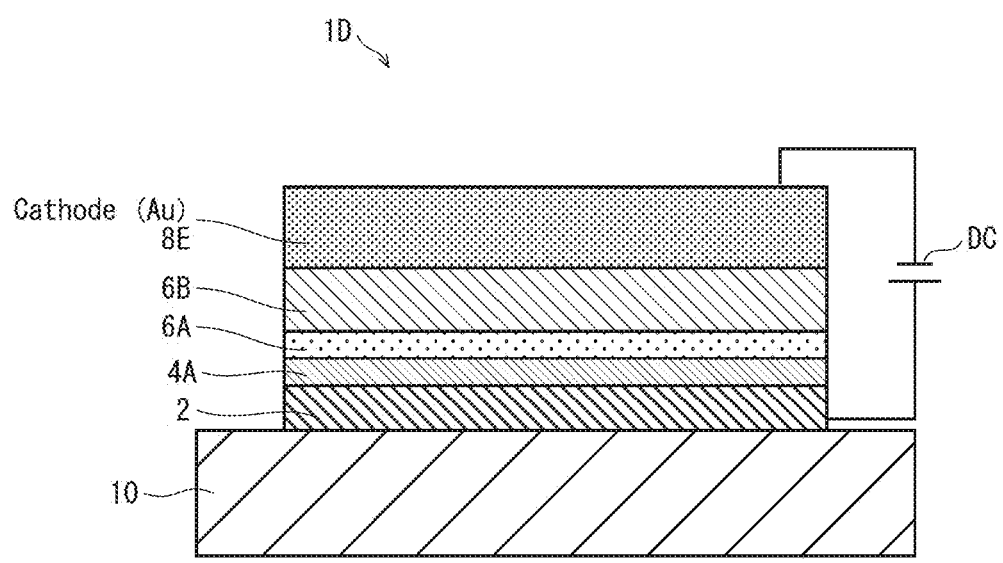
FIG. 25 is a schematic cross-sectional diagram illustrating the structure of a hole-only device 1D.

First, hole-only devices 1D illustrated in FIG. 25 were manufactured as assessment devices in order to assess the degree to which the hole conduction efficiency of the hole injection layers 4A and 4B depends on film forming conditions. As already explained in embodiment 1, since it could be considered that only holes function as a carrier in a hole-only device, a hole-only device is ideal in making an assessment of hole conduction efficiency As illustrated in FIG. 25, the hole-only devices 1D were prepared by modifying the organic EL element 1C illustrated in FIG. 24 to have a structure of an assessment device. More specifically, the ITO cathode 8D was replaced with a cathode 8E composed of Au, the anode 2 was removed and the ITO layer 3 was used as the anode instead, and the electron injection layer 7 and the banks 5 were removed. The hole-only devices 1D were prepared according to the manufacturing method described above. Further, the film thickness of each of the layers in the hole-only devices 1D were set such that the hole injection layer 4A has a film thickness of 30 nm, the buffer layer 6A composed of TFB has a film thickness of 20 nm, the light-emitting layer 6B composed of F8BT has a film thickness of 70 nm, and the cathode 8E composed of Au has a film thickness of 100 nm.

In the manufacturing of the hole-only devices 1D, the hole injection layer 4A was formed by reactive sputtering in a DC magnetron sputtering device. The gas introduced into the chamber was composed of at least one of argon gas and oxygen gas, and the sputtering target used was metal tungsten. Further, the substrate temperature was not controlled, and the total pressure was adjusted by controlling the flow amount of each gas. The partial pressure of each of the argon gas and the oxygen gas with respect to the total pressure of the chamber gas was set to the same value of 50%.

The hole-only devices 1D were manufactured with the hole injection layer 4A formed under five different film forming conditions α through ε shown in Table 7. Hereinafter, the hole-only device 1D formed under film forming conditions α is referred to as HOD-α, the hole-only device 1D formed under film forming conditions β is referred to as HOD-β, the hole-only device 1D formed under film forming conditions γ is referred to as HOD-γ, the hole-only device 1D formed under film forming conditions δ is referred to as HOD-δ, and the hole-only device 1D formed under film forming conditions ε is referred to as HOD-ε.

TABLE 7

| Film Forming Condition | Total Pressure (Pa) | Oxygen Partial Pressure (%) | Input Power Density (W/cm$^2$) | Total Pressure/ Power Density (Pa · cm$^2$/W) |
|---|---|---|---|---|
| α | 4.70 | 50 | 1.50 | 3.13 |
| β | 4.70 | 50 | 3.00 | 1.57 |
| γ | 4.70 | 50 | 6.00 | 0.78 |

TABLE 7-continued

| Film Forming Condition | Total Pressure (Pa) | Oxygen Partial Pressure (%) | Input Power Density (W/cm²) | Total Pressure/ Power Density (Pa · cm²/W) |
|---|---|---|---|---|
| δ | 2.35 | 50 | 1.50 | 1.57 |
| ε | 2.35 | 50 | 6.00 | 0.39 |

The hole-only devices 1D so prepared were then connected to the direct current power supply DC, and voltage was applied thereto. Furthermore, different voltages were applied to the hole-only devices 1D, and current values for different voltage values were measured. Further, the current values were converted into current values per unit surface area of the devices (current density values).

Figure 31:
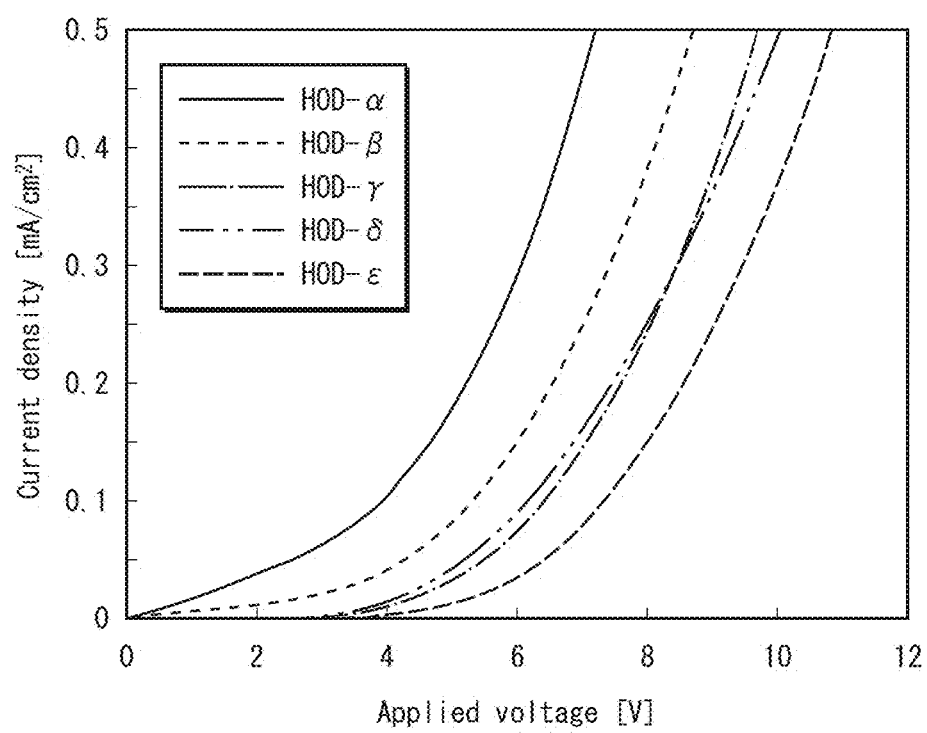
FIG. 31 is a device characteristics diagram showing curves illustrating the relation between applied voltages and current densities of hole-only devices.

FIG. 31 is a diagram illustrating the relation between the applied voltages and the current density values of the hole-only devices 1D. In FIG. 31, the vertical axis indicates current density (mA/cm²), whereas the horizontal axis indicates applied voltage (V).

Table 8 shows the driving voltage for each of the hole-only devices 1D. Note that hereinafter, the expression "driving voltage" refers to an applied voltage for a current density value of 0.3 mA/cm².

It can said that the hole conduction efficiency of the hole injection layer 4A is higher in hole-only devices having smaller driving voltages. This is since the structure of each hole-only device 1D other than the hole injection layer 4A is the same, and the hole injection barrier between adjacent layers, excluding the hole injection layer 4A, as well as the hole conduction efficiency of each layer, again excluding the hole injection layer 4A, is assumed to be constant between the hole-only devices 1D. Further, it is assumed that the hole conduction efficiency of the hole injection layer 4A more strongly influences the characteristics of the hole-only devices 1D than the hole injection efficiency from the hole injection layer 4A to the buffer layer 6A. The reasons for this are presented later. Further, through a separate experiment, the present inventors confirmed that the Schottky ohmic contact pertaining to the present invention is formed between the ITO layer 3 and the hole injection layer 4A in the hole-only devices 1D, in a similar manner as described in embodiment 1. Accordingly, the differences in driving voltages of the hole-only devices 1D, which derive from the different film forming conditions for forming the hole injection layer 4A, are considered as strongly reflecting the difference in hole conduction efficiency of the hole injection layer 4A between the hole-only devices 1D.

TABLE 8

| Sample Name | Driving Voltage (V) |
|---|---|
| HOD-α | 6.25 |
| HOD-β | 7.50 |
| HOD-γ | 8.50 |
| HOD-δ | 8.50 |
| HOD-ε | 9.49 |

As shown in Table 8 and FIG. 31, the current density-applied voltage curve rises the slowest for the HOD-ε, which has the highest driving voltage among the elements. Accordingly, it is inferred that HOD-α, β, β, and δ have superior hole conduction efficiency as compared to HOD-ε, which is manufactured under the film forming conditions with a low total pressure and the maximum input power density.

Thus far, tests on the hole conduction efficiency of the hole injection layer 4A in the hole-only devices 1D have been described. Except for the cathode 8E, the hole-only devices 1D each have the same structure as the organic EL element 1C particularly in terms of essential parts of the structure influencing device characteristics. Accordingly, in the organic EL element 1C as well, the dependence of the hole conduction efficiency of the hole injection layer 4A on the film forming conditions is essentially the same as in the hole-only devices 1D.

In order to confirm this point, a plurality of organic EL elements 1C were prepared each using a hole injection layer 4A formed under a different one of film forming conditions α through ε. Hereinafter, the organic EL element 1C formed under film forming conditions α is referred to as BPD-α, the organic EL element 1C formed under film forming conditions β is referred to as BPD-β, the organic EL element 1C formed under film forming conditions γ is referred to as BPD-γ, the organic EL element 1C formed under film forming conditions δ is referred to as BPD-δ, and the organic EL element 1C formed under film forming conditions ε is referred to as BPD-ε.

Each of the organic EL elements 1C were prepared by modifying the organic EL element 1C in FIG. 24 to have a structure of an assessment device. More specifically, the cathode 8D was formed of aluminum instead of ITO, the anode 2 was removed and the ITO layer 3 was used as the anode instead, and the banks 5 were removed. The organic EL elements 1C were prepared according to the manufacturing method described above. Further, the film thickness of each of the layers in the organic EL elements 1C were set such that the hole injection layer 4A has a film thickness of 30 nm, the buffer layer 6A composed of TFB has a film thickness of 20 nm, the light-emitting layer 6B composed of F8BT has a film thickness of 70 nm, the electron injection layer 7 composed of a barium layer has a film thickness of 5 nm, and the cathode 8 composed of an aluminum layer has a film thickness of 100 nm.

The organic EL elements 1C prepared according to the different film forming conditions α through ε were connected to the direct current power source DC, and voltage was applied thereto. Furthermore, different voltages were applied to the organic EL elements 1C, and current values for different voltage values were measured. Further, the current values were converted into current values per unit surface area of the devices (current density values).

Figure 32:
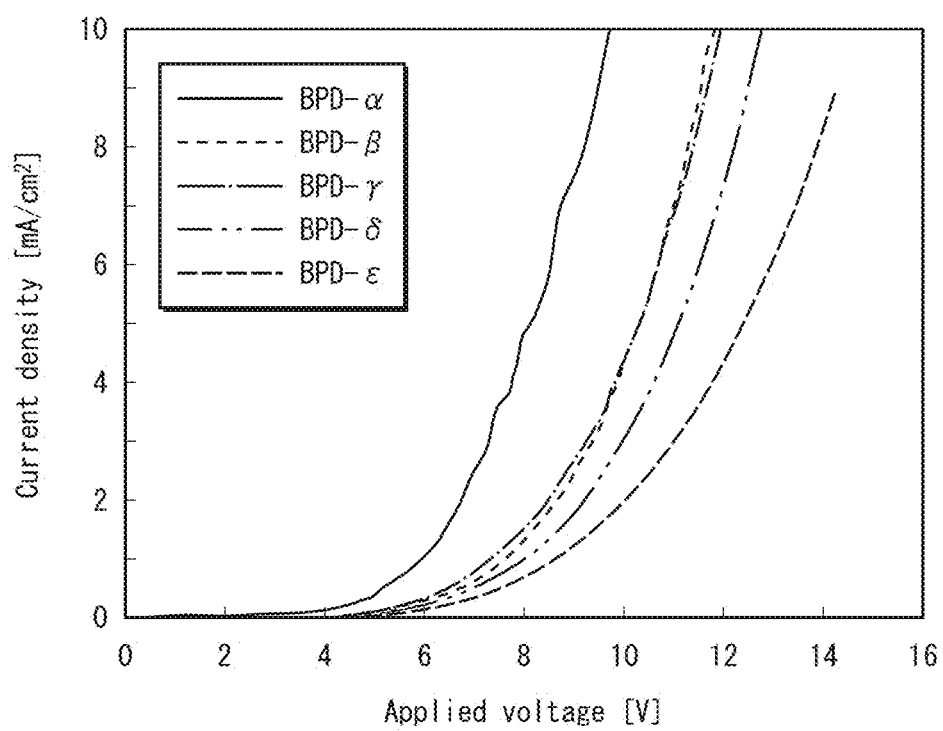
FIG. 32 is a device characteristics diagram showing curves illustrating the relation between applied voltages and current densities of organic EL elements.

FIG. 32 illustrates the relation between the applied voltages and the current density values of the organic EL elements 1C. In FIG. 32, the vertical axis indicates current density (mA/cm²), whereas the horizontal axis indicates applied voltage (V).

Table 9 shows the driving voltage for each of the organic EL elements 1C. Note that hereinafter, the expression "driving voltage" refers to an applied voltage for a current density value of 8 mA/cm².

TABLE 9

| Sample Name | Driving Voltage (V) |
|---|---|
| BPD-α | 9.25 |
| BPD-β | 11.25 |
| BPD-γ | 11.50 |
| BPD-δ | 12.25 |
| BPD-ε | 14.00 |

As shown in Table 9 and FIG. 32, the current density-applied voltage curve rises the slowest for the BDP-ε, which has the highest driving voltage among the elements. This trend is similar to the trend observed in the hole-only devices HOD-α through HOD-ε, which were prepared under the same respective film forming conditions.

From the above results, it was confirmed that in the organic EL elements 1C as well, the hole conduction efficiency of the hole injection layer 4A depends on the film forming conditions, similar to the case of the hole-only devices 1D. Specifically, it is inferred that in the organic EL elements 1C as well, forming the film under the specific ranges defined by the film forming conditions α, β, γ, and δ improves the hole conduction efficiency of the hole injection layer 4A, thereby achieving a low driving voltage.

Note that among the above conditions, the condition concerning input power is represented in terms of input power density, as indicated in Table 7. When using a DC magnetron sputtering device that is different from the one used in the present experiment, a hole injection layer composed of a tungsten oxide layer with an excellent hole conduction efficiency, as in the present experiment, can be yielded by adjusting the input power so that the input power density fulfills the above condition. Further, among the above-described film forming conditions, the condition concerning the total pressure of gas and the condition concerning the partial pressure of oxygen gas remain the same regardless of the device used.

Additionally, when forming the hole injection layer 4A by reactive sputtering in the sputtering device, no deliberate adjustment of substrate temperature is performed in the sputtering device, which is assumed to be placed under room temperature. Therefore, the substrate was at room temperature at least before the forming of the hole injection layer 4A. However, while forming of the hole injection layer 4A is being performed, there is a possibility that the substrate temperature may rise by several tens of degrees Celsius.

Note that through a separate experiment, the present inventors confirmed that when the partial pressure of the oxygen gas is increased excessively, the driving voltage conversely increases. Accordingly, it is desirable for the partial pressure of the oxygen gas to be within a range of at least 50% and at most 70% of the total pressure of gas.

The above experiment results indicate that in terms of low voltage drive, an organic EL element provided with a hole injection layer manufactured under film forming conditions α, ε, γ, and δ is desirable, and that an organic EL element manufactured under film forming conditions α and β is even more desirable. Hereinafter, an organic EL element provided with a hole injection layer manufactured under film forming conditions α, ε, γ, or δ is the target of the present disclosure.

(Chemical State of Tungsten in Hole Injection Layer 4A)

Tungsten atoms with a valence of five exist in the tungsten oxide layer constituting the hole injection layers 4A and 4B in embodiment 2. The tungsten atoms with a valence of five are formed by adjusting the film forming conditions as shown in the above experiments. Details concerning this point are provided in the following.

In order to confirm the chemical state of the films of tungsten oxide formed under the above film forming conditions α through ε, a hard X-ray photoelectron spectroscopy measurement (hereinafter simply referred to as "HXPS measurement") experiment was performed. Typically, the optical spectrum yielded by hard X-ray photoelectron spectroscopy (hereinafter simply referred to as "HXPS spectrum") reveals information for up to a film thickness of a few dozen nanometers in the object being measured. In other words, bulk information on the film is obtained, and the measurement depth is determined by the angle between the normal line to the surface and the direction in which photoelectrons are to be detected. In the present experiment, this angle was adjusted to be 40° to allow for observation of the valence state in the entirety of the tungsten oxide layer in the thickness direction.

The conditions under which the HXPS measurement was conducted are as follows. Note that no charge-up occurred during measurement.

(HXPS Measurement Conditions)

BL47XU beamline of SPring-8 was used.

Light source: synchrotron radiation (energy of 8 keV)

Bias: None

Electron emission angle: angle of 40° with normal line to the substrate

Interval between measurement points: 0.05 eV

Samples for HXPS measurement were manufactured under the film forming conditions α through ε shown in Table 7. A tungsten oxide layer (considered to be the hole injection layer 4A) was formed to a thickness of 30 nm by reactive sputtering on an ITO substrate formed on glass. The result was taken as the sample for HXPS measurement. The samples for HXPS measurement manufactured under the film forming conditions α, β, γ, δ, and ε are hereinafter respectively referred to as sample α, sample β, sample γ, sample δ, and sample ε.

Figure 33:
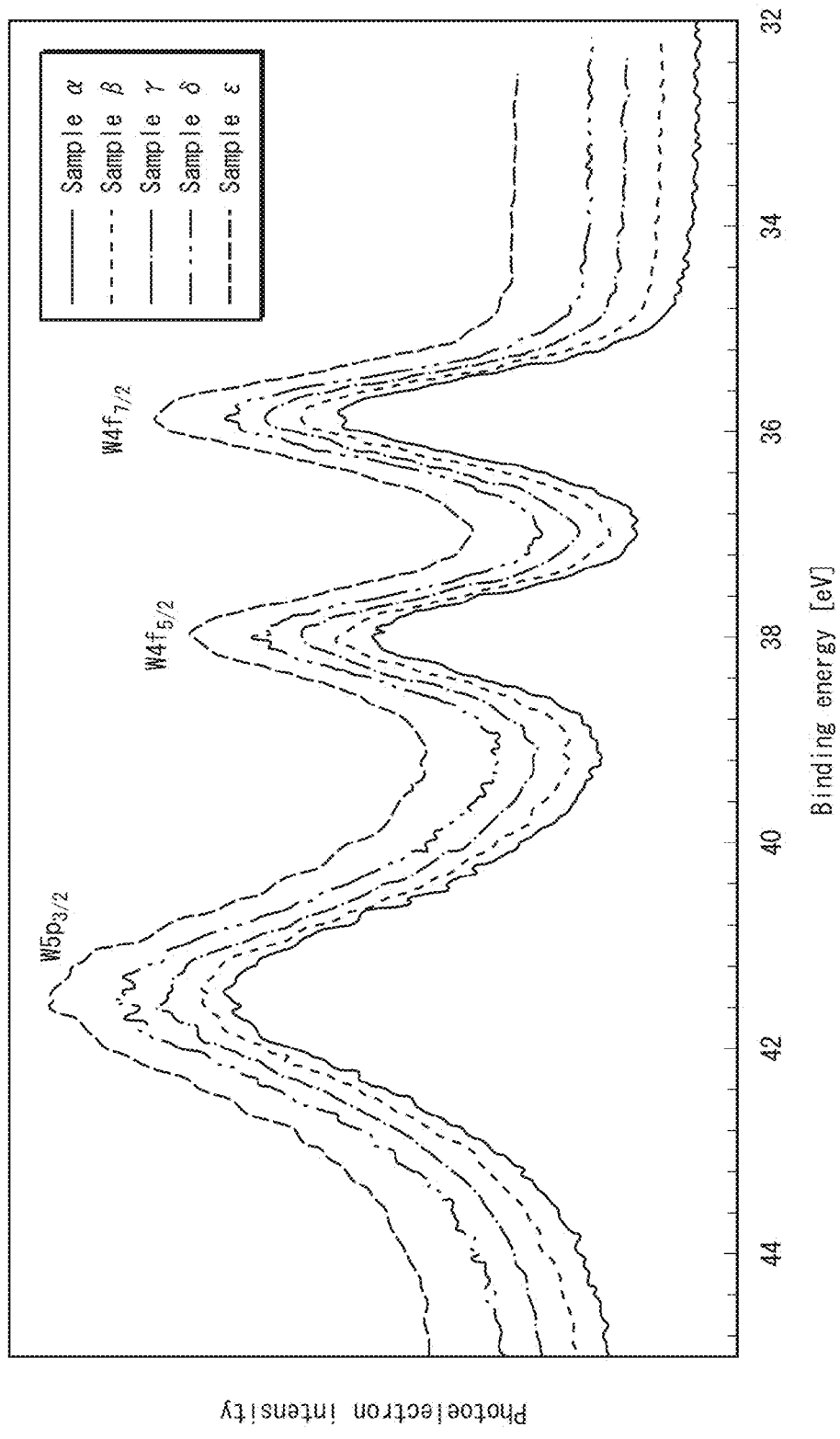
FIG. 33 is a diagram illustrating spectra belonging to $W5p_{3/2}$, $W4f_{5/2}$, and $W4f_{7/2}$ obtained by HXPS measurement of tungsten oxide layers.

HXPS measurement was performed on the hole injection layer 4A in each of the samples α through ε. FIG. 33 is a diagram illustrating the resulting spectra. The origin of the horizontal axis, which represents binding energy, corresponds to the Fermi level of the ITO substrate, and the left direction with respect to the origin is positive. The vertical axis represents photoelectron intensity.

Three peaks can be observed in the binding energy range shown in FIG. 33. From left to right in FIG. 33, the peaks belong to the following energy levels of tungsten: $5p_{3/2}$ ($W5p_{3/2}$), $4f_{5/2}$ ($W4f_{5/2}$), and $4f_{7/2}$ ($W4f_{7/2}$).

Next, peak fitting analysis was performed on the peaks belonging to $W5p_{3/2}$, $W4f_{5/2}$, and $W4f_{7/2}$ in the spectrum of each sample, using XPSPEAK 4.1, which is software for photoelectron spectroscopy analysis. First, based on the photoionization cross-section for the hard X-ray energy, the area intensity ratio of each component corresponding to $W4f_{7/2}$, $W4f_{5/2}$, and $W5p_{3/2}$ was fixed as follows: $W4f_{7/2}$:$W4f_{5/2}$:$W5p_{3/2}$=4:3:10.5. Next, as shown in Table 10, the position of the peak top of the $W4f_{7/2}$ component with a valence of six ($W^{6+}4f_{7/2}$) was aligned with a binding energy of 35.7 eV. The location of the peak top and the initial value of the full width at half maximum were set within the range shown in Table 10 for the component belonging to the surface photoelectrons of $W5p_{3/2}$, $W4f_{5/2}$, $W4f_{7/2}$, the component belonging to the valence of six, and the component belonging to the valence of five. In the Gaussian-Lorentzian mixed function used for fitting of the components, the initial value of the ratio in the Lorentzian function was also set within the range indicated in Table 10. Furthermore, the initial value of the area intensity of each component was set freely while maintaining the above intensity ratio. Optimization calculations were performed a maximum of 100 times by varying the area intensity for each component while maintaining the above intensity ratio, and by varying the peak location, the full width at half maximum, and the ratio in the Lorentzian function for each component within the ranges indicated in Table 10. These calculations yielded the final peak fitting analysis results.

TABLE 10

| Corresponding peak | W5p$_{3/2}$ | | | W4f$_{5/2}$ | | | W4f$_{7/2}$ | | |
|---|---|---|---|---|---|---|---|---|---|
| | W$^{sur}$5p$_{3/2}$ | W$^{6+}$5p$_{3/2}$ | W$^{5+}$5p$_{3/2}$ | W$^{sur}$4f$_{5/2}$ | W$^{6+}$4f$_{5/2}$ | W$^{5+}$4f$_{5/2}$ | W$^{sur}$4f$_{7/2}$ | W$^{6+}$4f$_{7/2}$ | W$^{5+}$4f$_{7/2}$ |
| Peak Energy (eV) | 42.30 to 43.07 | 41.20 to 41.30 | 39.70 to 38.65 | 38.75 to 39.13 | 37.80 to 37.85 | 36.72 to 36.95 | 36.60 to 36.90 | 35.70 (reference) | 34.60 to 34.80 |
| Value of full width at half maximum (eV) | 1.73 to 2.40 | 1.93 to 2.24 | 1.8 to 2.86 | 1.40 to 1.60 | 0.87 to 0.98 | 0.90 to 1.50 | 1.40 to 1.60 | 0.87 to 0.98 | 0.90 to 1.50 |
| Lorentzian function ratio (%) | 0 | 13 to 40 | 0 to 25 | 0 to 57 | 0 to 6 | 0 to 20 | 0 to 57 | 0 to 6 | 0 to 20 |

Figure 34A:
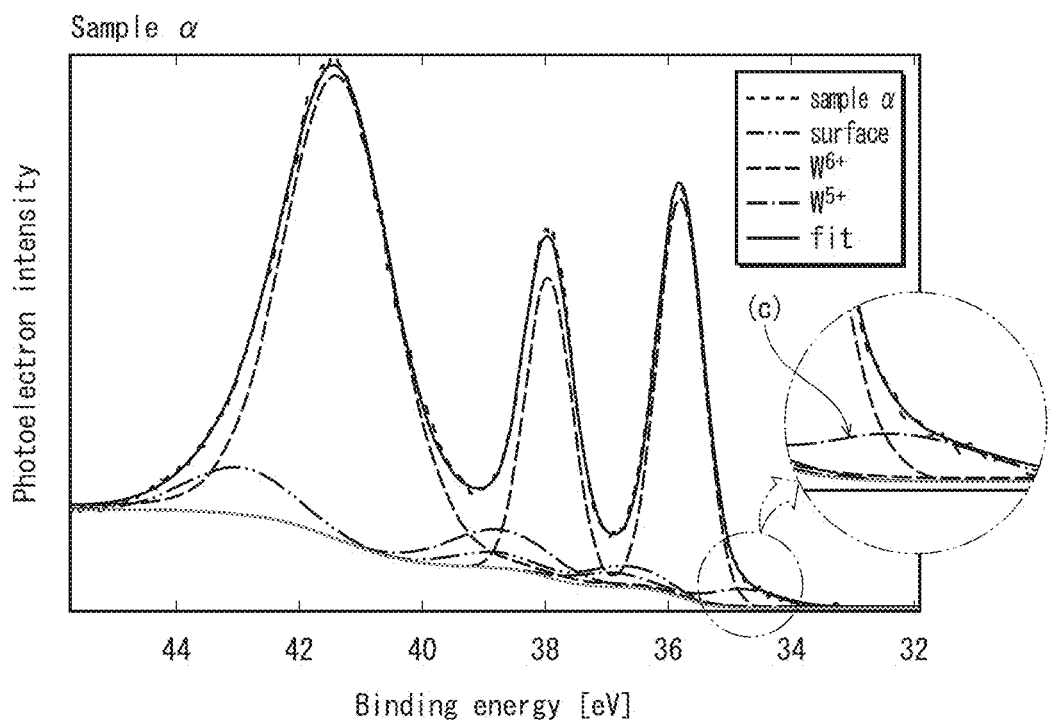
FIG. 34A illustrates peak fitting analysis results for sample α in FIG. 33.
Figure 34B:
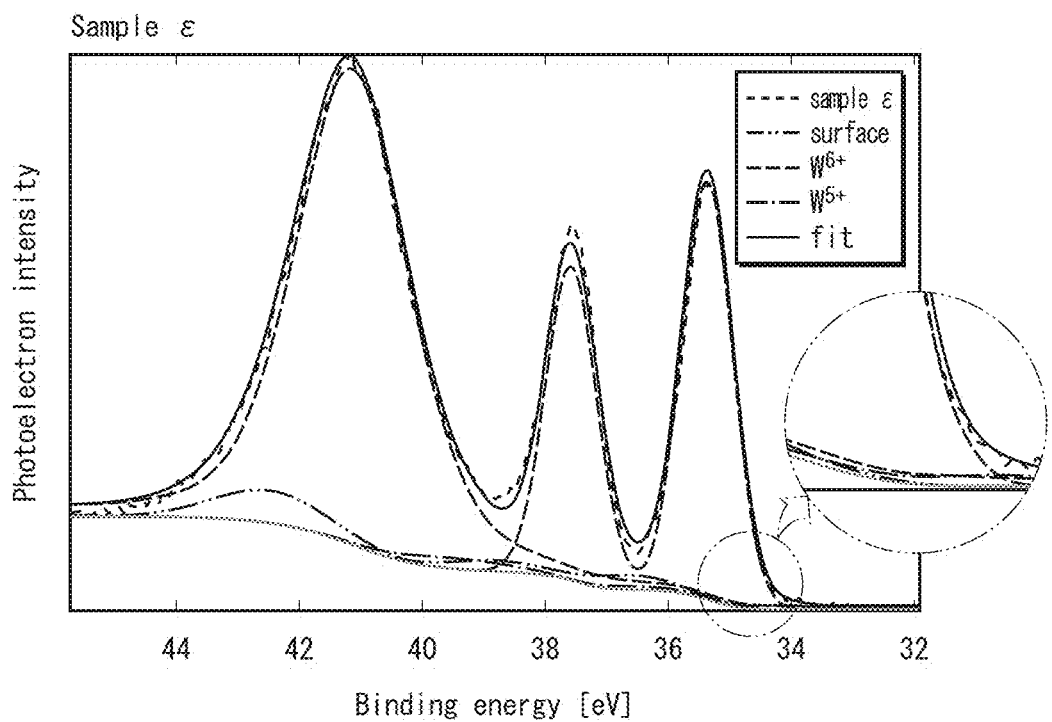
FIG. 34B illustrates peak fitting analysis results for samples in FIG. 33.

FIGS. 34A and 34B show the final peak fitting analysis results. FIG. 34A shows the analysis results for sample α, and FIG. 34B shows the analysis results for sample ε.

In both FIGS. 34A and 34B, the dashed lines (sample α, sample ε) are actual measured spectra (corresponding to the spectra in FIG. 33), the lines with alternate long and two short dashes (surface) are the component belonging to the surface photoelectrons (W$^{sur}$5p$_{3/2}$, W$^{sur}$4f$_{5/2}$, W$^{sur}$4f$_{7/2}$), the dotted lines (W$^{6+}$) are the component belonging to the valence of six (W$^{6+}$5p$_{3/2}$, W$^{6+}$4f$_{5/2}$, W$^{6+}$4f$_{7/2}$), and the alternating long and short dashed lines (W$^{5+}$) are the component belonging to the valence of five (W$^{5+}$5p$_{3/2}$, W$^{5+}$4f$_{5/2}$, W$^{5+}$4f$_{7/2}$). The solid lines (fit) are the spectra yielded by summing the components indicated by the lines with alternate long and two short dashes and the alternating long and short dashed lines.

The spectra for the dashed lines and the solid lines in FIGS. 34A and 34B match extremely well. In other words, the peaks belonging to the energy levels of W5p$_{3/2}$, W4f$_{5/2}$, and W4f$_{7/2}$ can all be described well by the sum of the component (surface) belonging to the photoelectrons from the surface of the hole injection layer 4A and the component (W$^{6+}$) belonging to a valence of six, as well as the component (W$^{5+}$) belonging to a valence of five, included within the hole injection layer 4A.

Furthermore, in the binding energy range that is between 0.3 eV and 1.8 eV lower than the component belonging to a valence of six (W$^{6+}$) in sample α of FIG. 34A, the existence of a corresponding component belonging to a valence of five (W$^{5+}$) can be confirmed. By contrast, in sample E of FIG. 34B, no such component belonging to a valence of five can be confirmed. For the purposes of illustration, the circled region in each of FIGS. 34A and 34B is shown enlarged to the right. As seen in the enlarged diagrams, a ridge in the alternating long and short dashed line for W$^{5+}$ (labeled (c) in FIG. 34A) can be clearly observed for sample α, but no such ridge can be observed for sample E. Furthermore, looking more closely at the enlarged diagrams, the solid line (fit), which is the sum of the components resulting from peak fitting, exhibits a large "shift" in sample α with respect to the dotted line (W$^{6+}$), which corresponds only to the component with a valence of six. In sample E, however, the "shift" is not as large as in sample α. In other words, the "shift" in sample α can be inferred as suggestive of the existence of tungsten atoms with the valence of five.

Next, the ratio of tungsten atoms with a valence of five to tungsten atoms with a valence of six, i.e. W$^{5+}$/W$^{6+}$, was calculated for samples α through ε. This ratio was calculated by dividing the area intensity of the component belonging to a valence of five by the area intensity of the component belonging to a valence of six in the peak fitting analysis results for each sample.

Note that the area intensity ratio of the component belonging to a valence of five to the component belonging to a valence of six should be the same for W5p$_{3/2}$, W4f$_{5/2}$, and W4f$_{7/2}$ based on the principle of measurement. In the present experiment, it was confirmed that these values are indeed the same. Therefore, the following analysis only refers to W4f$_{7/2}$.

Table 11 shows the ratio W$^{5+}$/W$^{6+}$ in W4f$_{7/2}$ for samples α through ε.

TABLE 11

| Sample Name | W$^{5+}$/W$^{6+}$ |
|---|---|
| Sample α | 7.4% |
| Sample β | 6.1% |
| Sample γ | 3.2% |
| Sample δ | 3.2% |
| Sample ε | 1.8% |

Based on the values of W$^{5+}$/W$^{6+}$ shown in Table 11, the sample with the largest ratio of tungsten atoms with a valence of five in the hole injection layer 4A is sample α. The ratio then tends to decrease in the order of sample β, sample γ, and sample δ, with sample ε having the lowest ratio. Comparing the results from Table 9 and Table 11, it is clear that as the ratio of tungsten atoms with a valence of five in the hole injection layer 4A increases, the driving voltage of the organic EL elements tends to be lower.

Using the above HXPS measurement to calculate the composition ratio of tungsten to oxygen, it was confirmed that the ratio of the number of tungsten atoms to the number of oxygen atoms in the hole injection layer 4A was nearly 1:3 on average throughout the layer in all of the samples α through ε. Based on this ratio, it can be assumed that in all of the samples α through ε, nearly the entire hole injection layer 4A has a basic structure with atomic coordinates based on tungsten trioxide. Note that the present inventors performed X-ray absorption fine structure (XAFS) measurement with respect to the hole injection layer 4A of both samples α and ε and confirmed that the above basic structure is formed therein.

(Electronic State of Hole Injection Layer 4A)

The hole injection layer 4A composed of tungsten oxide in embodiment 2 has the occupied energy level near the Fermi surface, similar to the hole injection layer 4 in embodiment 1. Due to the effect of the occupied energy level, the interface energy level is aligned between the hole injection layer 4A and the buffer layer 6A, thereby reducing the hole injection barrier between the hole injection layer 4A and the buffer layer 6A. As a result, the organic EL element pertaining to embodiment 2 can be driven at low voltage.

As described below, this occupied energy level near the Fermi surface exists not only at the above interface, but also throughout the hole injection layer 4A at the grain boundaries of the nanocrystals, thus serving as a conduction path for holes. This provides the hole injection layer 4A with an excellent hole conduction efficiency, so that the organic EL element pertaining to embodiment 2 can be driven at a lower voltage.

An experiment to confirm the existence of the occupied energy level near the Fermi surface was performed using UPS measurement on the hole injection layer 4A in each of the above samples α through ε.

The forming of the hole injection layer 4A of each of the samples was performed inside a sputtering device. Then, to prevent atmospheric exposure, the samples α through ε were transported to a glovebox which was connected to the sputtering device and which was filled with nitrogen gas. Subsequently, the sample devices were sealed inside transfer vessels in the glovebox, and were mounted on a photoelectron spectroscopy device. After formation, the hole injection layer 4A was therefore not exposed to the atmosphere at the point when the UPS measurement was performed.

The conditions under which the UPS measurement was conducted are as follows. Note that charge-up did not occur during measurement.

Figure 35:
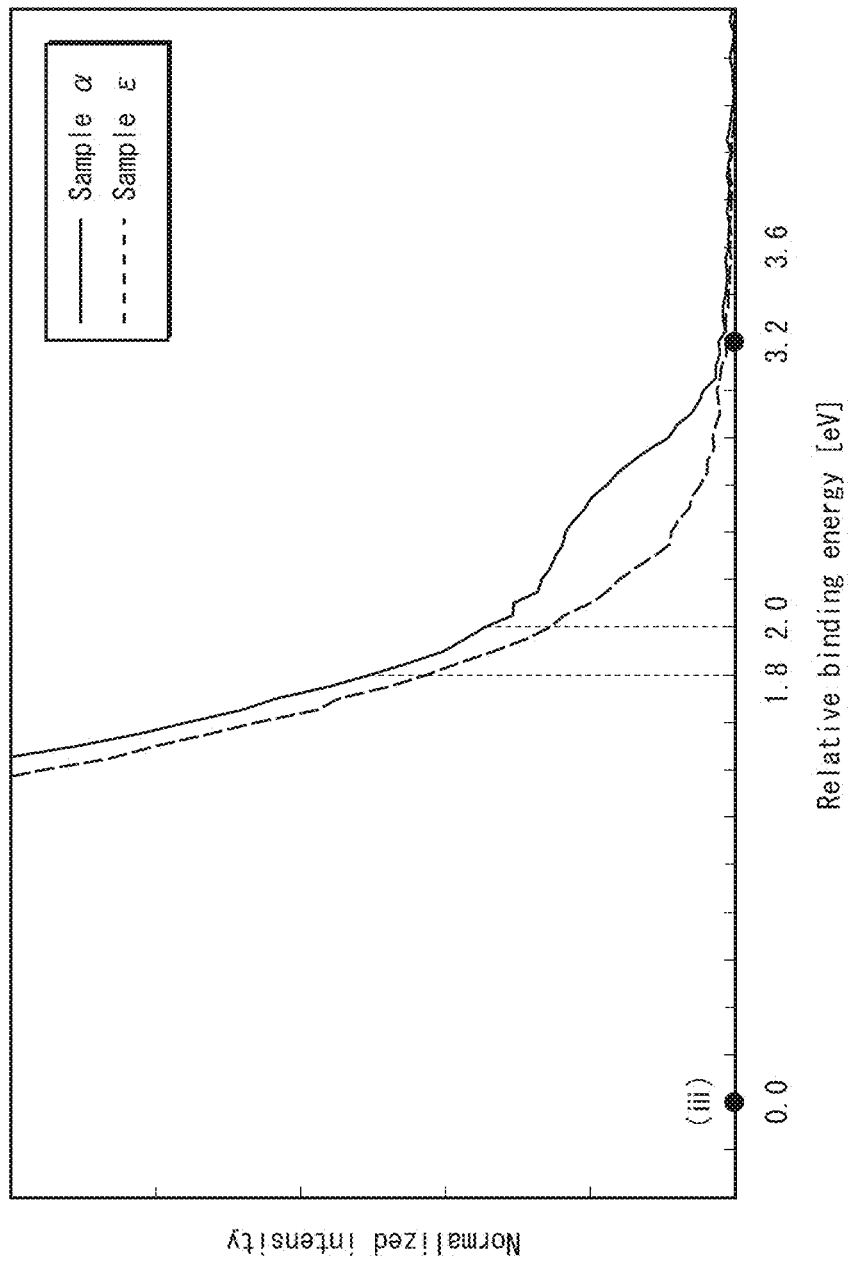
FIG. 35 illustrates UPS spectra of tungsten oxide layers.

Light source: He I line
Bias: None
Electron emission angle: Direction of normal line to the substrate
Interval between measurement points: 0.05 eV FIG. 35 is a diagram illustrating a UPS spectrum of the hole injection layer 4A in samples α and ε within area y. In FIG. 35, labels such as area y and point (iii) are as described in embodiment 1, and the horizontal axis represents relative binding energy with point (iii) as the origin.

As illustrated in FIG. 35, the spectral protrusion near the Fermi surface described in embodiment 1 was confirmed in the hole injection layer 4A of sample α in a binding energy range from 3.6 eV lower than point (iii) to 1.8 eV lower than point (iii), point (iii) being the location at which the valence band rises. On the other hand, such a spectral protrusion was not confirmed in sample ε. Note that in samples β, γ, and δ as well, the existence of the spectral protrusion was confirmed and the spectral protrusion had a shape and normalized intensity differing only little from that found in the hole injection layer 4A of sample α.

UPS measurement, however, is only an assessment of the surface portion of a measurement target. Upon attempting to confirm the existence of the spectral protrusion near the Fermi surface throughout the entire hole injection layer 4A by performing HXPS measurement on the hole injection layer 4A in samples α and ε, the spectral protrusion was confirmed in sample α, as expected, but not in sample ε.

The above experiment proved that the hole injection layer 4A in embodiment 2 has the occupied energy level near the Fermi surface. Therefore, due to a tungsten oxide layer having the upward protrusion (not necessarily a peak) in a binding energy range area approximately between 1.8 eV and 3.6 eV lower than point (iii) in the photoelectron spectrum, i.e. a tungsten oxide layer having the occupied energy level near the Fermi surface, being adopted as the hole injection layer, the organic EL element pertaining to embodiment 2 exhibits excellent hole conduction efficiency.

Here, the characteristics of the hole-only devices and the organic EL elements described in embodiment 2 are thought to be affected more by the hole conduction efficiency in the hole injection layer 4A than by the hole injection efficiency from the ITO layer 3 to the hole injection layer 4A and the hole injection efficiency from the hole injection layer 4A to the buffer layer 6A. The reasons are as follows.

In hole injection layers 4A formed under the film forming conditions α, β, γ, and δ, the spectral protrusion near the Fermi surface was confirmed by UPS measurement, as described above. In terms of FIG. 14 in embodiment 1, this means that in these hole injection layers 4A, the injection sites x exist at a number density sufficient for the injection sites x to be confirmed by UPS measurement. Furthermore, the shape and the normalized intensity of the spectral protrusion did not differ greatly between the hole injection layers 4A formed under conditions α, β, γ, and δ. Accordingly, the number density of the injection sites x can be assumed to be equivalent in the hole injection layers 4A formed under conditions α, β, γ, and δ. Considering that the film forming condition α is equivalent to the above film forming condition A in embodiment 1, the hole injection layers 4A formed under conditions α, β, γ, and δ can all be assumed to have a sufficient number density of injection sites x with respect to the number density of injection sites y in the buffer layer 6A. In other words, the hole injection layers 4 under conditions α, β, γ, and δ are all considered to have the same level of hole injection efficiency from the hole injection layer 4A to the buffer layer 6A.

However, although the driving voltages of HOD-α, β, γ, and δ in Table 8 are all good, there is a spread of 2.25 V therebetween. Therefore, it reasonably follows that a factor other than the hole injection efficiency from the hole injection layer 4A to the buffer layer 6A is resulting in the spread. Since the Schottky ohmic contact is formed between the ITO layer 3 and the hole injection layer 4A in embodiment 2 as described above, the remaining factor resulting in the spread can be assumed to be the hole conduction efficiency of the hole injection layer 4A itself.

(Analysis of Relationship Between Value of $W^{5+}/W^{6+}$ and Hole Conduction Efficiency)

Figure 36:
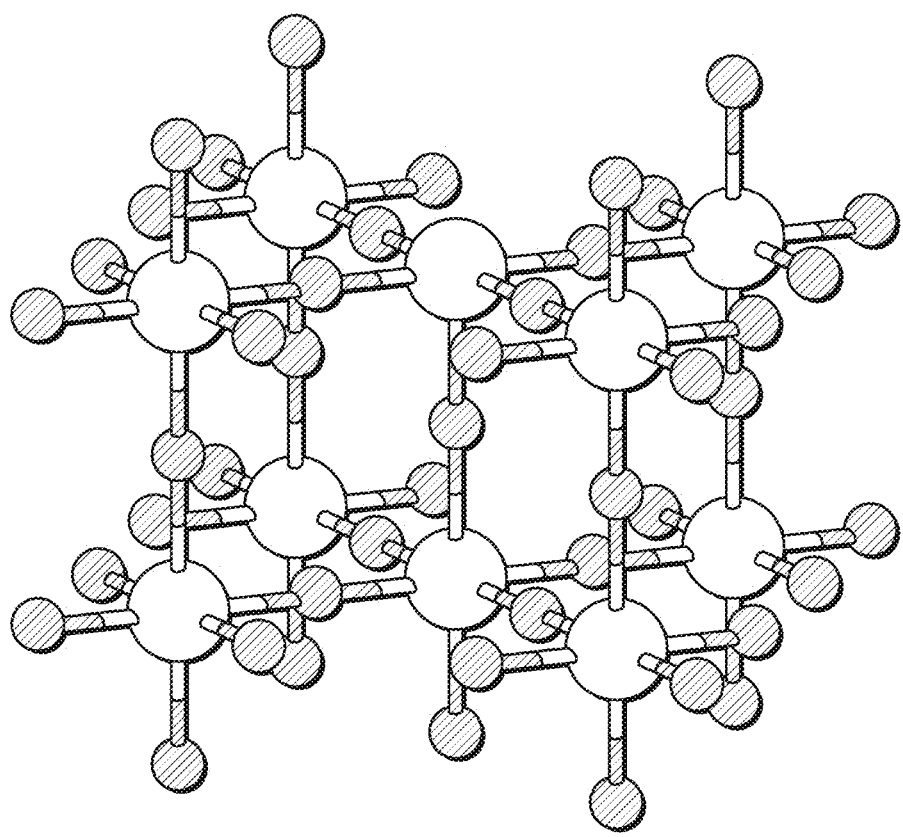
FIG. 36 explains the structure of a tungsten trioxide crystal.

FIG. 36 is a diagram illustrating the tungsten oxide crystal structure. In the tungsten oxide of embodiment 2, as described above, the composition ratio of tungsten to oxygen is approximately 1:3. Therefore, tungsten trioxide is described here as an example.

As shown in FIG. 36, a tungsten trioxide crystal has a structure in which six oxygen atoms and one tungsten atom bind in octahedral coordination, with octahedrons sharing oxygen atoms at vertices. (To simplify the illustration, FIG. 36 shows octahedrons in perfect alignment, like rhenium trioxide. In reality, the octahedrons are in a slightly distorted arrangement).

These tungsten atoms that are bound to six oxygen atoms in octahedral coordination are tungsten atoms with a valence of six. On the other hand, tungsten atoms with a lower valence than six correspond to structures in which the octahedral coordination has somehow become disrupted. A typical example is when one of the six oxygen atoms escapes, forming an oxygen vacancy structure. In this case, the tungsten atom bonded with the remaining five oxygen atoms has a valence of five.

Typically, when an oxygen vacancy structure exists in a metal oxide, an electron left behind by the oxygen atom that has escaped is provided to a metal atom near the oxygen vacancy structure in order to maintain electric neutrality. The valence of the metal atom thus lowers. An electron is thus provided in this way to the tungsten atom with a valence of five. This electron is assumed to combine with the electron that was used to bond with the oxygen atom that escaped, thus forming a lone pair of electrons.

Based on the above analysis, the mechanism for hole conduction in the hole injection layer 4A in embodiment 2, which has tungsten atoms with a valence of five, is as follows, for example.

A tungsten atom with a valence of five can supply a hole with an electron from its own lone pair of electrons. Accordingly, if tungsten atoms with a valence of five exist within a certain distance from each other, a hole can hop between the lone pair of electrons of tungsten atoms with a valence of five due to the voltage applied to the hole injection layer. Furthermore, if the tungsten atoms with a valence of five are nearly adjacent, the overlap between 5d orbitals corresponding to the lone pairs of electrons grows large, so that holes can move easily without hopping.

In other words, in embodiment 2, holes are thought to be conducted between the tungsten atoms with a valence of five that exist in the hole injection layer 4A.

Based on the above inference, if the value of $W^{5+}/W^{6+}$ is high, i.e. if the proportion of tungsten atoms with a valence of five is high in the hole injection layer 4A, as in sample α, tungsten atoms with a valence of five are more likely to be close or adjacent, thus facilitating hole conduction at low voltage. This provides the organic EL element 1C with excellent hole conduction efficiency.

Note that samples γ, and δ, for which the value of $W^{5+}/W^{6+}$ is not as high as in sample α being approximately 3.2%, were able to drive excellently at low voltage. It is therefore considered sufficient for the value of $W^{5+}/W^{6+}$ to be approximately 3.2% or greater.

(Microstructure of Tungsten Oxide in Hole Injection Layer 4A)

The nanocrystal structure exists in the tungsten oxide layer constituting the hole injection layer 4A in embodiment 2. This nanocrystal structure is formed by adjusting the film forming conditions. Details concerning this point are provided in the following.

In order to confirm whether or not the nanocrystal structure exists in the hole injection layer 4A formed under each of the film forming conditions α through ε in Table 7, a transmission electron microscope (TEM) measurement experiment was performed.

The hole injection layers 4A in the samples for TEM measurement were formed with a DC magnetron sputtering device. Specifically, a tungsten oxide layer (considered to be the hole injection layer 4A) was formed to a thickness of 30 nm by reactive sputtering on an ITO substrate formed on glass.

The samples for TEM measurement manufactured under the film forming conditions α, β, γ, δ, and ε are hereinafter respectively referred to as sample α, sample β, sample γ, sample δ, and sample ε.

Typically, TEM measurement is performed on a surface of a sample prepared to have small thickness. In embodiment 2, a cross-section of the hole injection layer 4A was designated as the target for measurement. A cross-section was manufactured by using a focused ion beam (FIB) device to process the sample, and the thickness of the lamina was adjusted to approximately 50 nm. The conditions for FIB processing and TEM measurement are as follows.

(Conditions for FIB Processing)
Device used: Quanta 200 (manufactured by FEI Company)
Accelerating voltage: 30 kV (final voltage: 5 kV)
Lamina thickness: approximately 50 nm
(Conditions for TEM Measurement)
Device used: Topcon EM-002B (manufactured by Topcon Technohouse Corporation)
Measurement method: high-resolution electron microscopy
Accelerating voltage: 200 kV FIG. 37 is a diagram illustrating a TEM measurement photograph of a cross-section of the hole injection layer 4A in samples α through ε. The magnification ratio in each photograph is as indicated by the scale bar shown in each photograph. The photographs are shown with 256 gradations from the darkest to the brightest region.

In each TEM photograph for samples α, β, γ, and δ, regular linear structures formed due to some of the bright regions in the TEM photograph being aligned in the same direction can be observed. As indicated by the scale bar, the linear structures are aligned with intervals of approximately between 1.85 angstroms and 5.55 angstroms therebetween. On the other hand, the bright regions are scattered irregularly in sample ε, with no regular linear structures being observable.

Typically, in a TEM photograph, regions with the above linear structures represent one microscopic crystal. In the TEM pictures in FIG. 37, the size of these crystals can be seen to be approximately between 5 and 10 nm. Therefore, the absence or presence of the above linear structure can be interpreted as follows: whereas the nanocrystal structure can be confirmed in the tungsten oxide of samples α, β, γ, and δ, the nanocrystal structure cannot be confirmed in sample ε, which is thought to have the amorphous structure nearly throughout the sample.

In the TEM photograph of sample α in FIG. 37, one of the nanocrystals, chosen arbitrarily, is outlined with a white line. Note that this outline is not precise, but rather is meant to be an example. This is because the TEM photograph shows not only the uppermost surface in the cross-section, but also the conditions lower in the layer, thus making it difficult to precisely identify the outline. The size of the outlined nanocrystal appears to be approximately 5 nm.

FIG. 38 shows the results of a 2D Fourier transform on the TEM measurement photographs in FIG. 37 (hereinafter referred to as 2D Fourier transform images). The 2D Fourier transform images are a distribution of the wavenumbers in the reciprocal space of the TEM measurement photographs in FIG. 37 and therefore indicate the periodicity of the TEM measurement photographs. The 2D Fourier transform images in FIG. 38 were created by performing a Fourier transform on the TEM photographs of FIG. 37 using LAview Version #1.77, which is image processing software.

In the 2D Fourier transform images for samples α, β, γ, and δ, bright regions formed by two or three concentric circles centering on the center point (δ point) can be seen relatively clearly. On the other hand, in sample ε, such a bright region formed by concentric circles is not clear.

The lack of clarity of the bright region formed by concentric circles indicates the loss of order in the TEM photographs of FIG. 37. In other words, the hole injection layer 4A in samples α, ε, γ, and δ, in which the bright region formed by concentric circles is clear, indicates a relatively high level of regularity and orderliness in the layer, whereas the hole injection layer 4A in sample ε has a low level of regularity and orderliness.

Figure 39A:
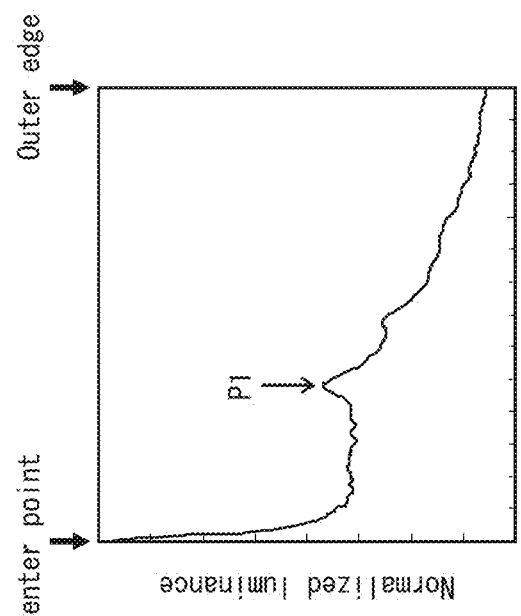
FIGS. 39A and 39B illustrate a process of creating a luminance variance plot from a 2D Fourier transform image in FIG. 38.
Figure 39B:
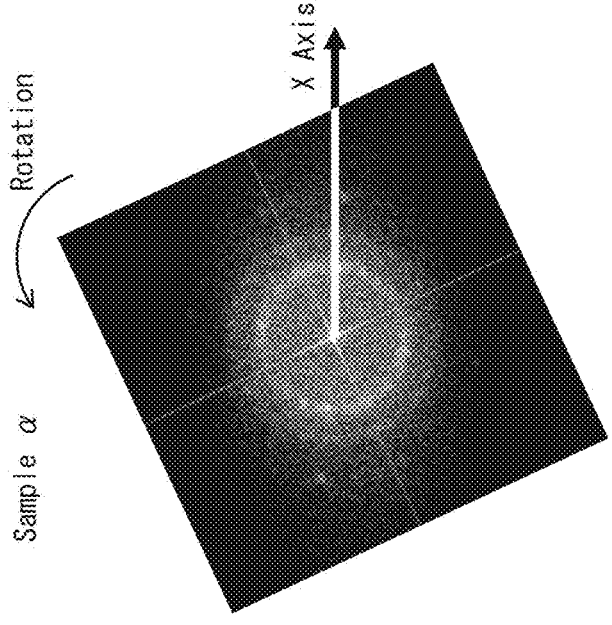

To clearly express this orderliness, graphs showing the change in luminance versus the distance from the center of the image were created for each 2D Fourier transform image in FIG. 38. FIGS. 39A and 39B show an outline of the method of creating the graphs, using sample α as an example.

As illustrated in FIG. 39A, a 2D Fourier transform image was rotated 1° at a time from 0° to 359°, with the center point as the center of rotation. Upon every degree of rotation, the luminance versus the distance from the center point along the X-axis was measured. Measurement results for each degree of rotation were then summed up and divided by 360, yielding the average luminance versus the distance from the center point (hereinafter referred to as normalized luminance). FIG. 39B shows a plot with distance from the center point along the horizontal axis and normalized luminance for each distance along the vertical axis. Microsoft Office Picture Manager was used to rotate the 2D Fourier transform images, and the image processing software ImageNos was used to measure the distance from the center point and the luminance. Hereinafter, the plot showing the relation between the distance from the center point and the normalized luminance at each distance, as created with the method described in FIGS. 39A and 39B, is referred to as a "plot of change in luminance".

FIGS. 40 and 41 illustrate the plots of change in luminance for samples α through E. Apart from a high luminance region at the center point, each of the samples exhibited a peak as indicated by the arrows. Hereinafter, the peak indicated by the arrow nearest the center point in the plot of change in luminance is referred to as a "peak P1".

Figure 42:
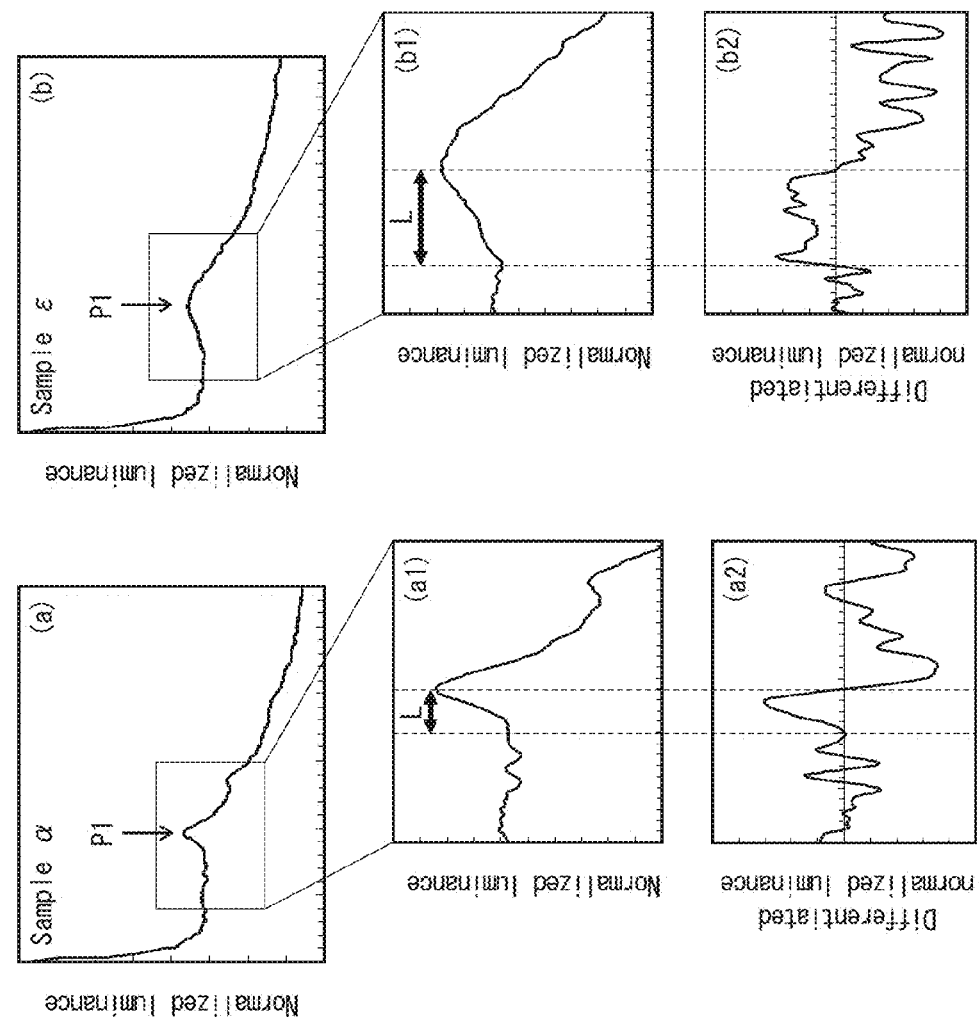
FIG. 42 includes portions (a), (a1), and (a2) corresponding to sample α and portions (b), (b1), and (b2) corresponding to sample ε, portions (a) and (b) each being a luminance variance plot, (a1) and (b1) each being an enlarged diagram of a peak appearing closest to the center point in the luminance variance plot in the corresponding one of (a) and (b), and (a2) and (b2) each being the first derivative of the luminance variance plot in the corresponding one of (a1) and (b1).

FIGS. 40 and 41 show that as compared to the peak P1 in sample ε, the peak P1 in samples α, β, γ, and δ is a pointed, convex shape. The sharpness of the peak P1 in each sample was quantified for comparison. FIG. 42 shows an outline of the method of assessment, using samples α and ε as examples.

Portions (a) and (b) in FIG. 42 are plots of change in luminance for samples α and E respectively. Portions (a1) and (b1) in FIG. 42 are enlarged diagrams of each peak P1 and the surrounding region. The "L" in the figures represents the "peak width L of the peak P1" and is used as an index of how "pointed" the peak P1 is.

In order to more accurately determine this "peak width L of the peak P1", the first derivative of the plot of change in luminance in portions (a1) and (b1) is shown in portions (a2) and (b2) in FIG. 42. In portions (a2) and (b2) in FIG. 42, the peak width L is the difference between the value along the horizontal axis corresponding to the peak top of the peak P1 and the value along the horizontal axis, in the direction of the center point from the peak, corresponding to the position at which the derivative first becomes zero.

Table 12 shows the values of the peak width L in samples α through ε, with the value along the horizontal axis corresponding to the peak top of the peak P1 normalized as 100.

TABLE 12

| Sample Name | Peak Width L |
|---|---|
| Sample α | 16.7 |
| Sample β | 18.1 |
| Sample γ | 21.3 |
| Sample δ | 21.9 |
| Sample ε | 37.6 |

As shown in Table 12, the peak width L is smallest for sample α and increases in the order of samples β, γ, and δ, with sample ε having the largest value. The peak width for samples γ and δ is not as small as for sample α. However, even with a value of 21.9, the organic EL element 1C having the hole injection layer 4A formed under film forming conditions γ and δ achieves good hole conduction efficiency, as described above.

The value of the peak width L in Table 12 indicates the clarity of the bright region formed by the concentric circle closest to the center point in the 2D Fourier transform images of FIG. 38. As the value of the peak width L is smaller, the extent of the region formed by the concentric circles is also smaller. Accordingly, the TEM photograph in FIG. 37 before the 2D Fourier transform exhibits a greater level of regularity and orderliness. This is considered to correspond to how the proportion of the area occupied by the nanocrystal structure in the TEM photograph is larger. Conversely, as the value of the peak width L is larger, the extent of the region formed by the concentric circles is also larger. Accordingly, the TEM photograph in FIG. 37 before the 2D Fourier transform exhibits a lower level of regularity and orderliness. The decrease in regularity and orderliness the TEM photograph in FIG. 37 before the 2D Fourier transform is considered to correspond to a decrease in the proportion of the area occupied by the nanocrystal structure in the TEM photograph.

(Analysis of Relationship Between Nanocrystal Structure and Hole Conduction Efficiency)

The experiments in embodiment 2 have revealed the following. A hole injection layer with good hole conduction efficiency has the occupied energy level near the Fermi surface throughout the entire layer, and the proportion of tungsten atoms with a valence of five is high. Furthermore, the hole injection layer has the nanocrystal structure, and the layer is regular and orderly. Conversely, in a hole injection layer with poor hole conduction efficiency, the occupied energy level near the Fermi surface could not be confirmed throughout the entire layer, and the proportion of tungsten atoms with a valence of five is extremely low. The nanocrystal structure could not be confirmed in such a hole injection layer, and the structure of the layer was neither regular nor orderly. The relation between these experimental results is analyzed below.

First, the relation between the nanocrystal structure (the regularity of the film structure) and the tungsten atoms with a valence of five is examined.

As described above, in the hole injection layer formed under each film forming condition in embodiment 2, the composition ratio of tungsten to oxygen is nearly 1:3. Accordingly, the nanocrystal structure that provides the layer structure with regularity as observed in the hole injection layers under film forming conditions α, β, γ, and δ is assumed to be a microcrystal structure of tungsten trioxide.

Typically, when the oxygen vacancy structure is formed within a nanoscale microcrystal, the region over which the oxygen vacancy structure exerts an influence is extremely large in relative terms, due to the small size of the microcrystal. The microcrystal thus becomes greatly distorted, making it difficult to maintain a crystal structure. Accordingly, tungsten atoms with a valence of five that derive from the oxygen vacancy or a similar structure are unlikely to be included within the nanocrystal.

This is not necessarily true, however, along a surface of a nanocrystal, nor at the grain boundaries between nanocrystals. Typically, a structure similar to the oxygen vacancy structure, known as a surface oxygen vacancy, easily forms on surfaces or grain boundaries where the crystal periodicity is interrupted. For example, Non-Patent Literature 6 reports that the surface of tungsten trioxide crystals is more stable when half of the tungsten atoms along the outermost surface do not terminate in oxygen atoms than when all of the tungsten atoms along the outermost surface terminate in oxygen atoms. In this way, it is considered that a large number of tungsten atoms with a valence of five that do not terminate in oxygen atoms exist along the surface and grain boundaries of the nanocrystals.

On the other hand, in the hole injection layer under film forming condition ε, almost no tungsten atoms with a valence of five are present, and the nanocrystal structure was not confirmed. The entire layer had the amorphous structure, with little regularity. This is considered to be because while the octahedrons that represent the basic structure of tungsten trioxide share an oxygen atom at the vertices without interruption (and therefore do not become tungsten atoms with a valence of five), the arrangement of the octahedrons lacks periodicity and order.

Next, the relation between the occupied energy level near the Fermi surface and the tungsten atoms with a valence of five is described.

It is considered that the occupied energy level near the Fermi surface derives from the oxygen vacancy structure or a similar structure, as explained in embodiment 1. It is also considered that tungsten atoms with a valance of five derive from the oxygen vacancy structure or a similar structure. In other words, the occupied energy level near the Fermi surface and the tungsten atoms with a valence of five both derive from the oxygen vacancy structure or a similar structure. Specifically, as already mentioned in embodiment 1, there have been many reports of assumption being made that a 5d orbital of a tungsten atom with a valence of five, which is not used for bonding with an oxygen atom, corresponds to the occupied energy level near the Fermi surface.

Based on the above, it can be inferred that in a hole injection layer with good hole conduction efficiency, a large number of tungsten atoms with a valence of five exists along the surface and grain boundaries of the nanocrystals. Therefore, along the surface and at the grain boundaries, the overlap between 5d orbitals of the tungsten atoms with a valence of five grows large, so that the occupied energy level near the Fermi surface exists continuously. On the other hand, a hole injection layer with poor hole conduction efficiency is amorphous, having almost none of the oxygen vacancy structures or similar structures nor tungsten atoms with a valence of five deriving from such structures, and thus it can be inferred that no occupied energy level near the Fermi surface exists in the layer.

Next, the mechanism for hole conduction in the hole injection layer pertaining to the present invention is analyzed further. The conduction of holes between tungsten atoms with a valence of five in the hole injection layer 4A has already been analyzed. Based on the correlation between the above experiment results, however, it is possible to extrapolate a more concrete image.

Figure 43A:
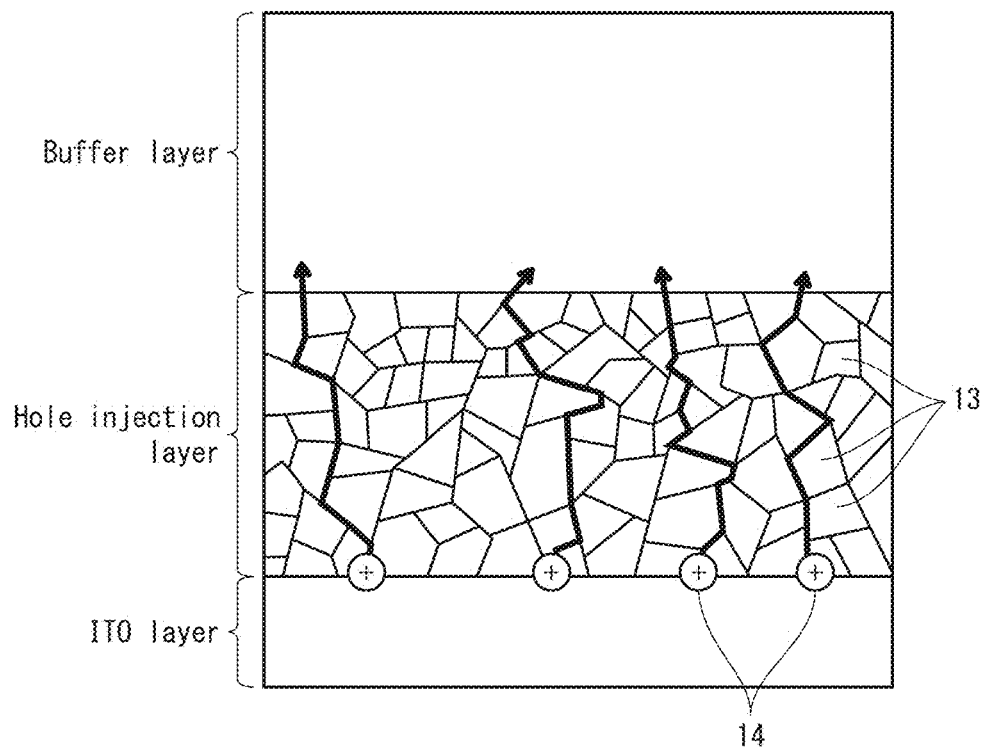
FIG. 43A schematically illustrates hole conduction when a tungsten oxide layer is formed mainly from a nanocrystal structure, and FIG. 43B schematically illustrates hole conduction when a tungsten oxide layer is formed mainly from an amorphous structure.
Figure 43B:
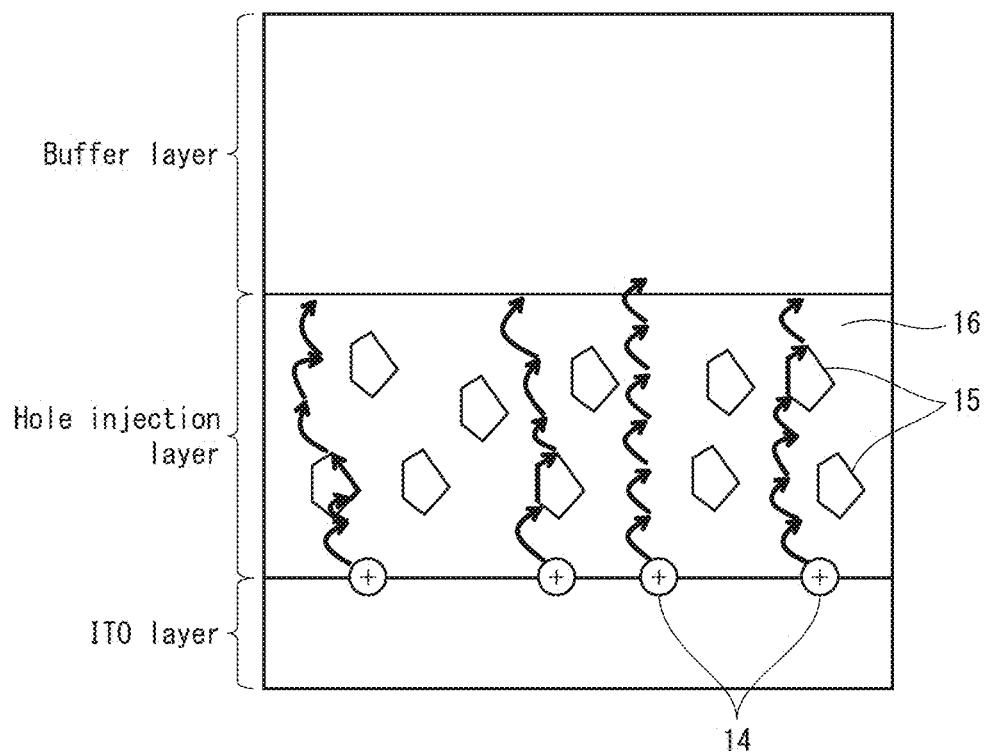

First, hole conduction is described in a hole injection layer composed of tungsten oxide mainly including the amorphous structure, as in the hole injection layer formed under film forming condition E. FIG. 43B shows the conduction of holes 14 in a hole injection layer in which an amorphous structure 16 is dominant, with few (or no) nanocrystals 15 present. Tungsten atoms with a valence of five are scattered throughout the amorphous structure 16, and upon the application of voltage to the hole injection layer, holes 14 hop between tungsten atoms with a valence of five that are relatively close to each other. Receiving the force of the electrical field, the holes 14 move to the buffer layer by hopping between tungsten atoms with a valence of five that are close to each other. In other words, in the amorphous structure 16, the holes 14 move through hopping conduction.

When the number of tungsten atoms with a valence of five is extremely low, as in the hole injection layer under film forming condition ϵ, the tungsten atoms with a valence of five are separated by a long distance. In order to hop across this long distance, an extremely high voltage needs to be applied, thus raising the driving voltage of the element.

In order to avoid this increase in voltage, the number of tungsten atoms with a valence of five, and therefore the oxygen vacancy structures or similar structures, should be increased in the amorphous structure 16. It is in fact possible to manufacture an amorphous layer that includes many of the oxygen vacancy structures or similar structures by forming the tungsten oxide through, for example, vacuum deposition under pre-determined conditions.

Such an amorphous layer with many of the oxygen vacancy structures or similar structures, however, loses chemical stability. Furthermore, a clear discoloring occurs due to the absorption of light by the oxygen vacancy structures or similar structures. Therefore, this approach is not practical for the mass production of organic EL display panels. By contrast, in the hole injection layer pertaining to the present invention, the composition ratio of tungsten to oxygen is nearly 1:3. Therefore, few of the oxygen vacancy structures or similar structures are found when the layer is seen in entirety, and the layer has a crystalline structure. This hole injection layer thus exhibits relatively good chemical stability and less discoloring.

Note that many tungsten atoms with a valence of five exist along the surface of the nanocrystals 15 in FIG. 43B. Therefore, the occupied energy levels near the Fermi surface, which allow for the exchange of holes, exist along the surface of the nanocrystals 15. As a result, the holes 14 move easily at least at the surface of the nanocrystals 15. In order to reach the buffer layer, however, the holes 14 must traverse the amorphous structure 16, thus preventing the hole conduction efficiency from improving.

Next, hole conduction within a tungsten oxide layer having the nanocrystal structure pertaining to the present invention is described. FIG. 43A shows the conduction of holes 14 in a hole injection layer including the amorphous structure 16 by a small extent or not including the amorphous structure, and including an abundance of the nanocrystals 13. First, as described above, an abundance of the tungsten atoms with a valence of five exist along the surface and grain boundaries of the nanocrystals 13. Therefore, the occupied energy levels near the Fermi surface, which can exchange holes, nearly continuously exist along the surface and grain boundaries. Furthermore, since an abundance of nanocrystals 13 are present in FIG. 43A, the surfaces and grain boundaries of these nanocrystals 13 are also continuous. In other words, continuous hole conduction paths exist along the continuous surfaces and grain boundaries of the nanocrystals 13, as indicated by the boldface arrows. As a result, upon applying voltage to the hole injection layer, the holes 14 are easily conducted along the occupied energy levels near the Fermi surface that extend along these continuous surfaces and grain boundaries, thus allowing the holes 14 to reach the buffer layer at a low driving voltage.

Based on the above analysis, the important factors for achieving a metal oxide layer with good hole conduction efficiency are (i) the existence of portions that can exchange holes, and (ii) continuity among these portions. Accordingly, a metal oxide layer that (i) includes metal atoms at a lower valence than the maximum possible valence and that (ii) has the nanocrystal structure can be considered a good structure for hole conduction.

The experiments and the observations provided for embodiment 2 above have been described based on the hole injection layer 4A. However, needless to say, such experiments and analysis hold as well for the hole injection layer 4B.

<Additional Matters>

The hole injection layer pertaining to the present invention is not limited to being formed by reactive sputtering. For example, vapor deposition, the CVD, or the like may be used instead for forming the hole injection layer.

The organic EL element pertaining to the present invention is not limited to being used as a single element. A plurality of the organic EL elements may be layered on a substrate as pixels in order to form an organic EL light-emitting apparatus. Such an organic EL light-emitting apparatus can be practiced by appropriately setting the thickness of each layer in each element and may, for example, be used as an illumination device or the like. Alternatively, the organic EL light-emitting apparatus may be implemented as an organic EL panel, which is an image display device.

In embodiment 2, the position at which the peak P1 in FIG. 42 begins to rise is the position along the horizontal axis, in the direction of the center point from the top of the peak P1, at which the derivative first becomes zero in portions (a2) and (b2) in FIG. 42. The method of determining the position at which the peak P1 begins to rise is not, however, limited in this way. For example, in portion (a1) in FIG. 42, the average value of the normalized luminance near the peak P1 may be used as a baseline, with the position at which the peak P1 begins to rise being defined as the intersection of this baseline and the line in the graph near the peak P1.

In the organic EL element pertaining to the present invention, a hole transport layer may be provided between the hole injection layer and the light-emitting layer. The hole transport layer has the function of transporting holes injected from the hole injection layer to the light-emitting layer. An organic material with hole transporting properties is used as the hole transport layer. Organic material having hole-transporting characteristics as described above refers to organic material having characteristics of conveying holes having been generated by making use of a charge transfer effect occurring between molecules. This is also known as a p-type organic semiconductor.

The material for the hole transport layer may be either a high molecular material or a low molecular material, and the hole transport layer may be formed by wet printing, for example. Further, it is desirable for the material for the hole transport layer to include a cross-linking agent, so that the material for the hole transport layer does not mix with the material for the light-emitting layer in the forming of the light-emitting layer, which is disposed above the hole transport layer. Examples of the material for the hole transport layer are a copolymer that includes a fluorene region and a triarylamine region, and a triarylamine derivative with a low molecular weight. One example of the crosslinking agent that may be utilized is dipentaerythritol hexaacrylate. In this case, it is desirable that the cross-linking agent be formed from poly(3,4-ethylenedioxythiophene) doped with polystyrene sulfonic acid (PEDOT: PSS) or a derivative thereof (a copolymer or the like).

In embodiment 2, the anode 2 is composed of a thin film of Au in the organic EL element 1C. Due to this, the ITO layer 3 is formed above the anode 2 to enhance the bonding between layers. However, when forming the anode 2 by using a material mainly including Al, excellent bonding between layers is achieved, and thus the anode 2 may be formed to have a single layer structure.

Figure 44:
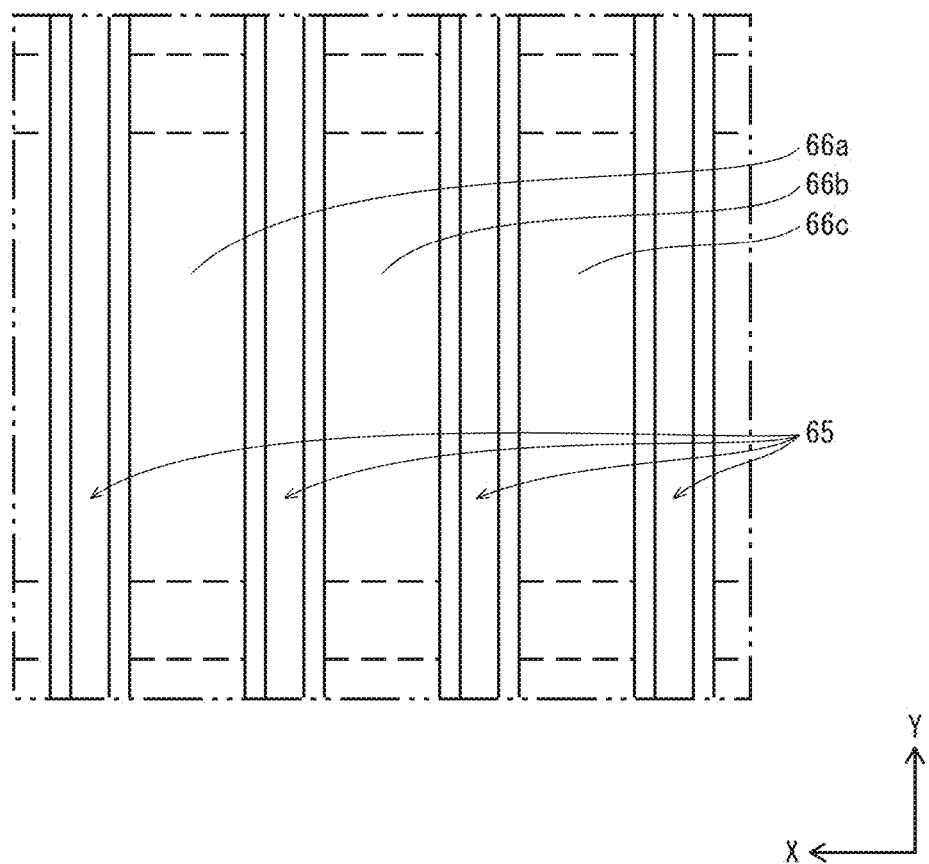
FIG. 44 is a plan view illustrating a portion of an organic EL panel pertaining to a modification.

When manufacturing an organic EL panel by using the organic EL element pertaining to the present invention, the shape formed by the banks therein is not limited to the so-called pixel bank structure (a grid-pattern of banks), and the banks may form a so-called line-bank structure. FIG. 44 illustrates a structure of an organic EL panel having a plurality of line banks 65 separating light-emitting layers 66a, 66b, and 66c adjacent in the X-axis direction from one another. When adopting the line banks 65, although light-emitting layers adjacent in the Y-axis direction are not individually defined by a bank element, such light-emitting layers can be caused to perform light-emission without interfering one another if the drive method, the areas of anodes, the intervals between anodes, etc., are appropriately set.

In embodiments 1 and 2, organic material is used as the bank material, but alternatively inorganic material may be used. In this case as well, the bank material film is formed by application or by another method, as when using organic material.

INDUSTRIAL APPLICABILITY

The organic EL element pertaining to the present invention is to be used as display elements for mobile phone displays and TVs, and as a light source for various applications. Regardless of the specific use thereof, the organic EL element pertaining to the present invention is applicable as an organic EL element having a wide range of luminous intensity from low luminous intensity to high luminous intensity for the use as a light source or the like, and which can be driven at low voltage. The organic EL element pertaining to the present invention, for having such a high level of performance, may be used in a wide range of applications, including those for household use, those for use in public facilities, and those for professional use. More specifically, such applications include: various display devices; TV apparatuses; displays for portable electronic devices; illumination light sources, and etc.

REFERENCE SIGNS LIST

1, 1C organic EL elements
1A sample for photoelectron spectroscopy measurement
1B, 1D hole-only devices
2 anode
3 ITO layer
3A IZO layer
4X thin film (tungsten oxide film)
4, 4A, 4B hole injection layers
5X bank material film
5 banks
6A buffer layer
6B light-emitting layer
8 cathode (including two layers)
8A barium layer (layer included in cathode)
8B aluminum layer (layer included in cathode)
8C, 8E cathode (including one layer of Au)
8D cathode (including one layer of ITO)
9 sealing layer
10 substrate
11 silicon substrate
12 tungsten oxide layer
13, 15 nanocrystal
14 hole
16 amorphous structure
17 planarizing film
DC direct current power supply

The invention claimed is:
1. A method for manufacturing an organic light-emitting element, the method comprising:
    forming a tungsten oxide layer containing tungsten oxide on a base layer including an anode, the tungsten oxide layer formed to have an oxygen vacancy structure therein;
    firing the tungsten oxide layer;
    forming a film of barrier wall material on the fired tungsten oxide layer;
    forming barrier walls by patterning the film of barrier wall material in a predetermined pattern by using an etching solution, the barrier walls defining an aperture;

forming an organic layer within the aperture, the organic layer containing organic material; and forming a cathode above the organic layer, wherein in the firing of the tungsten oxide layer, the firing is performed to provide the fired tungsten oxide layer with higher dissolution resistance to the etching solution compared to the tungsten oxide layer, while ensuring that the fired tungsten oxide layer has an oxygen vacancy structure therein.

2. The method of claim 1, wherein in the firing of the tungsten oxide layer, the firing is performed to provide the fired tungsten oxide layer with a film density of at least 5.8 g/cm$^3$ and at most 6.0 g/cm$^3$.

3. The method of claim 1, wherein in the forming of the tungsten oxide layer, the tungsten oxide layer is formed to have an occupied energy level within a binding energy range from approximately 1.8 electron volts to approximately 3.6 electron volts lower than a lowest binding energy of a valence band, and in the firing of the tungsten oxide layer, the firing is performed while ensuring that the fired tungsten oxide layer has an occupied energy level within the binding energy range.

4. The method of claim 1, wherein in the forming of the tungsten oxide layer, the tungsten oxide layer is formed such that at least one of an ultraviolet photoelectron spectroscopy spectrum and an X-ray photoelectron spectroscopy spectrum of the tungsten oxide layer exhibits an upward protrusion within a binding energy range from approximately 1.8 electron volts to approximately 3.6 electron volts lower than a lowest binding energy of a valence band, and in the firing of the tungsten oxide layer, the firing is performed while ensuring that at least one of an ultraviolet photoelectron spectroscopy spectrum and an X-ray photoelectron spectroscopy spectrum of the fired tungsten oxide layer exhibits an upward protrusion within the binding energy range.

5. The method of claim 1, wherein in the forming of the tungsten oxide layer, the tungsten oxide layer is formed such that a differential spectrum obtained by differentiating an ultraviolet photoelectron spectroscopy spectrum of the tungsten oxide layer has a shape that is expressed by a non-exponential function throughout a binding energy range from approximately 1.8 electron volts to approximately 3.6 electron volts lower than a lowest binding energy of a valence band, and in the firing of the tungsten oxide layer, the firing is performed while ensuring that a differential spectrum obtained by differentiating an ultraviolet photoelectron spectroscopy spectrum of the fired tungsten oxide layer has a shape that is expressed by a non-exponential function throughout the binding energy range.

6. The method of claim 1, wherein in the forming of the tungsten oxide layer, the tungsten oxide layer is fondled to include tungsten atoms with a valence of six and tungsten atoms with a valence of five and thus have an oxygen vacancy structure therein, a ratio $W^{5+}/W^{6+}$ of the number of the tungsten atoms with a valence of five to the number of the tungsten atoms with a valence of six being at least 3.2% and at most 7.4%, and in the firing of the tungsten oxide layer, the firing is performed while ensuring that the ratio $W^{5+}/W^{6+}$ in the fired tungsten oxide layer is at least 3.2% and at most 7.4%.

7. A method for manufacturing an organic light-emitting element, the method comprising:

forming a tungsten oxide layer on a base layer including an anode, the tungsten oxide layer containing tungsten oxide;

firing the tungsten oxide layer to obtain a fired tungsten oxide layer;

forming a film of barrier wall material on the fired tungsten oxide layer;

forming barrier walls by patterning the film of barrier wall material in a predetermined pattern by using an etching solution, the barrier walls defining an aperture;

forming an organic layer within the aperture, the organic layer containing organic material; and forming a cathode above the organic layer, wherein in the forming of the tungsten oxide layer, the tungsten oxide layer is formed such that at least one of an ultraviolet photoelectron spectroscopy spectrum and an X-ray photoelectron spectroscopy spectrum of the tungsten oxide layer exhibits an upward protrusion within a binding energy range from approximately 1.8 electron volts to approximately 3.6 electron volts lower than a lowest binding energy of a valence band, and in the firing of the tungsten oxide layer, the firing is performed to provide the fired tungsten oxide layer with higher dissolution resistance to the etching solution compared to the tungsten oxide layer, while ensuring that at least one of an ultraviolet photoelectron spectroscopy spectrum and an X-ray photoelectron spectroscopy spectrum of the fired tungsten oxide layer exhibits an upward protrusion within the binding energy range.

8. A method for manufacturing an organic light-emitting element, the method comprising:

forming a tungsten oxide layer on a base layer including an anode, the tungsten oxide layer containing tungsten oxide;

firing the tungsten oxide layer to obtain a fired tungsten oxide layer;

forming a film of barrier wall material on the fired tungsten oxide layer;

forming barrier walls by patterning the film of barrier wall material in a predetermined pattern by using an etching solution, the barrier walls defining an aperture;

forming an organic layer within the aperture, the organic layer containing organic material; and forming a cathode above the organic layer, wherein in the forming of the tungsten oxide layer, the tungsten oxide layer is formed to include tungsten atoms with a valence of six and tungsten atoms with a valence of five and thus have an oxygen vacancy structure therein, a ratio $W^{5+}/W^{6+}$ of the number of the tungsten atoms with a valence of five to the number of the tungsten atoms with a valence of six being at least 3.2% and at most 7.4%, and in the firing of the tungsten oxide layer, the firing is performed to provide the fired tungsten oxide layer with higher dissolution resistance to the etching solution compared to the tungsten oxide layer, while ensuring that the ratio $W^{5+}/W^{6+}$ in the fired tungsten oxide layer is at least 3.2% and at most 7.4%.

* * * * *